US010026769B2

(12) United States Patent
Kagawa et al.

(10) Patent No.: US 10,026,769 B2
(45) Date of Patent: Jul. 17, 2018

(54) SEMICONDUCTOR DEVICE AND SOLID-STATE IMAGING DEVICE

(71) Applicant: SONY CORPORATION, Tokyo (JP)

(72) Inventors: Yoshihisa Kagawa, Kanagawa (JP); Nobutoshi Fujii, Kanagawa (JP); Masanaga Fukasawa, Tokyo (JP); Tokihisa Kaneguchi, Kanagawa (JP); Yoshiya Hagimoto, Kanagawa (JP); Kenichi Aoyagi, Kanagawa (JP); Ikue Mitsuhashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/023,783

(22) PCT Filed: Sep. 19, 2014

(86) PCT No.: PCT/JP2014/074780
§ 371 (c)(1),
(2) Date: Mar. 22, 2016

(87) PCT Pub. No.: WO2015/050000
PCT Pub. Date: Apr. 9, 2015

(65) Prior Publication Data
US 2016/0233264 A1    Aug. 11, 2016

(30) Foreign Application Priority Data

Oct. 4, 2013  (JP) ................................. 2013-209053

(51) Int. Cl.
*H01L 27/146* (2006.01)
*H01L 23/48* (2006.01)
*H01L 23/00* (2006.01)
*H01L 25/065* (2006.01)
*H01L 21/768* (2006.01)

(52) U.S. Cl.
CPC .. *H01L 27/14636* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS

| 2009/0146313 A1* | 6/2009 | Terazono | H01L 24/05 257/774 |
| 2010/0238331 A1* | 9/2010 | Umebayashi | H01L 27/14632 348/294 |

(Continued)

FOREIGN PATENT DOCUMENTS

| JP | 8-213422 A | 8/1996 |
| JP | 2002-222811 A | 8/2002 |

(Continued)

OTHER PUBLICATIONS

International Search Report prepared by the Japanese Patent Office dated Dec. 8, 2014, for International Application No. PCT/JP2014/074780.

*Primary Examiner* — Erik Kielin
(74) *Attorney, Agent, or Firm* — Sheridan Ross P.C.

(57) ABSTRACT

The present technology relates to a semiconductor device and a solid-state imaging device of which crack resistance can be improved in a simpler way. The semiconductor device has an upper substrate that is constituted by a Si substrate and wiring layers laminated on the Si substrate and a second substrate that is constituted by a Si substrate and wiring layers laminated on the Si substrate and is joined to the upper substrate. In addition, a pad for wire bonding or probing is formed in the upper substrate, and pads for protecting corner or side parts of the pad for wire bonding or probing are radially laminated and provided in each of the wiring layers between the pad and the Si substrate of the lower substrate. The present technology can be applied to a solid-state imaging device.

14 Claims, 39 Drawing Sheets

(52) U.S. Cl.
CPC ............ *H01L 24/08* (2013.01); *H01L 25/065* (2013.01); *H01L 27/1464* (2013.01); *H01L 27/1469* (2013.01); *H01L 27/14632* (2013.01); *H01L 27/14634* (2013.01); *H01L 27/14687* (2013.01); *H01L 24/05* (2013.01); *H01L 24/80* (2013.01); *H01L 2224/04042* (2013.01); *H01L 2224/08121* (2013.01); *H01L 2224/08145* (2013.01); *H01L 2224/80895* (2013.01); *H01L 2224/80896* (2013.01); *H01L 2224/9202* (2013.01)

(56) References Cited

U.S. PATENT DOCUMENTS

| | | | | |
|---|---|---|---|---|
| 2013/0099098 A1* | 4/2013 | Kobayashi | ........ | H01L 27/14632 250/208.1 |
| 2014/0015084 A1* | 1/2014 | Chen | ................ | H01L 27/14636 257/432 |

FOREIGN PATENT DOCUMENTS

| | | | |
|---|---|---|---|
| JP | 2003-142485 | A | 5/2003 |
| JP | 2004-95916 | A | 3/2004 |
| JP | 2004-247522 | A | 9/2004 |
| JP | 2004-282000 | A | 10/2004 |
| JP | 2006-24698 | A | 1/2006 |
| JP | 2010-28144 | A | 2/2010 |
| JP | 2011-530810 | A | 12/2011 |
| JP | 2012-19147 | A | 1/2012 |
| JP | 2012-109325 | A | 6/2012 |
| JP | 2013-187512 | A | 9/2013 |

\* cited by examiner

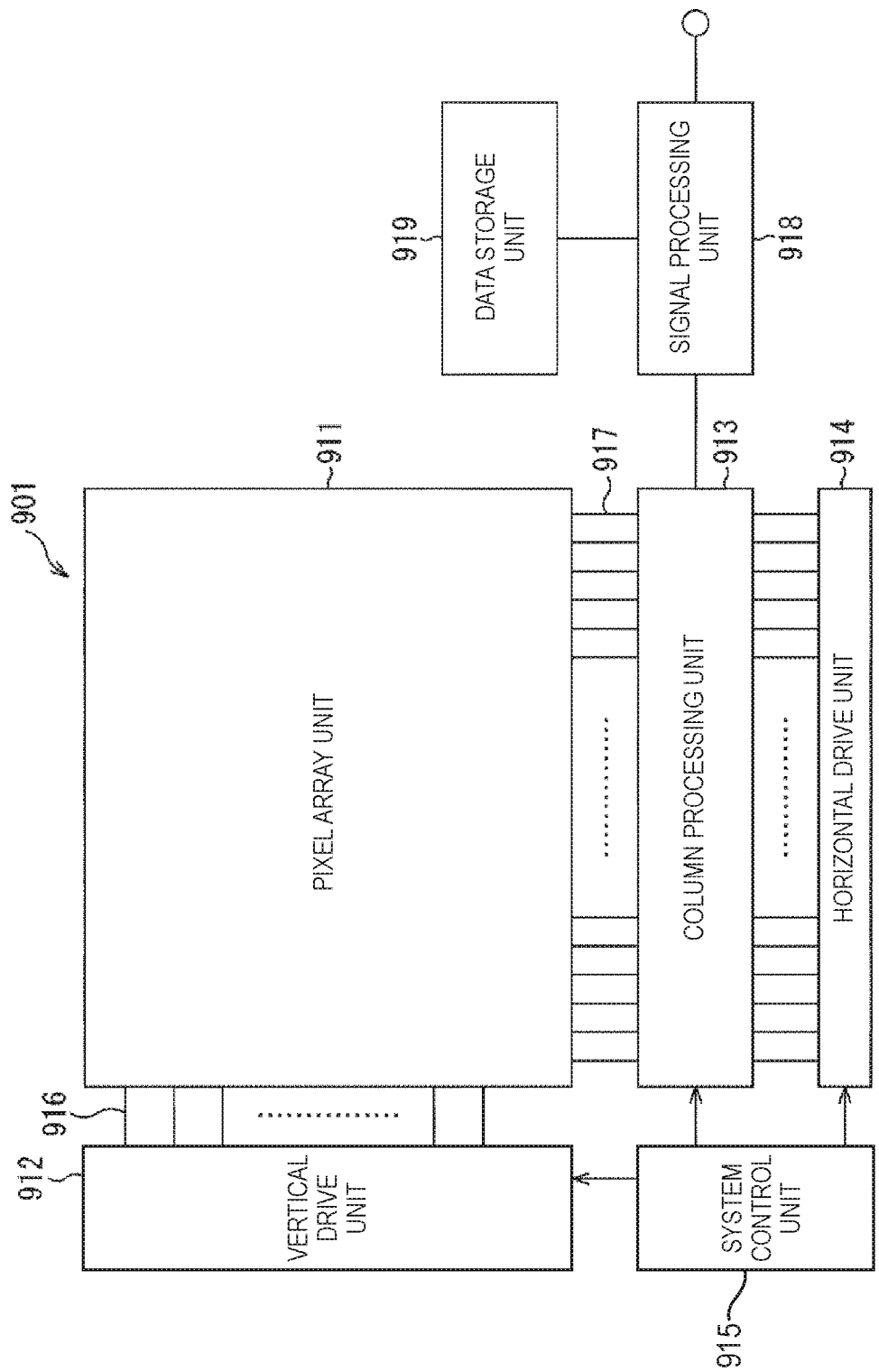

SEMICONDUCTOR DEVICE AND SOLID-STATE IMAGING DEVICE

CROSS REFERENCE TO RELATED APPLICATIONS

This application is a national stage application under 35 U.S.C. 371 and claims the benefit of PCT Application No. PCT/JP2014/074780 having an international filing date of 19 Sep. 2014, which designated the United States, which PCT application claimed the benefit of Japanese Patent Application No. 2013-209053 filed 4 Oct. 2013, the disclosures of which are incorporated herein by reference in their entirety.

TECHNICAL FIELD

The present disclosure relates to a semiconductor device and a solid-state imaging device, and particularly to a semiconductor device and a solid-state imaging device in which crack resistance can be improved in a simpler way.

BACKGROUND ART

In the related art, a technology for providing a pad for wire bonding and probing in a semiconductor substrate placed on a lower side to prevent cracks from occurring when two semiconductor substrates are to be joined together and electrically connected using through holes is known (for example, refer to Patent Literature 1). Here, the semiconductor substrate placed on the lower side is a semiconductor substrate placed on the opposite side to the side on which wire bonding and probing are performed (an upper side).

The pad for wire bonding and probing is provided on the semiconductor substrate on the lower side because if the pad is provided on the semiconductor substrate on the upper side, a load exerted on the semiconductor substrate at the time of wire bonding and probing is concentrated on an insulating film portion below the pad, which causes cracking.

In addition, a technology in which, when electrical connection of upper and lower wafers (semiconductor substrates) is realized by bonding Cu electrodes and insulating films at the same time, a Cu dummy pad is provided in the bonding surface of the wafers for planarizing the Cu portion or the insulating films has also been proposed (for example, refer to Patent Literature 2).

CITATION LIST

Patent Literature

Patent Literature 1: JP 2011-35038A
Patent Literature 2: JP 2012-256736A

SUMMARY OF INVENTION

Technical Problem

In the technology for providing the pad for wire bonding and probing in the substrate on the lower side, however, an opening of the pads is made deep, and it takes a long period of processing time to form the opening of the pad. In addition, since the pad is disposed at a deep position from the semiconductor substrate on the upper side which is the side on which wire bonding and probing are performed, defects in wire bonding or contact of a pin during probing becomes more frequent accordingly.

Furthermore, in the technology in which the Cu dummy pad is provided, when an opening penetrating to the portion of the pad for wire bonding is to be provided, the Cu dummy pad on the bonding surface of the wafers is exposed through dry etching. Thus, the Cu dummy pad serves as a mask, and it is not possible to form an opening to the pad for wire bonding.

Thus, when wafers are bonded to each other by planarizing a Cu portion and an insulating film, it is necessary to provide a pad for wire bonding at a higher position than a bonding surface. In this case, however, if the pad for wire bonding is merely produced in the upper wafer (semiconductor substrate), there is concern of cracking during wire bonding as described above.

The present technology takes the above circumstances into consideration, and aims to improve crack resistance in a simpler way.

Solution to Problem

A semiconductor device according to a first aspect of the present technology includes: a first substrate which has a plurality of wiring layers; and a second substrate which has a plurality of wiring layers and is bonded to the first substrate. Metal wiring which is formed of a metal in each wiring layer is provided between a pad that is provided in one substrate of the first substrate and the second substrate and a wiring layer on the other substrate side that is closest to the other substrate, and in a wiring layer on the other substrate side adjacent to the pad or the metal wiring, other metal wiring is disposed in at least a corner part of the pad or the metal wiring in an upper layer.

The pad can be a pad for wire bonding or probing.

The pad can be provided in a substrate of the first substrate and the second substrate on a side on which wire bonding or probing is performed.

The first substrate and the second substrate can be bonded together by bonding Cu wiring provided on a surface of the first substrate and Cu wiring provided on a surface of the second substrate.

A region that does not contain a member that forms the metal wiring can be provided at a center portion of a bonding-surface-side surface of the metal wiring on a bonding surface of the first substrate and the second substrate.

The other metal wiring can be disposed at least in the vicinity of the pad or the metal wiring.

An insulating film can be provided between a substrate which constitutes the other substrate and on which a plurality of wiring layers are laminated and the metal wiring.

A region of a portion which comes into contact with the metal wiring of a substrate, which constitutes the other substrate and on which a plurality of wiring layers are laminated, can be electrically separated from another region of the substrate by an insulator that is embedded in the substrate.

In a wiring layer in which contacts that connect a substrate, which constitutes the one substrate and on which a plurality of wiring layers are laminated, to wiring provided in a wiring layer of the one substrate are formed, the pad can be formed of the same metal as the contacts.

After bonding of the first substrate and the second substrate, the pad can be formed in a portion of a stopper layer provided in a wiring layer inside the one substrate removed by forming an opening.

The semiconductor device can further include: a via which is provided in a substrate, which constitutes the one substrate and on which a plurality of wiring layers are laminated, penetrates the substrate, and is connected to the metal wiring. The pad can be provided above the via of a surface of the one substrate.

The pad can be provided in a portion of an opening of the one substrate, and formed using a metal mask having a narrower opening than the opening.

An insulating film can be formed on a side surface of the opening of the one substrate.

Wiring that is formed of a different metal from the pad can be embedded in the pad, and the metal wiring can be provided in a wiring layer on the other substrate side of the wiring.

The wiring can be provided as the metal wiring in at least a corner part of the pad in a wiring layer on the other substrate side adjacent to the pad.

A region that does not contain the member that forms the wiring can be provided in a center portion of a surface of the wiring.

According to the first aspect of the present technology, a first substrate which has a plurality of wiring layers; and a second substrate which has a plurality of wiring layers and is bonded to the first substrate are provided. Metal wiring which is formed of a metal in each wiring layer is provided between a pad that is provided in one substrate of the first substrate and the second substrate and a wiring layer on the other substrate side that is closest to the other substrate, and in a wiring layer on the other substrate side adjacent to the pad or the metal wiring, other metal wiring is disposed in at least a corner part of the pad or the metal wiring in an upper layer.

A semiconductor device according to a second aspect of the present technology includes: a first substrate which has a plurality of wiring layers; and a second substrate which has a plurality of wiring layers and is bonded to the first substrate. A Cu pad for bonding provided on a bonding surface to the second substrate and Cu vias which penetrate a plurality of wiring layers and connect the Cu pad for bonding and C wiring are provided in the first substrate. Another Cu pad for bonding which is provided on a bonding surface to the first substrate and bonded to the Cu pad for bonding is provided in the second substrate.

According to the second aspect of the present technology, a first substrate which has a plurality of wiring layers; and a second substrate which has a plurality of wiring layers and is bonded to the first substrate are provided. A Cu pad for bonding provided on a bonding surface to the second substrate and Cu vias which penetrate a plurality of wiring layers and connect the Cu pad for bonding and C wiring are provided in the first substrate, and wherein another Cu pad for bonding which is provided on a bonding surface to the first substrate and bonded to the Cu pad for bonding is provided in the second substrate.

A solid-state imaging device according to a third aspect of the present technology includes: a first substrate which has a plurality of wiring layers; and a second substrate which has a plurality of wiring layers and is bonded to the first substrate. Metal wiring which is formed of a metal in each of wiring layers is provided between a pad that is provided in one substrate of the first substrate and the second substrate and a wiring layer on the other substrate side that is closest to the other substrate, and in a wiring layer on the other substrate side adjacent to the pad or the metal wiring, other metal wiring is disposed in at least a corner part of the pad or the metal wiring in an upper layer.

According to the third aspect of the present technology, a first substrate which has a plurality of wiring layers; and a second substrate which has a plurality of wiring layers and is bonded to the first substrate are provided. Metal wiring which is formed of a metal in each of wiring layers is provided between a pad that is provided in one substrate of the first substrate and the second substrate and a wiring layer on the other substrate side that is closest to the other substrate, and in a wiring layer on the other substrate side adjacent to the pad or the metal wiring, other metal wiring is disposed in at least a corner part of the pad or the metal wiring in an upper layer.

Advantageous Effects of Invention

According to the first aspect to the third aspect of the present technology, crack resistance can be improved in a simpler way.

Note that effects described herein are not necessarily limitative, and any effect described in the present disclosure may be exhibited.

BRIEF DESCRIPTION OF DRAWINGS

FIG. 39 is a diagram showing a configuration example of a solid-state imaging device.

DESCRIPTION OF EMBODIMENTS

Hereinafter, embodiments to which the present technology is applied will be described with reference to the drawings.

First Embodiment

<Overview of the Present Technology>

The present technology relates to one semiconductor device (a chip) obtained by, for example, joining two semiconductor substrates together. First, an overview of the present technology will be described.

Figure 1:
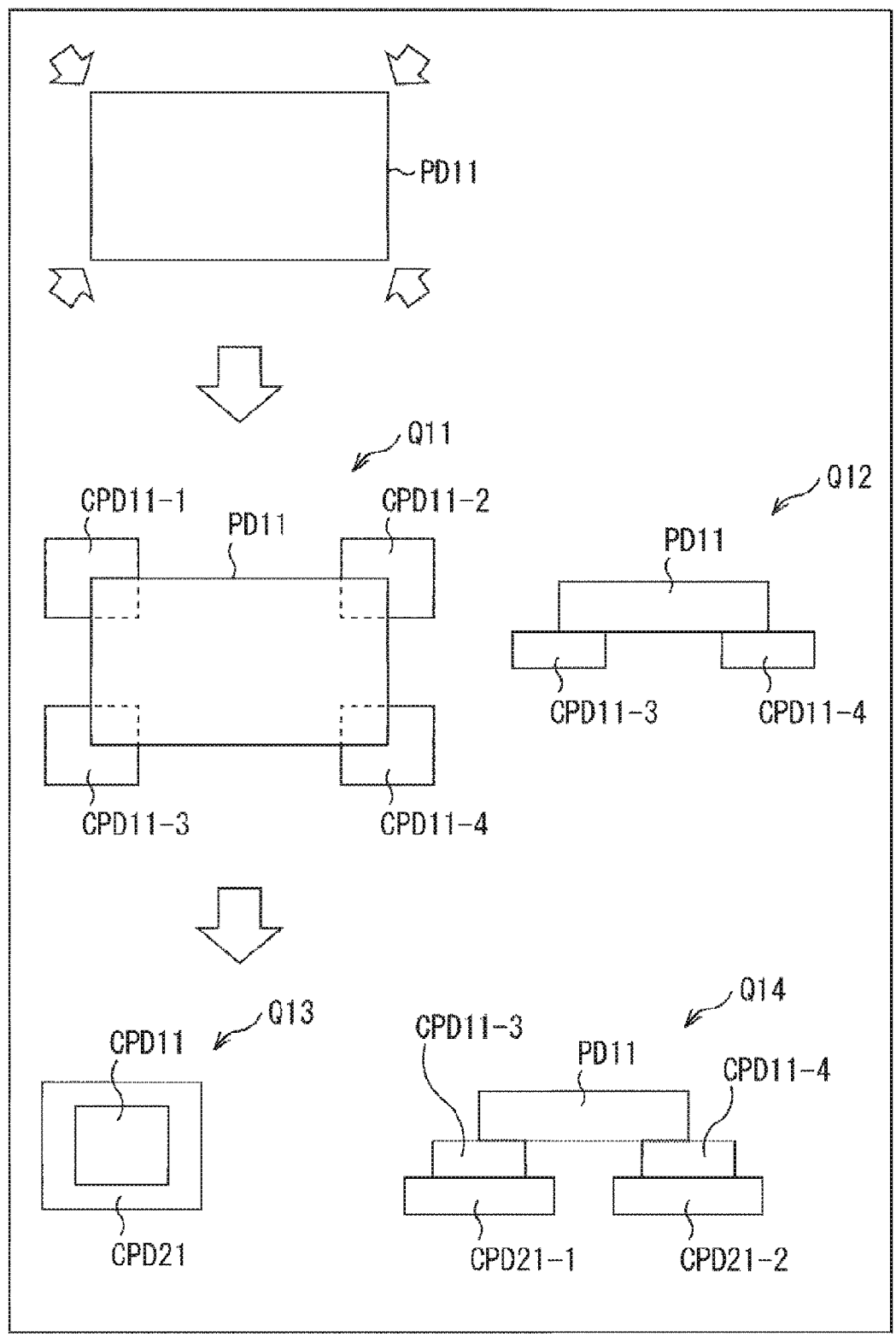
FIG. 1 is a diagram describing stress exerted on a pad and pads for protection.

As shown in FIG. 1, for example, when wire bonding or probing is performed on an Al (aluminum) pad PD11 provided in the semiconductor device from the side of the joined semiconductor substrate on the upper side, stress is concentrated on the pad PD11 as described above. There is concern of cracking in an insulating film unit or the like positioned immediately below the pad PD11.

Thus, for the purpose of protecting lower parts of corners (corners) or sides of the pad PD11 on which an impact concentrates during wire bonding or probing in the present technology, Cu (copper) wiring is disposed as indicated by the arrow Q11 and the arrow Q12.

Note that the arrow Q11 indicates the drawing in which the pad PD11 is viewed in the normal direction of a semiconductor substrate which constitutes a semiconductor device, and the arrow Q12 indicates the drawing in which the pad PD11 indicated by the arrow Q11 is viewed in the direction from the lower part to the upper part of the drawing, i.e., a cross-sectional view.

In the examples indicated by the arrow Q11 and the arrow Q12, a pad CPD11-1 to a pad CPD11-4 formed of Cu are disposed at the four corner parts of the pad PD11. Note that the pad CPD11-1 to the pad CPD11-4 will also be referred to simply as pads CPD11 when there is no particular need to distinguish the pads.

In addition, pads CPD21 which are larger than the pads CPD11 are provided below the pads CPD11 as indicated by the arrow Q13. In other words, for example, as indicated by the arrow Q14, a pad CPD21-1 and a pad CPD21-2 are provided below the pads CPD11-3 and the pad CPD11-4 indicated by the arrow Q12.

The pads provided on the lower side of the pad PD11 may be formed to be, for example, the square-shaped pad CPD11-1 to pad CPD11-4 provided below each corner of the pad PD11 as indicated by the arrow Q21 of FIG. 2, or may be formed in a different shape.

Figure 2:
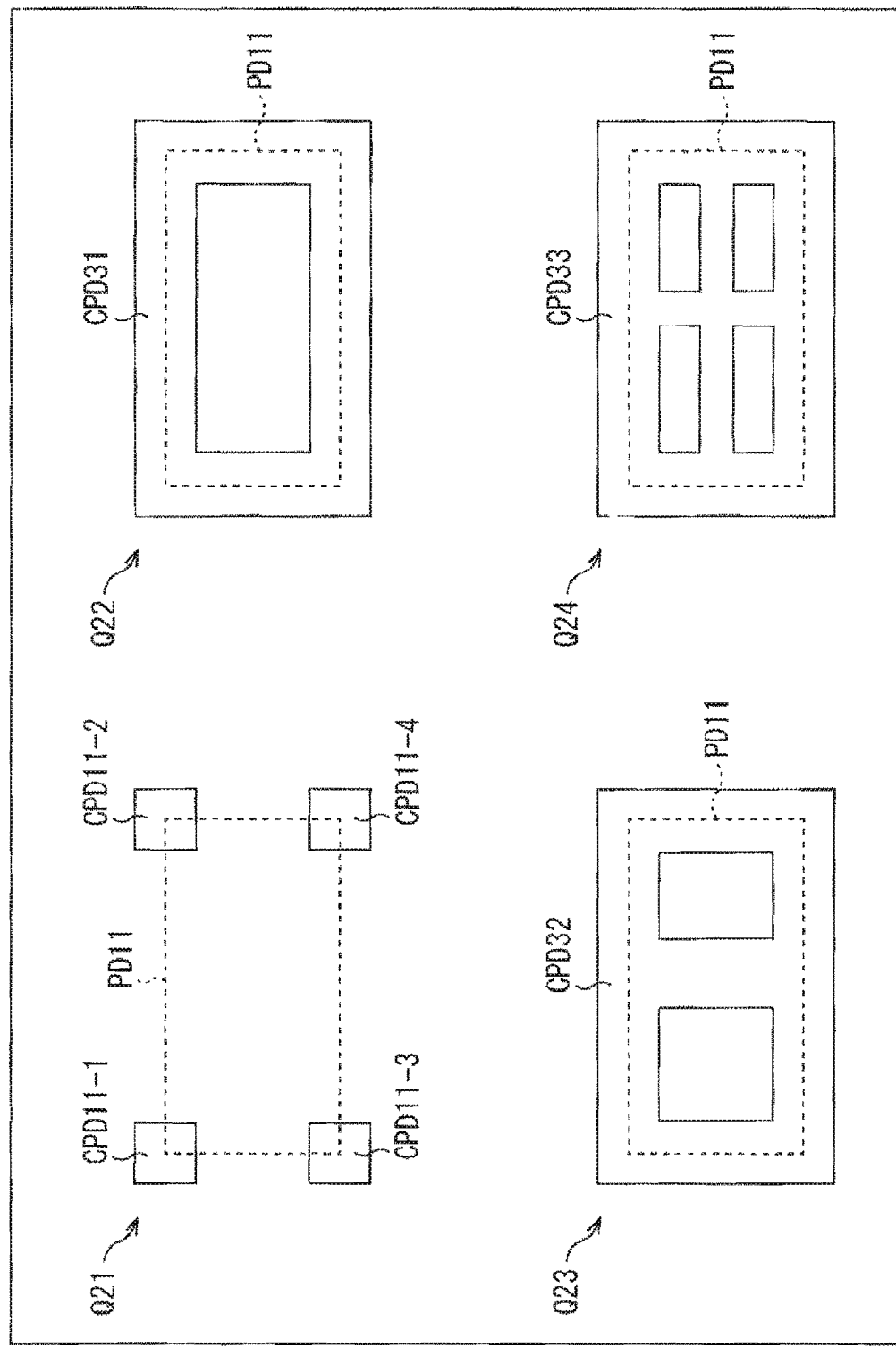
FIG. 2 is a diagram showing an example of the pads for protection.

Note that FIG. 2 is a diagram in which the pad PD11 is viewed from the normal direction of the semiconductor substrate which constitutes the semiconductor device, and the same reference numerals are given to elements in FIG. 2 that correspond to those in FIG. 1, and description thereof is appropriately omitted.

In addition, a Cu pad CPD31 which protects the side parts of the pad PD11, i.e., Cu wiring, may be provided below the pad PD11 as indicated by the arrow Q22. This pad CPD31 is provided immediately below the side parts of the pad PD11 such that the pad CPD31 surrounds the sides thereof when the pad PD11 is viewed from the normal direction of the semiconductor substrate. In other words, the pad CPD31 is formed in a ring shape, and thus Cu which composes the pad PCD31 is not in the bottom of the center portion of the pad PD11. In other words, a portion which does not contain Cu is appropriately provided around the center of the pad PCD31.

Furthermore, a pad in which one or more Cu wiring arrangements are disposed may be provided in the space closed by the Cu wiring provided along the four sides of the pad PD11 as indicated by the arrow Q23 and the arrow Q24.

In the example indicated by the arrow Q23, for example, a pad CPD32 constituted by Cu wiring which protects the side parts of the pad PD11 and Cu wiring which is positioned at the center of the pad PD11 and extends in the longitudinal direction connecting the upper and lower sides of the pad PD11 is provided below the pad PD11. A portion which does not contain Cu that is a material forming the pad CPD32 is appropriately provided around the center of the pad CPD32.

In addition, in the example indicated by the arrow Q24, a pad CPD33 constituted by Cu wiring which protects the side parts of the pad PD11, Cu wiring which is positioned at the center of the pad PD11 and extends in the longitudinal direction connecting the upper and lower sides of the pad PD11, and Cu wiring that extends in the horizontal direction connecting the left and right sides of the pad PD11 is provided below the pad PD11. A portion which does not contain Cu that is a material forming the pad CPD33 is appropriately provided around the center of the pad CPD33.

Furthermore, a rectangular pad which is larger than the pad PD11 may be provided as a Cu pad for protecting the pad PD11.

In the present technology, pads (wiring) that are formed of Cu or the like which at least protect corner parts or side parts of the pad that is used in wire bonding or probing are provided below the pad, i.e., on the bonding surface side of the semiconductor substrates in the normal direction of semiconductor substrates. In addition, pads which protect the corner parts or the side parts of the pads for protection are also provided below the pads. Furthermore, the pads which protect the corner or side parts of the pads immediately thereabove as described above are connected to each other (laminated) up to the semiconductor substrate which is joined to the semiconductor substrate that is provided with the pad for wire bonding or the like such that, for example, the pads for protection radially expand.

Accordingly, crack resistance of the pad for wire bonding or probing can be improved, which makes wire bonding or probing with respect to the upper semiconductor substrate possible. As a result, a depth of the pad can be maintained shallow, and reduction of pad opening formation time and prevention of defects in wire bonding and contact of a probe pin can be realized.

Note that it is necessary for a size of a Cu pad to be, for example, large enough to cover the entire area of the Al pad PD11 shown in FIG. 1 on the bonding surface on which the semiconductor substrates are joined together so that the pad PD11 is protected.

When a large Cu pad is present on the bonding surface, however, the pad affects planarization at the time of chemical-mechanical polishing (CMP) of a Cu portion or an insulating film portion for planarizing the bonding surface, and thus dishing occurs in the Cu pad portion. In other words, the Cu pad portion becomes concave.

Since the portion in which such dishing has occurred is difficult to join, it is necessary for the shape of the Cu pad on the bonding surface to be a shape which prevents occurrence of dishing.

Thus, it is preferable to provide a portion (a region) which does not contain Cu on the bonding surface side surface of the Cu pad that is on the bonding surface. Specifically, by setting a shape of the Cu pad on the bonding surface to be, for example, the shape of the pad CPD31 indicated by the arrow Q22 of FIG. 2, the area of the Cu part on the bonding surface can be reduced, and occurrence of dishing can be suppressed. In addition, by setting a shape of the Cu pad on the bonding surface to be, for example, the shape of the pad CPD32 indicated by the arrow Q23 of FIG. 2 or the shape of the pad CPD33 indicated by the arrow Q24, occurrence of dishing can be suppressed, and the bonding surface part below the pad PD11 can be more firmly protected.

<Configuration Example of a Semiconductor Device>

Next, a specific embodiment to which the present technology is applied will be described.

Figure 3:
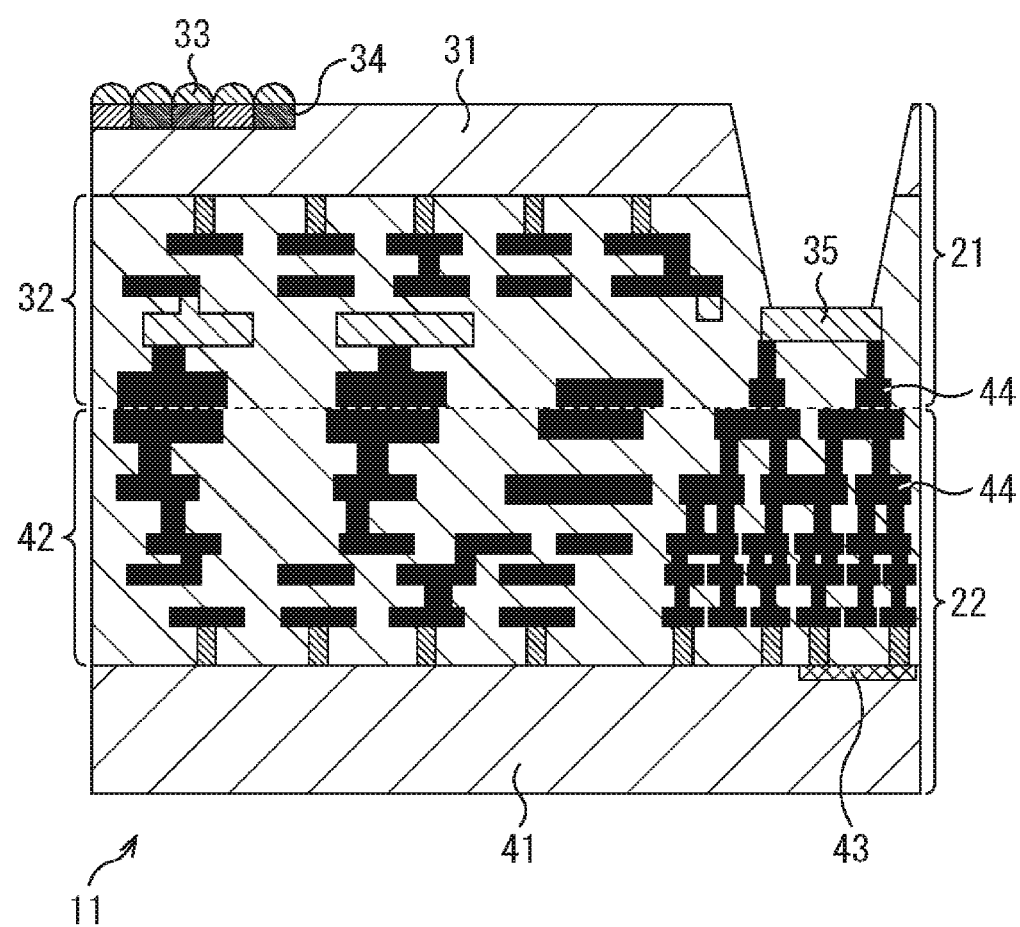
FIG. 3 is a diagram showing a configuration example of a semiconductor device.

FIG. 3 is a diagram showing a configuration example of an embodiment of a semiconductor device to which the present technology is applied.

The semiconductor device 11 shown in FIG. 3 includes an imaging device constituted by, for example, a complementary metal-oxide semiconductor (CMOS) image sensor, and has an upper substrate 21 and a lower substrate 22 which are bonded together. Note that the dashed line between the upper substrate 21 and the lower substrate 22 represents the bonding surface of the upper substrate 21 and the lower substrate 22.

The upper substrate 21 is constituted by a Si substrate 31 and a wiring layer 32 laminated on the Si substrate 31. The wiring layer 32 is constituted by a plurality of wiring layers. In addition, on-chip lenses 33 which condense light from a subject and color filters 34 which transmit light of a predetermined color of light condensed by the on-chip lenses 33 are provided on the upper side of the Si substrate 31 in the drawing. Further, a pad 35 for wire bonding that is formed of Al is also provided in the wiring layer 32.

The lower substrate 22 includes a Si substrate 41 and a wiring layer 42 laminated on the Si substrate 41, and an insulating film 43 is provided on a part of the portion of the wiring layer 42 which comes into contact with the Si substrate 41. In addition, the wiring layer 42 is constituted by a plurality of wiring layers.

Furthermore, in this example, pads that are formed of Cu for protecting the pad 35 are provided in each layer between the pad 35 for wiring bonding to the insulating film 43 in the wiring layer 32 and the wiring layer 42, and these pads are insulated from the Si substrate 41 by the insulating film 43. Specifically, a pad group 44 which is constituted by a plurality of pads (wiring) and protects the Cu pad or the Al pad 35 positioned immediately above is provided between the pad 35 and the insulating film 43 in the semiconductor device 11.

In other words, Cu pads which protect the pad 35 are provided in at least the corner parts of the pad 35 in the wiring layer below the pad 35 in the drawing. In addition, Cu pads for further protecting the Cu pads which protect the pad 35 are provided in at least the corner parts of the Cu pads positioned immediately thereabove in the wiring layer below the Cu pads in the drawing. In this manner, in each wiring layer between the pad 35 and the insulating film 43, pads for protecting pads located thereabove are provided in at least the corner parts of the pads. In other words, pads for protecting the pad 35 are laminated.

A shape of the Cu pads in each layer is set to, for example, the shapes of the pads described with reference to FIG. 2. In particular, a shape of the Cu pads on the bonding surface of the upper substrate 21 and the lower substrate 22 is set to the shape of the pad CPD31 indicated by the arrow Q22, the pad CPD32 indicated by the arrow Q23, the pad CPD33 indicated by the arrow Q24 of FIG. 2, or the like.

By providing each of the Cu pads below the pad 35 in the drawing as above, crack resistance can be improved. Thus, with the simple configuration in which pads for protection are provided below the pad 35 in the drawing, when wire bonding is performed on the pad 35 from the upper side of the drawing, it is possible to prevent an insulating film or the like of each wiring layer below the pad 35 in the drawing from being damaged by stress.

In addition, with such a configuration, a metal pad for wire bonding or probing can be provided on the upper substrate 21. As a result, a depth from the Si substrate 31 to the metal pad can be set to be shallow, pad opening formation time can be reduced, and occurrence of defects in wire bonding or contact of a pin can be suppressed.

Note that, with respect to the metal pad provided in the upper substrate 21, the pad may be produced in the upper substrate 21 in advance, or a metal pad layer may be formed after forming a pad opening.

<Regarding a Manufacturing Method of the Semiconductor Device>

Next, a manufacturing method of the semiconductor device 11 shown in FIG. 3 will be described with reference to FIGS. 4 to 6. Note that the same reference numerals are given to elements in FIGS. 4 to 6 that correspond to those of FIG. 3, and description thereof is appropriately omitted. In addition, in FIG. 3 and FIGS. 4 to 6, parts of the wiring structure of the semiconductor device 11 are drawn in a simplified manner so that the drawings can be more easily understood. Thus, the parts of the wiring structure may be different in FIG. 3 and FIGS. 4 to 6.

Figure 4:
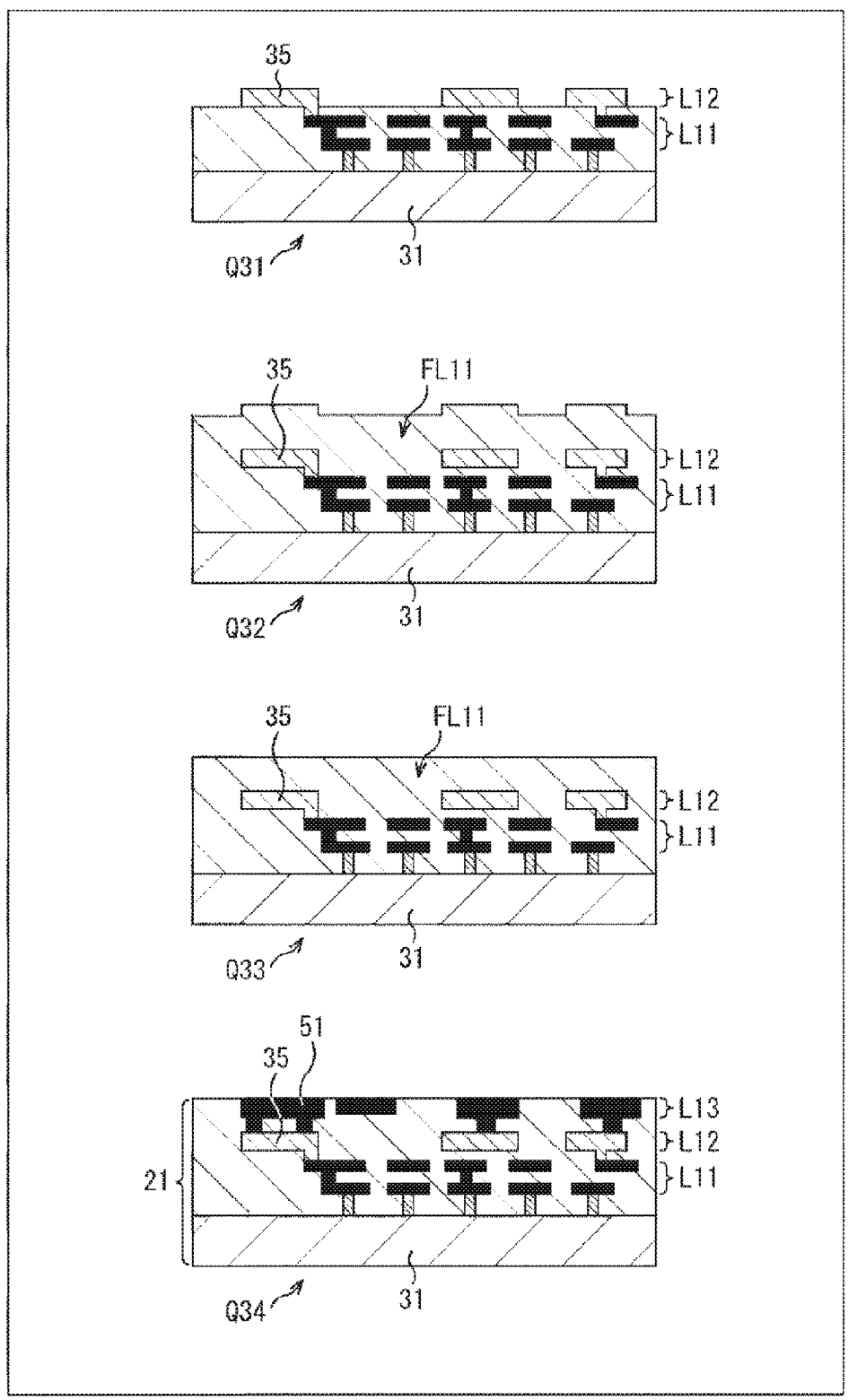
FIG. 4 is a diagram describing manufacturing steps of the semiconductor device.

As indicated by the arrow Q31 of FIG. 4, for example, a wiring layer L11 in which Cu wiring connected to a base device such as a transistor is provided is formed on a Si substrate 31, and an Al wiring structure is further formed in a wiring layer L12 that is in an upper layer of the wiring layer L11. As the Al wiring structure, for example, the pad 35 or other Al wiring is formed.

Then, as indicated by the arrow Q32, a $SiO_2$ film and a carbon-containing silicon oxide (SiOC) film with a thickness of 500 to 5000 nm are formed on a surface of the wiring layer L12 as an inter-layer insulating film FL11. Note that, a film forming method may be any of a chemical vapor deposition (CVD) method or a spin-coating method.

Further, as indicated by the arrow Q33, the $SiO_2$ film and the carbon-containing silicon oxide (SiOC) film formed on the surface of the wiring layer L12, i.e., the inter-layer insulating film FL11, are polished to have a thickness of 100 to 4000 nm in the chemical-mechanical polishing (CMP) method and thereby planarized.

Then, although a Cu wiring structure that is connected to the Al wiring is formed in a wiring layer L13 as indicated by the arrow Q34, processing until CMP for Cu is performed here.

In addition, at this time, a Cu wiring structure 51 that is connected to the Al wiring provided in the wiring layer L12, particularly a metal pad part such as the pad 35, is in a layout in which the structure is disposed immediately below the four corners and the four sides of the metal pad, like the pads CPD11 or the pads CPD31 shown in FIG. 2.

A layout in which one or more Cu wiring arrangements are disposed in a space closed by the Cu wiring of the four sides, like the pad CPD32 or the pad CPD33 also shown in FIG. 2, is also effective for improving crack resistance. In any of the examples shown in FIG. 2, the Cu wiring structure 51 may be a so-called via structure or a wiring structure, and a width of the wiring may be any width in the range of 0.2 to 50 Lm.

The upper substrate 21 is obtained through the above-described steps.

Figure 5:
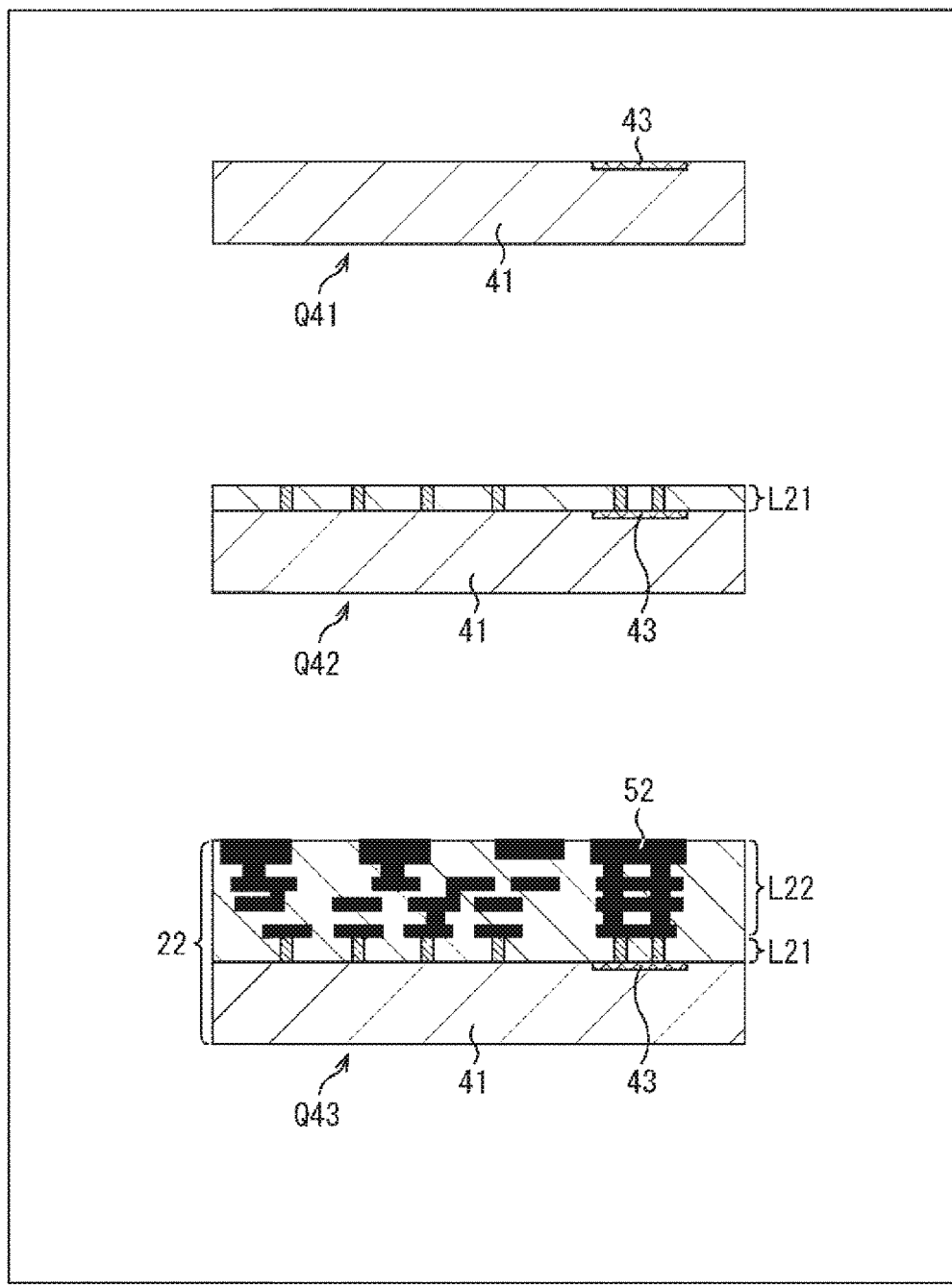
FIG. 5 is a diagram describing manufacturing steps of the semiconductor device.

On the other hand, the lower substrate 22 is produced as shown in FIG. 5.

In other words, as indicated by the arrow Q41, the insulating film 43 is embedded in the Si substrate 41 which has a device. The insulating film 43 may be, for example, a $SiO_2$ film or a SiN film. In addition, a thickness of the insulating film 43 to be embedded may be any thickness in the range of 10 to 1000 nm.

Next, contacts that are connected to the Si substrate 41 are formed in the wiring layer L21 as indicated by the arrow Q42 in the same manner as for the upper substrate 21 described above. Here, the contacts do not reach the Si substrate 41 in the part in which the insulating film 43 is embedded, and only the bottoms of the contacts are designed to reach the top of the insulating film 43 or the inside of the insulating film 43.

Further, a Cu wiring structure is formed in a wiring layer L22 which is in the upper layer of the wiring layer L21 constituted by several wiring layers as indicated by the arrow Q43 in the same manner as for the upper substrate 21 described above. In this example, a Cu wiring structure 52 is formed on the upper side of the insulating film 43 in the drawing. In addition, processing until CMP for Cu is performed on the uppermost layer among the plurality of wiring layers constituting the wiring layer L22, i.e., the wiring layer on the upper side of the wiring layer L22 in the drawing.

Cu pads such as Cu pads (wiring) which constitute the Cu wiring structure 52, which are disposed immediately below the four corners and the four sides of the metal pad at the time of bonding to the upper substrate 21, are formed in the wiring layer L22, like the pads CPD11 or the pad CPD31 shown in FIG. 2.

The lower substrate 22 is obtained through the above-described steps.

Figure 6:
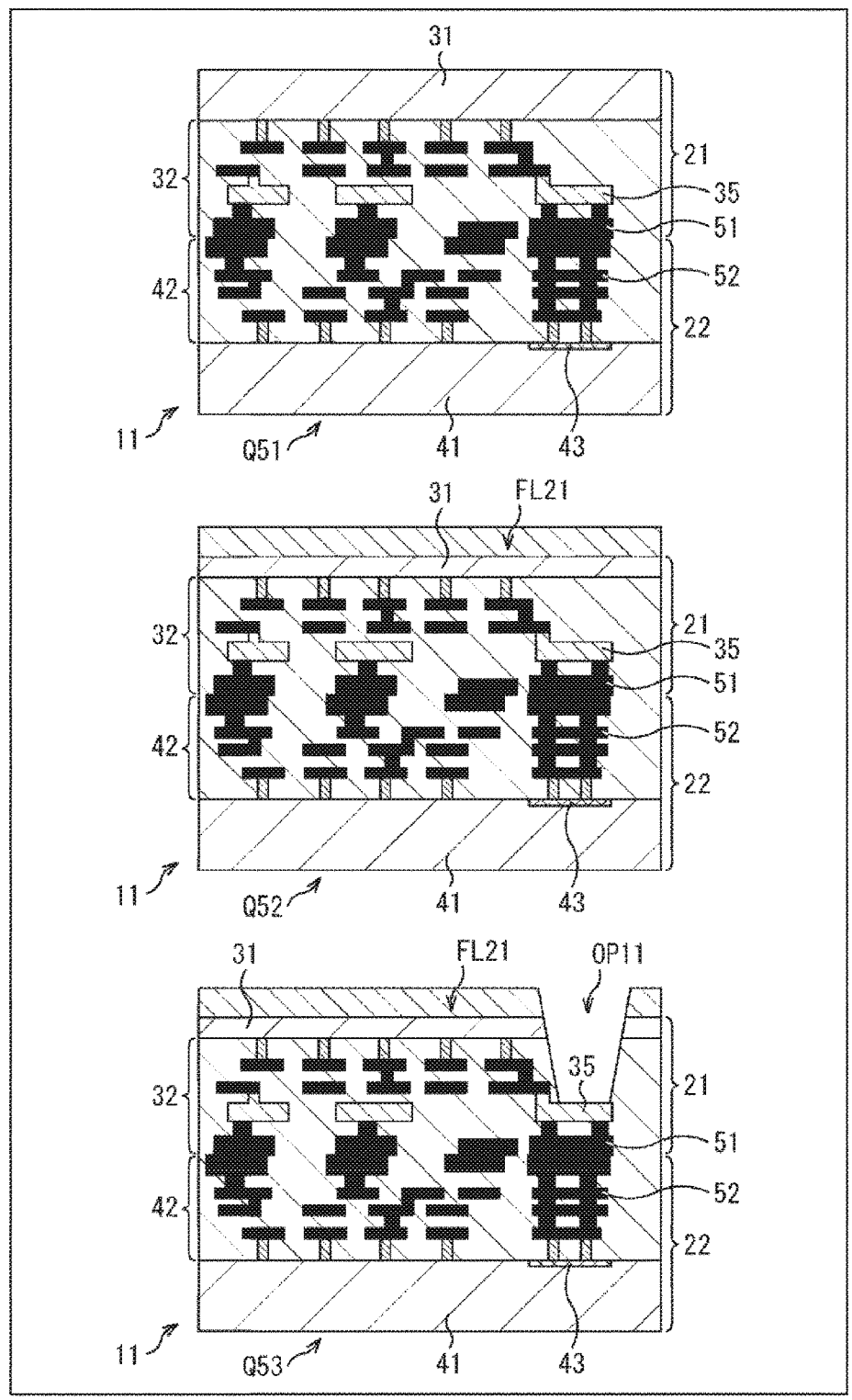
FIG. 6 is a diagram describing manufacturing steps of the semiconductor device.

Then, the upper substrate 21 and the lower substrate 22 are bonded to face each other as indicated by the arrow Q51 of FIG. 6. Specifically, the wiring layer 32 constituting the upper substrate 21 and the wiring layer 42 constituting the lower substrate 22 are disposed to face each other, the Cu parts facing each other are bonded together, and the insulating film parts facing each other are bonded together.

Accordingly, for example, the Cu wiring structure 51 and the Cu wiring structure 52 are bonded together, and thereby a Cu pad group 44 shown in FIG. 3 is formed.

Note that, for the bonding of the upper substrate 21 and the lower substrate 22, a method described in, for example, JP 2012-256736A or the like is used.

Furthermore, the thickness of the Si substrate 31 of the upper substrate 21 is thinned using a method described in, for example, JP 2007-234725A or the like, and then an insulating film FL21 is formed on a surface of the Si substrate 31 as indicated by the arrow Q52. Note that the insulating film FL21 may be a $SiO_2$ film or a SiN film, or a laminated film thereof. In addition, a thickness of the insulating film FL21 may be any thickness in the range of 10 to 3000 nm.

After the insulating film FL21 is formed, a pad opening is patterned using a general lithography and a dry-etching technology, and thereby a part of or the entire Al pad 35 that has already been created in the wiring structure of the upper substrate 21 is exposed therethrough as indicated by the arrow Q53. In other words, an opening OP11 for exposing the pad 35 is provided in the upper substrate 21. Accordingly, wire bonding to the pad 35 is possible.

Thereafter, the on-chip lenses 33 and the color filters 34 are provided on the upper substrate 21, and thereby the semiconductor device 11 is formed. Note that steps performed after the bonding of the upper substrate 21 and the lower substrate 22 depend on a device to which the present technology is applied; however, when the present technology is applied to a solid-state imaging device, the steps described in, for example, JP 2007-234725A are performed.

According to the semiconductor device 11 described above, the metal pad formed of Al or the like is protected by pads formed of Cu (metal wiring) provided below the pad, and thus when wire bonding or probing is performed on the metal pad, damage to an insulating film below the pad or the like can be suppressed. In other words, with a simple configuration of providing pads for protection, crack resistance of the semiconductor device 11 can be improved.

Moreover, since the metal pad formed of Al or the like can be provided on the substrate on the side on which wire bonding or probing is performed, i.e., the upper substrate 21 in the semiconductor device 11, occurrence of defects in wire bonding or contact of a pin can be suppressed. Furthermore, when the metal pad is created, processing time taken during manufacturing (pad opening formation) can be reduced, and thus productivity can be improved.

In addition, although the example in which, when the two substrates are joined (bonded) together, the pads for protecting the metal pad provided in the upper substrate are laminated between the metal pad and the lower substrate has been described above, the same may apply to a case in which three or more substrates are bonded. In other words, pads for protecting a metal pad provided on an upper substrate among the three or more bonded substrates may be laminated and provided between the metal pad and the lowermost substrate.

Second Embodiment

<Configuration Example of a Semiconductor Device>

Note that, although the example in which the Cu pads (Cu wiring) that are provided below the pad 35 are insulated from the Si substrate 41 by providing the insulating film 43 between the Cu pads and the Si substrate 41 has been described in the first embodiment, a design in which the insulation is realized by embedding an insulator in a part of the Si substrate 41 is also possible.

Figure 7:
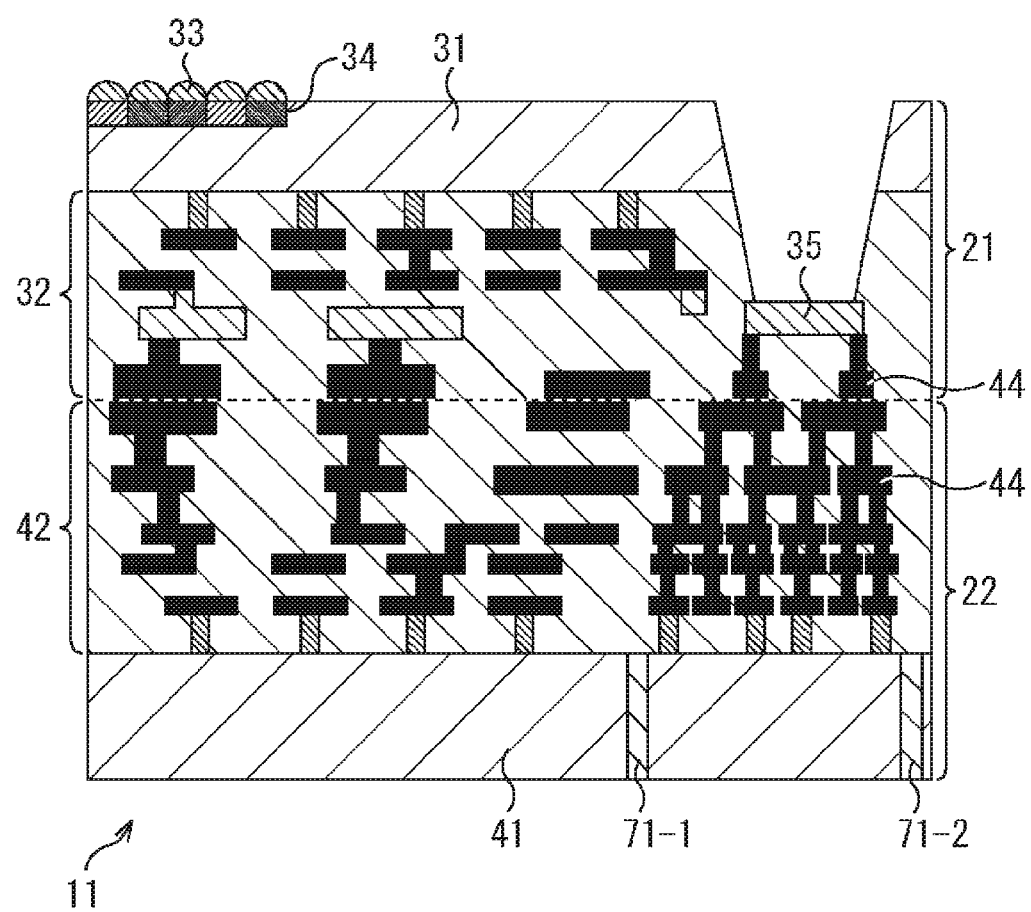
FIG. 7 is a diagram showing a configuration example of a semiconductor device.

In such a case, a semiconductor device 11 is configured as shown in, for example, FIG. 7. Note that the same reference numerals are given to elements in FIG. 7 that correspond to those in FIG. 3, and description thereof is appropriately omitted.

The semiconductor device 11 shown in FIG. 7 is different from the semiconductor device 11 shown in FIG. 3 in that the device is not provided with the insulating film 43 but is provided with an insulating film 71-1 and another insulating film 71-2 in a Si substrate 41.

In FIG. 7, the insulating film 71-1 and the insulating film 71-2 are provided in the Si substrate 41 to surround a partial region in which Cu pads (pad group 44) provided below a pad 35 come into contact with the Si substrate 41. Thus, the region of the Si substrate 41 that is electrically connected to the Cu pads is electrically separated from other regions of the Si substrate 41 by the insulating film 71-1 and the insulating film 71-2.

<Regarding a Manufacturing Method of the Semiconductor Device>

Next, a manufacturing method of the semiconductor device 11 shown in FIG. 7 will be described with reference to FIGS. 8 to 10. Note that the same reference numerals are given to elements in FIGS. 8 to 10 that correspond to those of FIG. 7, and description thereof is appropriately omitted. In addition, in FIG. 7 and FIGS. 8 to 10, parts of the wiring structure of the semiconductor device 11 are drawn in a simplified manner so that the drawings can be more easily understood. Thus, the parts of the wiring structure may be different in FIG. 7 and FIGS. 8 to 10.

Figure 8:
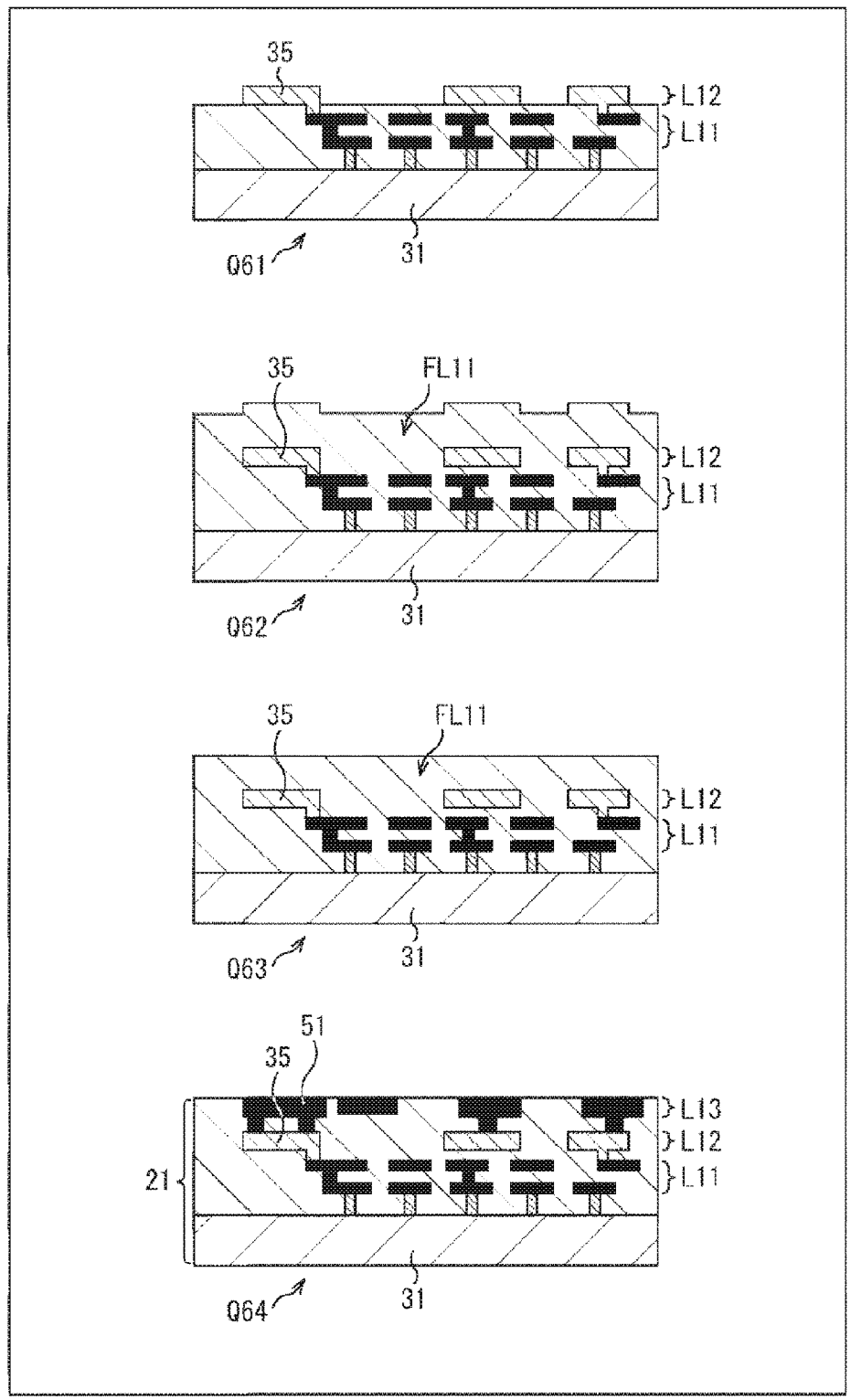
FIG. 8 is a diagram describing manufacturing steps of the semiconductor device.

As indicated by the arrow Q61 of FIG. 8, for example, a wiring layer L11 in which Cu wiring connected to a base device such as a transistor is provided is formed on a Si substrate 31, and an Al wiring structure is further formed in a wiring layer L12 that is in an upper layer of the wiring layer L11. As the Al wiring structure, for example, the pad 35 or other Al wiring is formed.

Then, as indicated by the arrow Q62, a $SiO_2$ film and a carbon-containing silicon oxide (SiOC) film with a thickness of 500 to 5000 nm are formed on a surface of the wiring layer L12 as an inter-layer insulating film FL11. Note that, a film forming method may be any of a CVD method or a spin-coating method.

Further, as indicated by the arrow Q63, the $SiO_2$ film and the carbon-containing silicon oxide (SiOC) film formed on the surface of the wiring layer L12. i.e., the inter-layer insulating film FL11, are polished to have a thickness of 100 to 4000 nm in the CMP method and thereby planarized.

Then, although a Cu wiring structure that is connected to the Al wiring is formed in a wiring layer L13 as indicated by the arrow Q64, processing until CMP for Cu is performed here.

In addition, at this time, a Cu wiring structure 51 that is connected to the Al wiring provided in the wiring layer L12, particularly a metal pad part such as the pad 35, is in a layout in which the structure is disposed immediately below the four corners and the four sides of the metal pad, like the pads CPD11 or the pads CPD31 shown in FIG. 2.

A layout in which one or more Cu wiring arrangements are disposed in a space closed by the Cu wiring of the four sides, like the pad CPD32 or the pad CPD33 also shown in FIG. 2, is also effective for improving crack resistance. In any of the examples shown in FIG. 2, the Cu wiring structure 51 may be a so-called via structure or a wiring structure, and a width of the wiring may be any width in the range of 0.2 to 50 μm.

The upper substrate 21 is obtained through the above-described steps.

Figure 9:
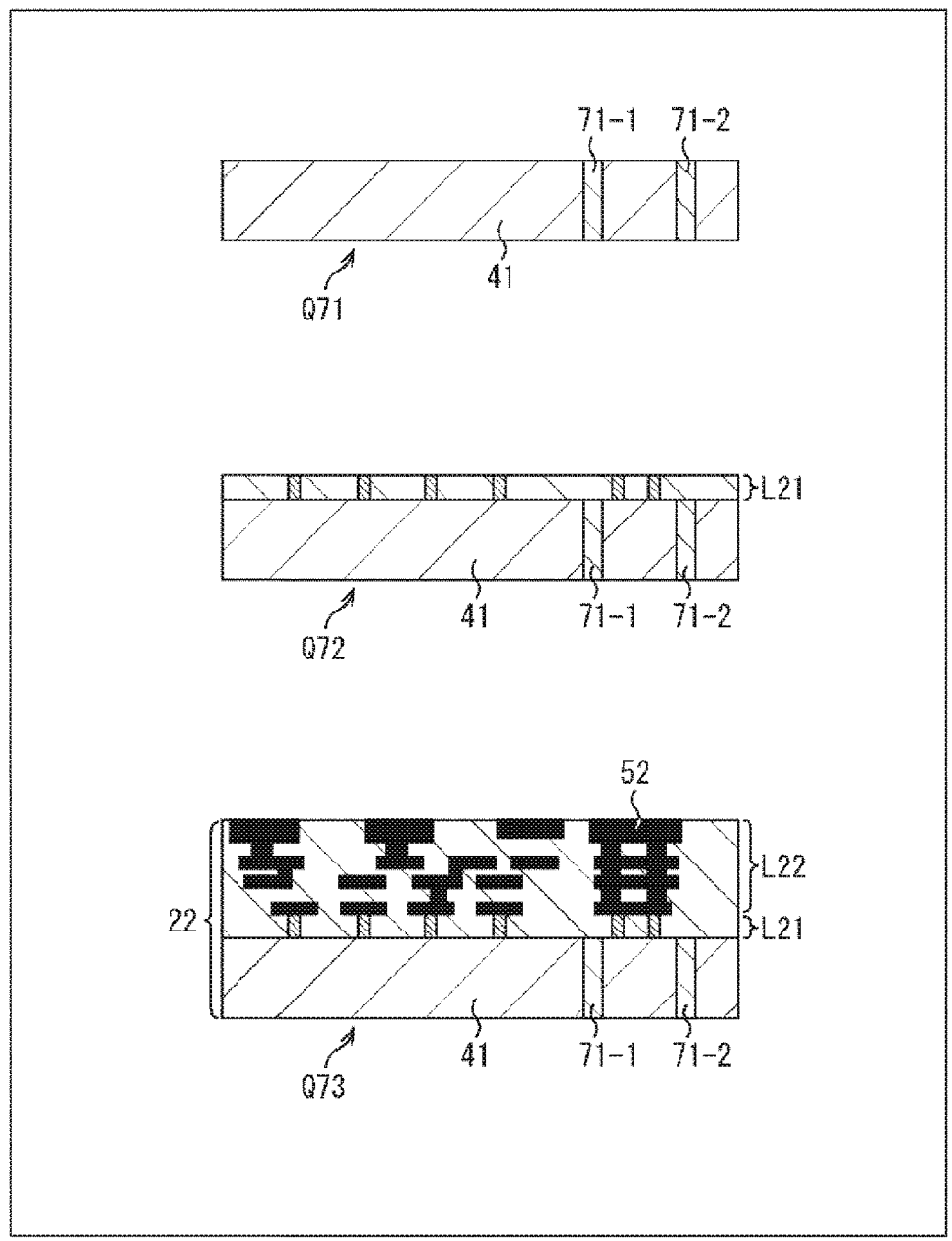
FIG. 9 is a diagram describing manufacturing steps of the semiconductor device.

On the other hand, the lower substrate 22 is produced as shown in FIG. 9.

In other words, as indicated by the arrow Q71, the insulating film 71-1 and the insulating film 71-2 are embedded in the Si substrate 41 which has a device. The insulating film 71-1 and the insulating film 71-2 may be, for example, a $SiO_2$ film or a SiN film. In addition, a thickness of the insulating film 71-1 and the insulating film 71-2 to be embedded may be any thickness in the range of 10 to 1000 nm.

Next, contacts that are connected to the Si substrate 41 are formed in the wiring layer L21 as indicated by the arrow Q72 in the same manner as for the upper substrate 21 described above.

Further, a Cu wiring structure is formed in a wiring layer L22 which is in the upper layer of the wiring layer L21 constituted by several wiring layers as indicated by the arrow Q73 in the same manner as for the upper substrate 21 described above. In this example, a Cu wiring structure 52 is formed on the upper side of the insulating film 71-1 and the insulating film 71-2 in the drawing. In addition, processing until CMP for Cu is performed on the uppermost layer among the plurality of wiring layers constituting the wiring layer L22, i.e., the wiring layer on the upper side of the wiring layer L22 in the drawing.

Cu pads such as Cu pads (wiring) which constitute the Cu wiring structure 52, which are disposed immediately below the four corners and the four sides of the metal pad at the time of bonding to the upper substrate 21, are formed in the wiring layer L22, like the pads CPD11 or the pad CPD31 shown in FIG. 2.

The lower substrate 22 is obtained through the above-described steps.

Figure 10:
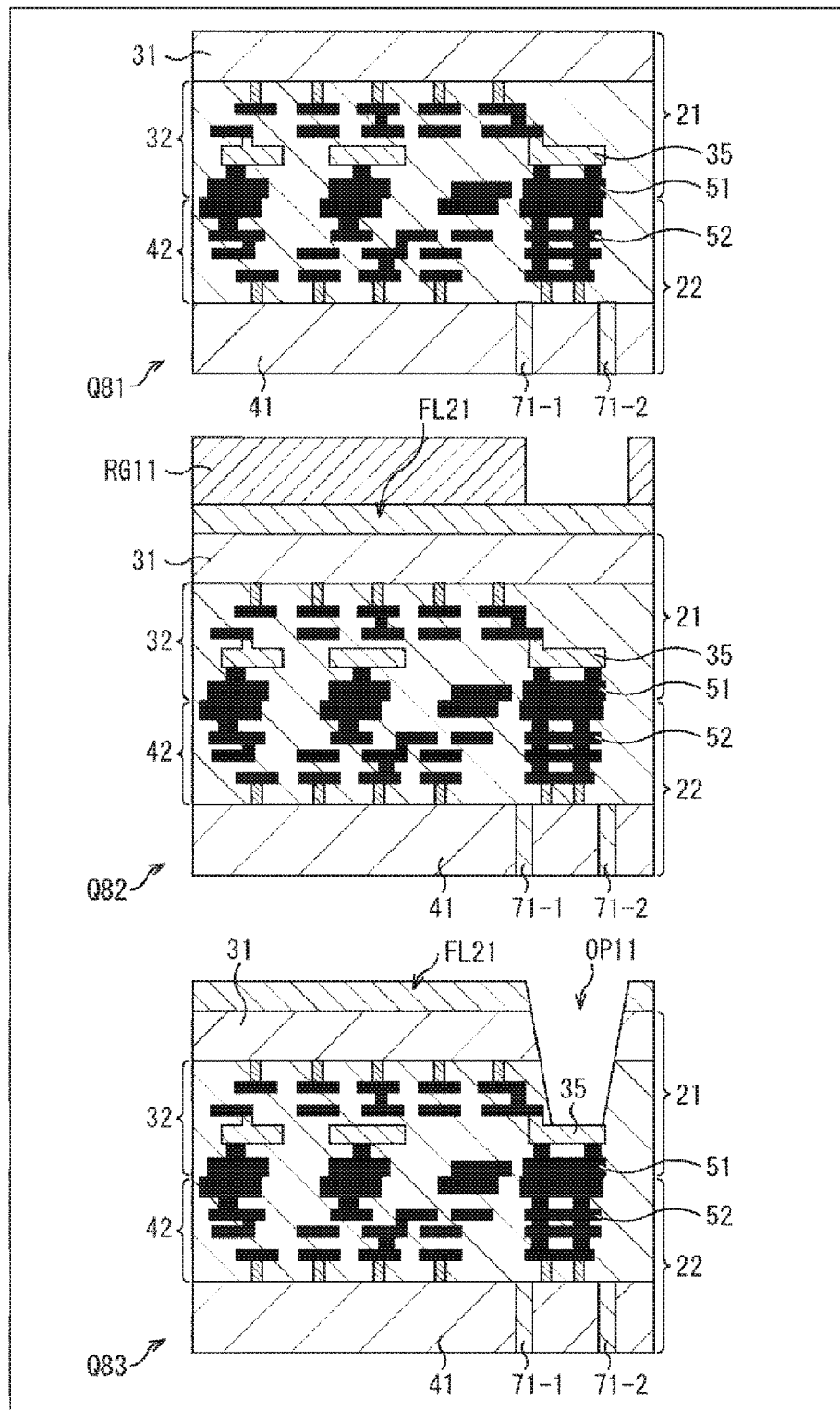
FIG. 10 is a diagram describing manufacturing steps of the semiconductor device.

Then, the upper substrate 21 and the lower substrate 22 are bonded to face each other as indicated by the arrow Q81 of FIG. 10. Specifically, the wiring layer 32 constituting the upper substrate 21 and the wiring layer 42 constituting the lower substrate 22 are disposed to face each other, the Cu parts facing each other are bonded together, and the insulating film parts facing each other are bonded together.

Note that, for the bonding of the upper substrate 21 and the lower substrate 22, a method described in, for example, JP 2012-256736A or the like is used.

Furthermore, the thickness of the Si substrate 31 of the upper substrate 21 is thinned using a method described in, for example, JP 2007-234725A or the like, and then an insulating film FL21 is formed on a surface of the Si substrate 31 as indicated by the arrow Q82. Note that the insulating film FL21 may be a $SiO_2$ film or a SiN film, or a laminated film thereof. In addition, a thickness of the insulating film FL21 may be any thickness in the range of 10 to 3000 nm.

Furthermore, when the insulating film FL21 has been formed, a resist RG11 is provided on the insulating film FL21. Then, a pad opening is patterned using a general lithographic technology and a dry-etching technology, and thereby a part of or the entire Al pad 35 that has already been created in the wiring structure of the upper substrate 21 is exposed therethrough.

Accordingly, an opening OP11 through which the pad 35 is exposed is formed on the upper substrate 21 as indicated by the arrow Q83. Wire bonding is possible with respect to the pad 35 from this opening OP11.

Thereafter, the on-chip lenses 33 and the color filters 34 are provided on the upper substrate 21, and thereby the semiconductor device 11 is formed. Note that steps performed after the bonding of the upper substrate 21 and the lower substrate 22 depend on a device to which the present technology is applied; however, when the present technology is applied to a solid-state imaging device, the steps described in, for example, JP 2007-234725A are performed.

As described above, even when the insulating film 71-1 and the insulating film 71-2 are embedded in the lower substrate 22, the partial region of the Si substrate 41 that is electrically connected to the pad 35 can be insulated from other regions.

Third Embodiment

<Configuration Example of a Semiconductor Device>

In addition, a metal pad provided in an upper substrate of a semiconductor device can be produced during the production of Cu wiring of the upper substrate; however, by producing a metal pad at the same time as the formation of contacts, a wiring layer for the Al pad may not be provided. Accordingly, the pad formation step using Al wiring can be excluded.

Figure 11:
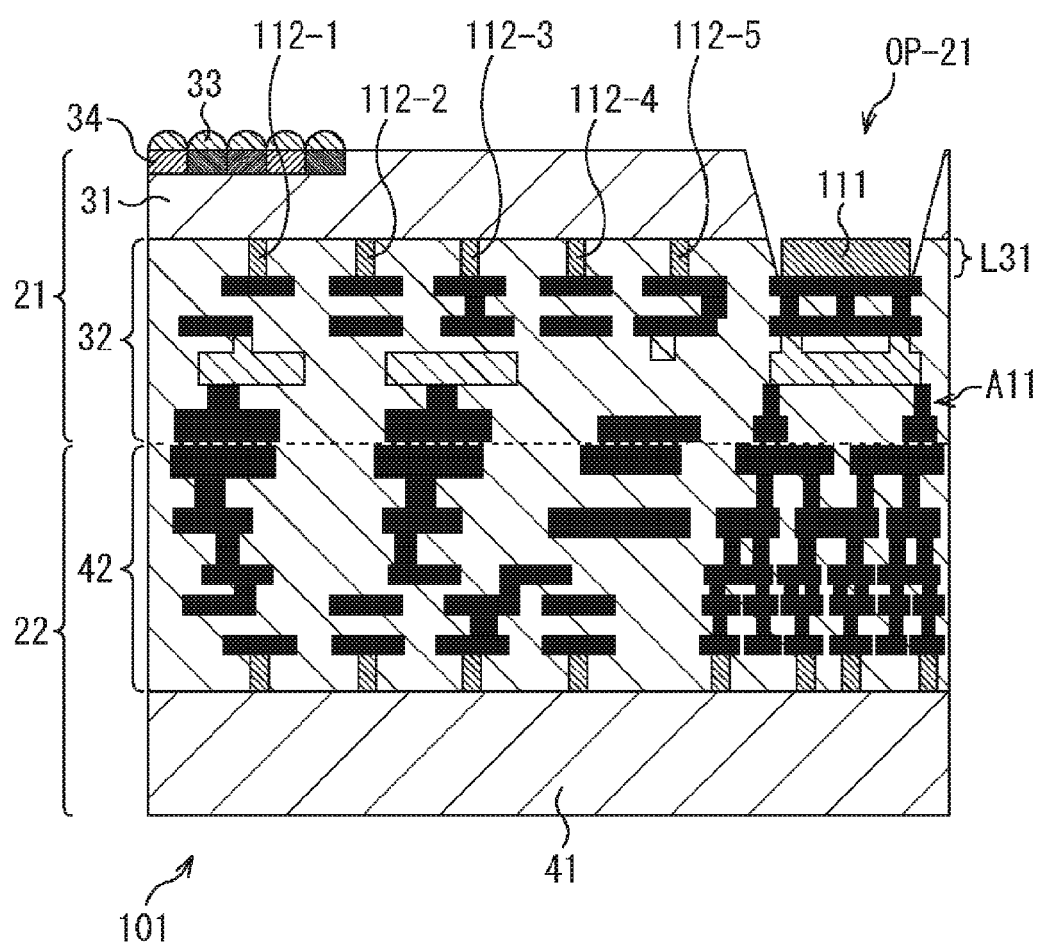
FIG. 11 is a diagram showing a configuration example of a semiconductor device.

When a metal pad is produced at the same time as the formation of contacts as described above, a semiconductor device is configured as shown in FIG. 11. Note that the same reference numerals are given to elements in FIG. 11 that correspond to those in FIG. 3, and description thereof is appropriately omitted.

The semiconductor device 101 has an upper substrate 21 and a lower substrate 22 that are bonded together, and the dashed line between the upper substrate 21 and the lower substrate 22 in the drawing represents the bonding surface of the upper substrate 21 and the lower substrate 22.

The upper substrate 21 includes a Si substrate 31 and a wiring layer 32, and on-chip lenses 33 and color filters 34 are provided on the upper side of the Si substrate 31 of the drawing.

Furthermore, a pad 111 for wire bonding and a contact 112-1 to a contact 112-5 that are formed of tungsten (W) are provided in a wiring layer L31 which is provided adjacent to the Si substrate 31 in the wiring layer 32 constituted by a plurality of wiring layers.

Note that, when there is no particular need to distinguish the contact 112-1 to the contact 112-5, they will also be referred to simply as contacts 112 below. The contacts 112 electrically connect a transistor that is provided inside the Si substrate 31 but is not illustrated and Cu wiring provided in a wiring layer immediately below the wiring layer L31. The pad 111 is provided in the wiring layer L31 in which the contacts 112 are formed.

In addition, the lower substrate 22 is constituted by a Si substrate 41 and a wiring layer 42.

Also in the semiconductor device 101, pads for protecting the pad 111, which are formed of Cu, are provided in each layer between the pad 111 for wire bonding and the Si substrate 41 of the wiring layer 32 and the wiring layer 42 as indicated by the arrow A11. Note that an insulating film is formed on a surface of the Si substrate 41, and thus the pads for protecting the pad 111 are set not to be in electrical contact with the Si substrate 41.

Specifically, Cu pads which protect the pad 111 are provided in at least the corner parts of the pad 111 in the wiring layer below the pad 111 in the drawing. In addition, Cu pads for further protecting the Cu pads which protect the pad 111 are provided in at least the corner parts of the Cu pads positioned immediately thereabove in the wiring layer below the Cu pads in the drawing. In this manner, in each wiring layer between the pad 111 and the Si substrate 41, pads for protecting pads located thereabove are provided in at least the corner parts of the pads. In other words, pads for protecting the pad 111 are laminated.

A shape of the Cu pads in each layer is set to, for example, the shapes of the pads described with reference to FIG. 2. In particular, a shape of the Cu pads on the bonding surface of the upper substrate 21 and the lower substrate 22 is set to the shape of the pad CPD31 indicated by the arrow Q22, the pad CPD32 indicated by the arrow Q23, the pad CPD33 indicated by the arrow Q24 of FIG. 2, or the like.

Crack resistance can be improved simply by providing the Cu pads on the lower side of the pad 111 in the drawing as described above. In addition, with such a configuration, a metal pad for wire bonding or probing can be provided on the upper substrate 21. As a result, a depth from the Si substrate 31 to the metal pad can be set to be shallow, pad opening formation time can be reduced, and occurrence of defects in wire bonding or contact of a pin can be suppressed.

In addition, the upper substrate 21 and the lower substrate 22 are electrically connected by the Cu pads protecting the pad 111 in the semiconductor device 101.

Note that the semiconductor device 101 shown in FIG. 11 shows a cross section of a solid-state imaging device that serves as the semiconductor device 101.

In addition, in the semiconductor device 101, the contacts 112 that serve as contact electrodes for electrically connecting the transistor after its production inside the Si substrate 31 and the Cu wiring are formed of tungsten (W) in the wiring layer L31.

At this time, at the same time as the production of the contacts 112, the wide pad 111 is also produced as a wire bonding pad. Here, in the production of the contacts 112 and the pad 111, an oxide film is formed in a part of the wiring layer L31 in which wiring is made of W through CVD, then patterned through lithography, and then a necessary patterned portion is opened through dry etching. Then, films are formed of W through CVD in the opened part, unnecessary parts are removed through CMP, and thereby the contacts 112 and the pad 111 are formed.

At the time of the production of the Cu wiring of the wiring layer 32 that is performed after the production of the pad 111, the Cu pads for protecting the pad 111 are formed as wiring as described above sequentially in each of the wiring layers to the bonding surface.

In addition, the Cu pads (Cu wiring) for protecting the pad 111 are also produced in the lower substrate 22 between the Si substrate 41 and the bonding surface with respect to the upper substrate 21 in the same manner as in the upper substrate 21 while protecting the corners and the sides of the pad.

The Cu wiring of the wiring layers close to the Si substrate 41 is electrically separated from the Si substrate 41 by an insulating film to prevent electrical contact with the Si substrate 41.

When the upper substrate 21 and the lower substrate 22 are produced, the upper substrate 21 and the lower substrate 22 are bonded together, and an opening OP21 of the pad 111, through which wire bonding to the pad 111 is performed, is further produced.

As described above, according to the semiconductor device 101, the pad 111 for wire bonding can be produced more simply by building the pad 111 at the same time as the contacts 112 produced with the same material (metal) as the pad 111, without going through a special wiring process. As a result, the semiconductor device 101 can be manufactured in fewer steps.

Fourth Embodiment

<Description of a Semiconductor Device Manufacturing Process>

Note that, although the example in which the pad for wire bonding and probing is produced in the step of producing the upper substrate 21 before bonding the upper substrate 21 and the lower substrate 22 has been described above, the pad may be formed after the bonding of the upper substrate 21 and the lower substrate 22.

A semiconductor device manufacturing process when a pad is formed after bonding of an upper substrate 21 and a lower substrate 22 will be described below with reference to FIGS. 12 and 13. Note that the same reference numbers are given to elements in FIGS. 12 and 13 that correspond to those in FIG. 3, and description thereof is appropriately omitted.

Figure 12:
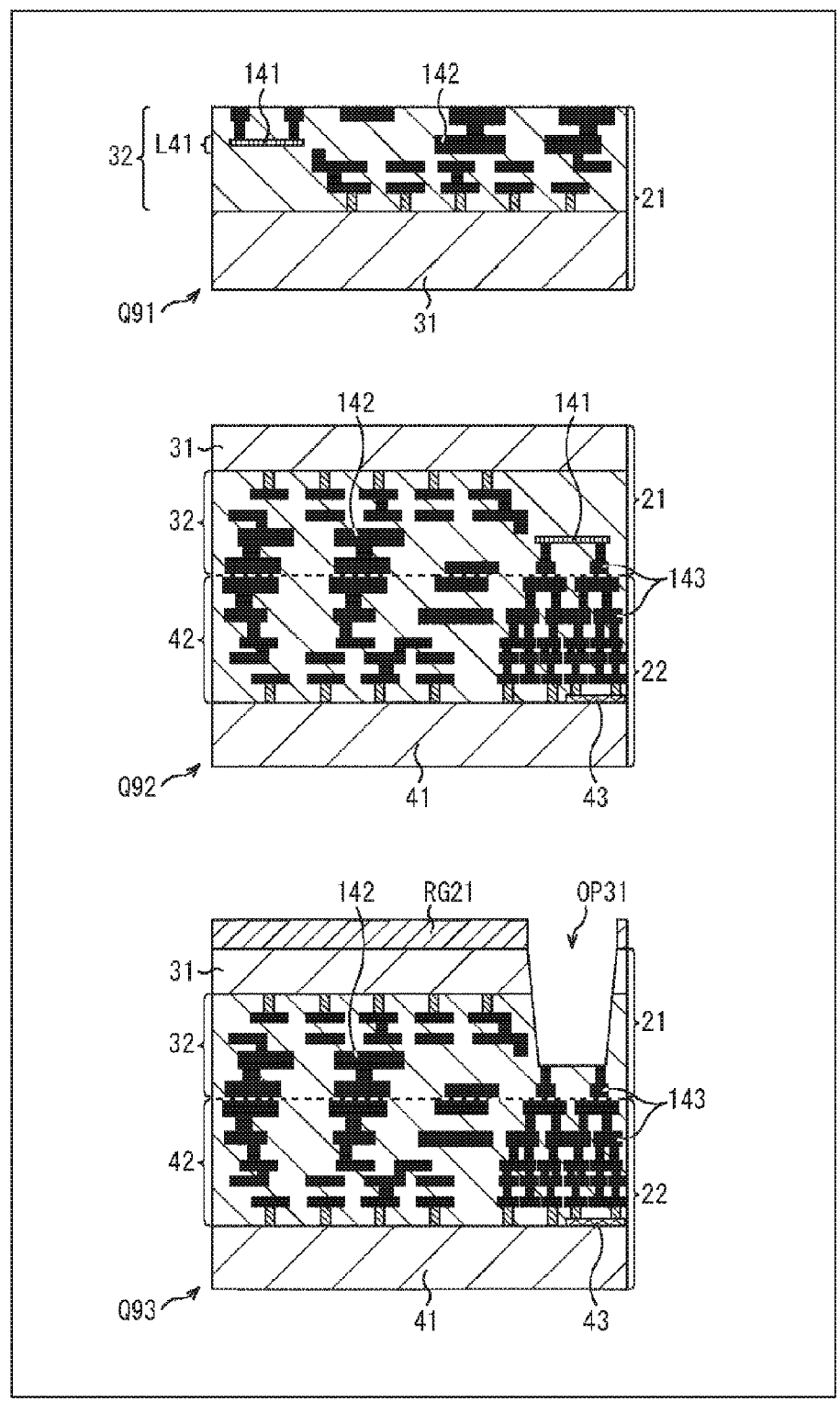
FIG. 12 is a diagram describing manufacturing steps of the semiconductor device.
Figure 13:
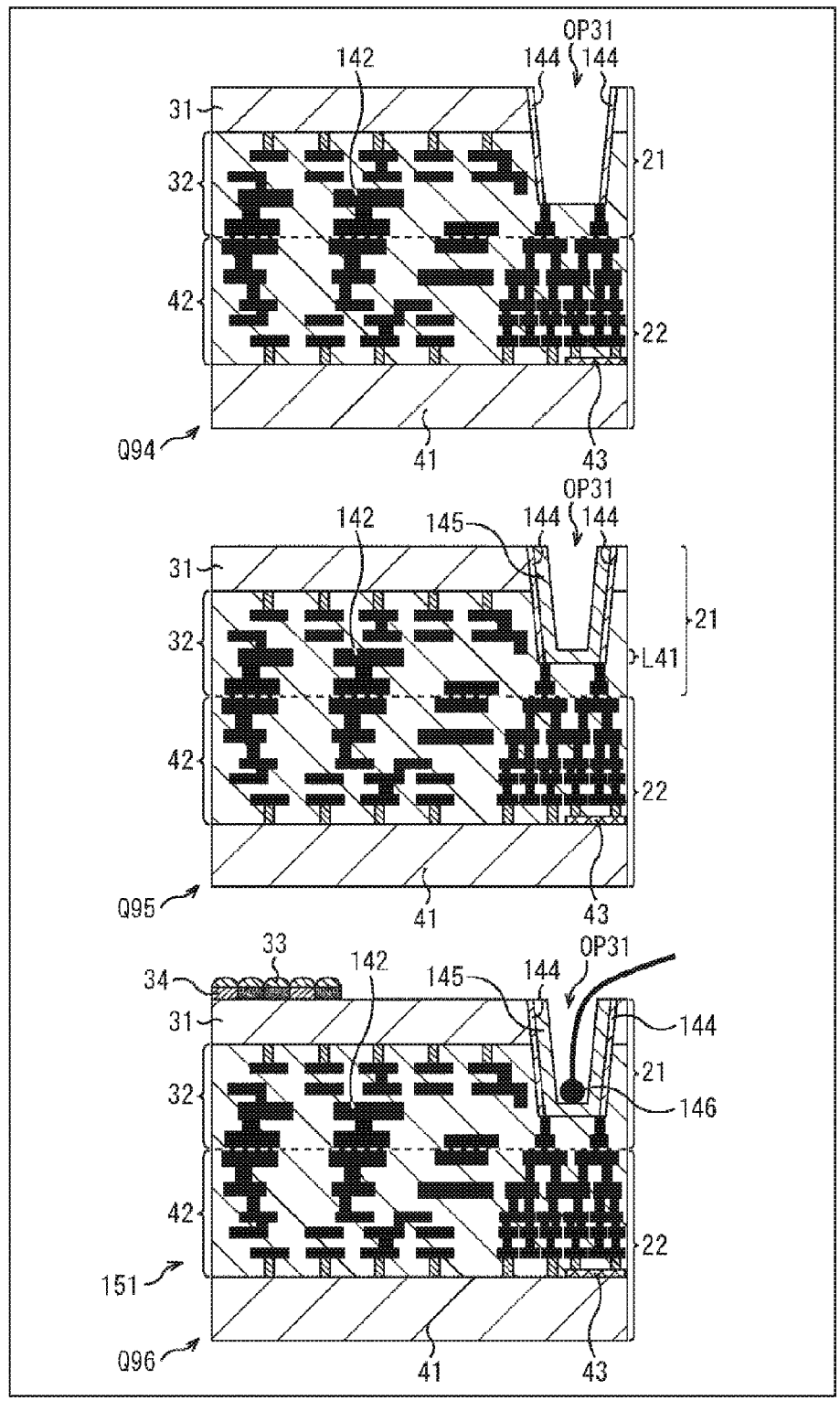
FIG. 13 is a diagram describing manufacturing steps of the semiconductor device.

The examples shown in FIGS. 12 and 13 are an example of a process of forming a pad for wire bonding after bonding of the upper substrate 21 and a lower substrate 22 and an example of forming the pad for wire bonding before formation of on-chip lenses 33 and color filters 34.

First, a wiring layer 32 is formed on a Si substrate 31 which constitutes the upper substrate 21 as indicated by the arrow Q91 of FIG. 12. At this time, a stopper layer 141 for a pad opening formation process is formed along with Cu wiring in a wiring layer L41 of the wiring layer 32 constituted by a plurality of wiring layers. For example, Cu wiring 142 is formed in the wiring layer L41.

In addition, Cu pads (wiring) are formed in layers on the upper side of the wiring layer L41 of the wiring layer 32 in the drawing, i.e., respective wiring layers positioned on the bonding surface side, to protect a metal pad formed in the stopper layer 141 portion. Here, the Cu pads for protecting the metal pad are set to pads in, for example, the shapes shown in FIG. 2, and are formed in each of the wiring layers between the stopper layer 141 and the bonding surface to the lower substrate 22.

In addition, when the upper substrate 21 is produced, the lower substrate 22 is also produced in the same manner. Then, the upper substrate 21 and the lower substrate 22 face and are bonded to each other as indicated by the arrow Q92. Specifically, the wiring layer 32 constituting the upper substrate 21 and a wiring layer 42 constituting the lower substrate 22 are disposed to face each other, the Cu portions thereof facing each other are bonded together, and insulating film portions thereof facing each other are bonded together.

After the upper substrate 21 and the lower substrate 22 are bonded together, the Si substrate 31 is thinned.

In the example indicated by the arrow Q92, an insulating film 43 is provided in a part of the portion of the lower substrate 22 in which the wiring layer 42 comes into contact with the Si substrate 41. In addition, pads that are formed of Cu to protect the pad for wire bonding are provided in each layer between the stopper layer 141 and the insulating film 43 of the wiring layer 32 and the wiring layer 42, and the pads are insulated from the Si substrate 41 by the insulating film 43. In other words, a pad group 143 constituted by a plurality of Cu pads for protecting the metal pad formed in the stopper layer 141 is provided between the stopper layer 141 and the insulating film 43.

Shapes of the Cu pads provided between the stopper layer 141 and the insulating film 43 are set to, for example, the shapes of the pads described with reference to FIG. 2. In particular, shapes of the Cu pads on the bonding surface of the upper substrate 21 and the lower substrate 22 are set to the shapes of the pad CPD31 indicated by the arrow Q22, the pad CPD32 indicated by the arrow Q23, the pad CPD33 indicated by the arrow Q24 of FIG. 2, and the like.

By providing the Cu pads on the lower side of the pad for wire bonding as described above, the simple configuration improves crack resistance.

In addition, with such a configuration, a metal pad for wire bonding or probing can be provided on the upper substrate 21. As a result, a depth from the Si substrate 31 to the metal pad can be set to be shallow, pad opening formation time can be reduced, and occurrence of defects in wire bonding or contact of a pin can be suppressed.

Furthermore, by providing the Cu pads as above, the upper substrate 21 and the lower substrate 22 are electrically connected by the Cu pads.

After the Si substrate 31 is thinned, a resist RG21 is formed on a surface of the Si substrate 31 of the upper substrate 21 and a portion of the pad for wire bonding is opened using lithography, dry machining, and the like as indicated by the arrow Q93. Accordingly, a partial region of the Si substrate 31, an insulating film, and the stopper layer 141 are removed, and thereby an opening OP31 is formed. This opening OP31 is a connection hole (via) for the pad for wire bonding.

Then, after an insulating film is formed in the opening OP31 portion of the upper substrate 21, the insulating film in the surface of the Si substrate 31 and on the bottom of the opening OP31 is removed using etchback or the like as indicated by the arrow Q94 of FIG. 13. As a result, insulating films 144 are provided only on the sidewall portion of the opening OP31.

Furthermore, an Al film is formed in the opening OP31 as indicated by the arrow Q95, the Al film is polished using CMP or the like, and thereby a pad 145 for wire bonding is formed.

The pad 145 can be simply produced by producing the pad 145 after bonding of the upper substrate 21 and the lower substrate 22 even though the Al pad 145, the Cu wiring 142, and the like whose materials are different are mixed in the wiring layer L41.

After the pad 145 is produced, the on-chip lenses 33 and the color filters 34 are formed on the upper substrate 21, and thereby a semiconductor device 151 having the upper substrate 21 and the lower substrate 22 is formed as indicated by the arrow Q96. Then, a ball 146 is placed at the bottom of the pad 145 to perform wire bonding.

By producing the stopper layer 141 in the upper substrate 21, and then removing the stopper layer 141 after bonding of the upper substrate 21 and the lower substrate 22 and producing the pad 145, a receptacle of the pad for wire bonding can be produced in a given wiring layer such as a first wiring layer that is in the upper substrate 21.

Fifth Embodiment

<Description of a Semiconductor Device Manufacturing Process>

In addition, a pad for wire bonding may be formed such that, before the upper substrate 21 and the lower substrate 22 are bonded together, a through-via (through-silicon via or TSV), i.e., a structure that will serve as a contact, is formed and the through-via (contact) is cut out after the bonding. In that case, the pad for wire bonding can be formed with no need to drill a deep hole during a hard process performed after bonding of the substrates.

A semiconductor device manufacturing process when a structure that will serve as a through-via is to be formed before bonding of an upper substrate 21 and a lower substrate 22 will be described below with reference to FIGS. 14 to 16. Note that the same reference numerals are given to elements in FIGS. 14 to 16 that correspond to those in FIG. 3, and description thereof is appropriately omitted.

Figure 14:
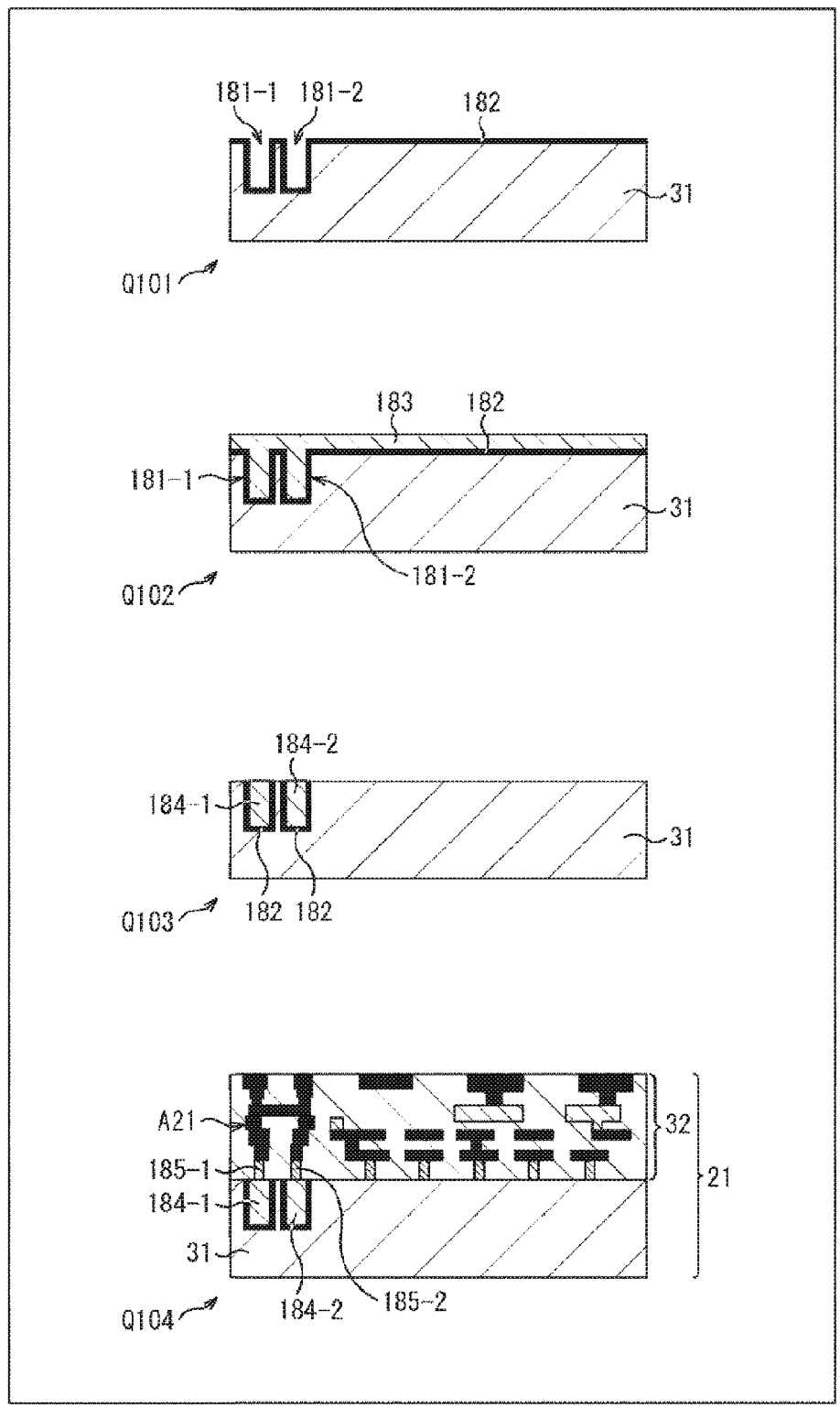
FIG. 14 is a diagram describing manufacturing steps of the semiconductor device.

First, a connection hole 181-1 and a connection hole 181-2 serving as through-vias are formed on a Si substrate 31, and an insulating film 182 is formed on the surface of the connection hole 181-1 and the connection hole 181-2 and the surface of the Si substrate 31 as indicated by the arrow Q101 of FIG. 14.

Note that the connection hole 181-1 and the connection hole 181-2 will also be referred to simply as connection holes 181 when there is no particular need to distinguish the connection holes. In the state indicated by the arrow Q101, the connection holes 181 have not penetrated the Si substrate 31 yet.

Next, an Al film 183 is formed above the Si substrate 31 as indicated by the arrow Q102. Accordingly, the connection holes 181 are filled with Al.

Further, the Al film 183 formed above the surface of the Si substrate 31 is removed using CMP or the like until the insulating film 182 on the surface of the Si substrate 31 is removed, as indicated by the arrow Q103. As a result, a via 184-1 formed of Al that fills the connection hole 181-1 and a via 184-2 formed of Al that fills the connection hole 181-2 are obtained.

Note that the via 184-1 and the via 184-2 will also be referred to simply as vias 184 below when there is no particular need to distinguish the vias. In addition, although the vias 184 are described as being formed of Al (aluminum) here, they also can be formed of any conductive material such as polysilicon, tungsten, copper (Cu), titanium, tantalum, or ruthenium.

After the vias 184 are formed in the Si substrate 31 as described above, a general process is performed.

That is, a transistor is formed inside the Si substrate 31 or a wiring layer 32 is laminated on the Si substrate 31 to form the upper substrate 21, as indicated by the arrow Q104.

At this moment, contact of Al filling the connection holes 181, i.e., the vias 184, and the wiring layer 32 is avoided by any means.

In this example, Cu pads for protecting a pad for wire bonding are formed in each layer of the wiring layer 32 as indicated by the arrow A21, and the Cu pads and the vias 184 are electrically connected by a contact 185-1 and a contact 185-2 formed in the wiring layer 32.

Specifically, the Cu pads and the via 184-1 are electrically connected by the contact 185-1, and the Cu pads and the via 184-2 are electrically connected by the contact 185-2. Note that the contact 185-1 and the contact 185-2 will also be referred to simply as contacts 185 when there is no particular need to distinguish the contacts.

In addition, when the upper substrate 21 is produced, the lower substrate 22 is produced in the same manner. Then, the upper substrate 21 and the lower substrate 22 are bonded to face each other as indicated by the arrow Q105 of FIG. 15.

Figure 15:
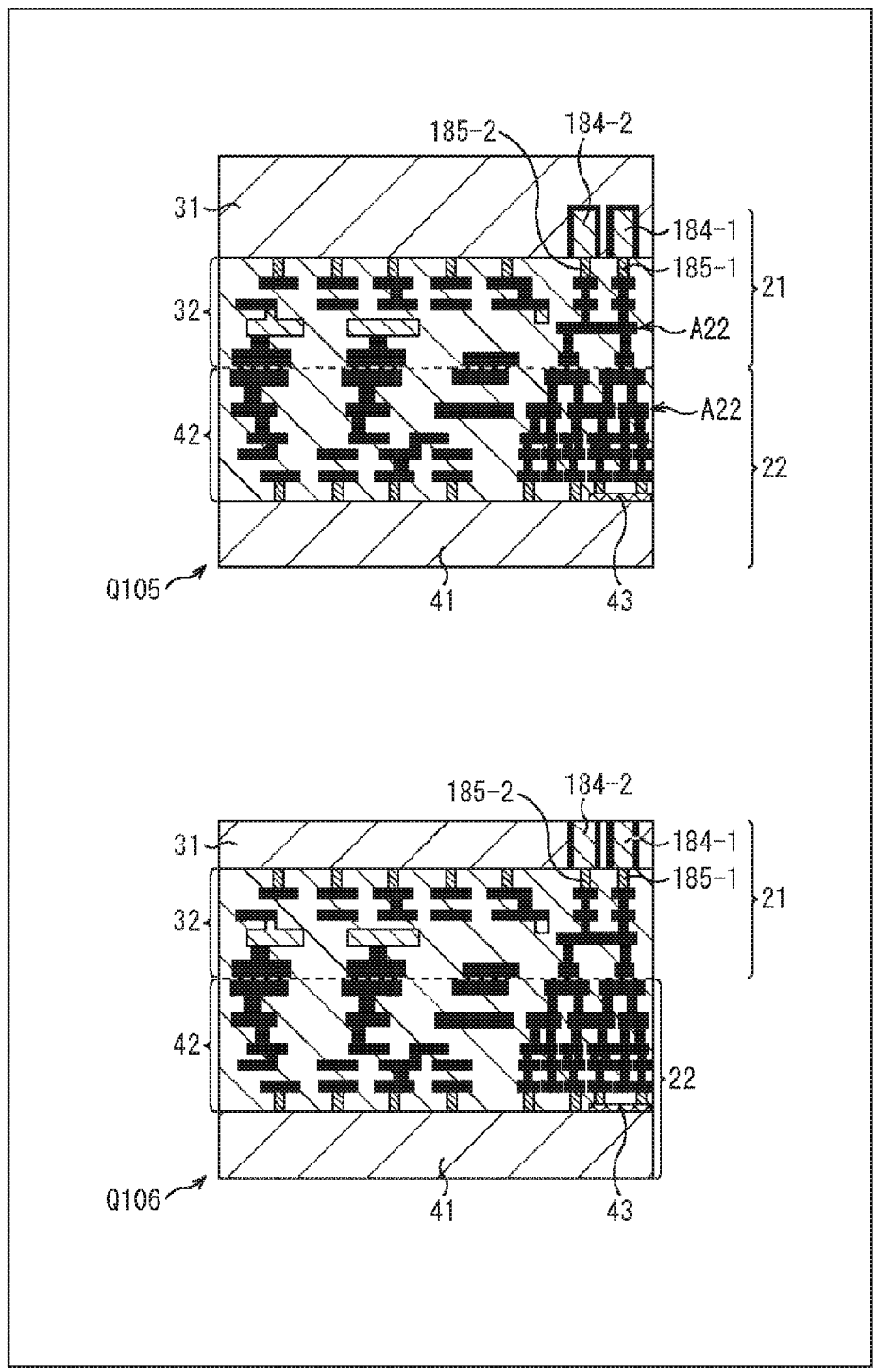
FIG. 15 is a diagram describing manufacturing steps of the semiconductor device.

In the example indicated by the arrow Q105 of FIG. 15, an insulating film 43 is provided in a part of the portion in which the wiring layer 42 comes into contact with the Si substrate 41 in the lower substrate 22. In addition, pads that are formed of Cu as indicated by the arrow A22 to protect the pad for wire bonding, more specifically, the vias 184 connected to the pad are provided in each layer between the contacts 185 and the insulating film 43 in the wiring layer 32 and the wiring layer 42. In addition, the Cu pads are insulated from the Si substrate 41 by the insulating film 43.

Shapes of the Cu pads provided between the contacts 185 and the insulating film 43 are set to, for example, the shapes of the pads described with reference to FIG. 2. In particular, shapes of the Cu pads on the bonding surface of the upper substrate 21 and the lower substrate 22 are set to the shapes of the pad CPD31 indicated by the arrow Q22, the pad CPD32 indicated by the arrow Q23, the pad CPD33 indicated by the arrow Q24 of FIG. 2, and the like.

By providing the Cu pads on the lower side of the pad for wire bonding as described above, the simple configuration improves crack resistance.

Furthermore, with the above-described configuration, the metal pad for wire bonding or probing can be provided in the upper substrate 21. As a result, occurrence of defects in wire bonding and contact of a pin can be suppressed.

Furthermore, by providing the Cu pads as above, the upper substrate 21 and the lower substrate 22 can be electrically connected by the Cu pads. In addition, a shape of the contacts 185 can also be one for protecting the vias 184, i.e., any of the shapes of the pads described with reference to FIG. 2.

After the upper substrate 21 and the lower substrate 22 are bonded, the thickness of the Si substrate 31 is thinned as indicated by the arrow Q106. When the surface of the Si substrate 31 is shaved off through the thinning process of the Si substrate 31, the vias 184 appear in the surface of the Si substrate 31. That is, the vias 184 penetrate the Si substrate 31.

Figure 16:
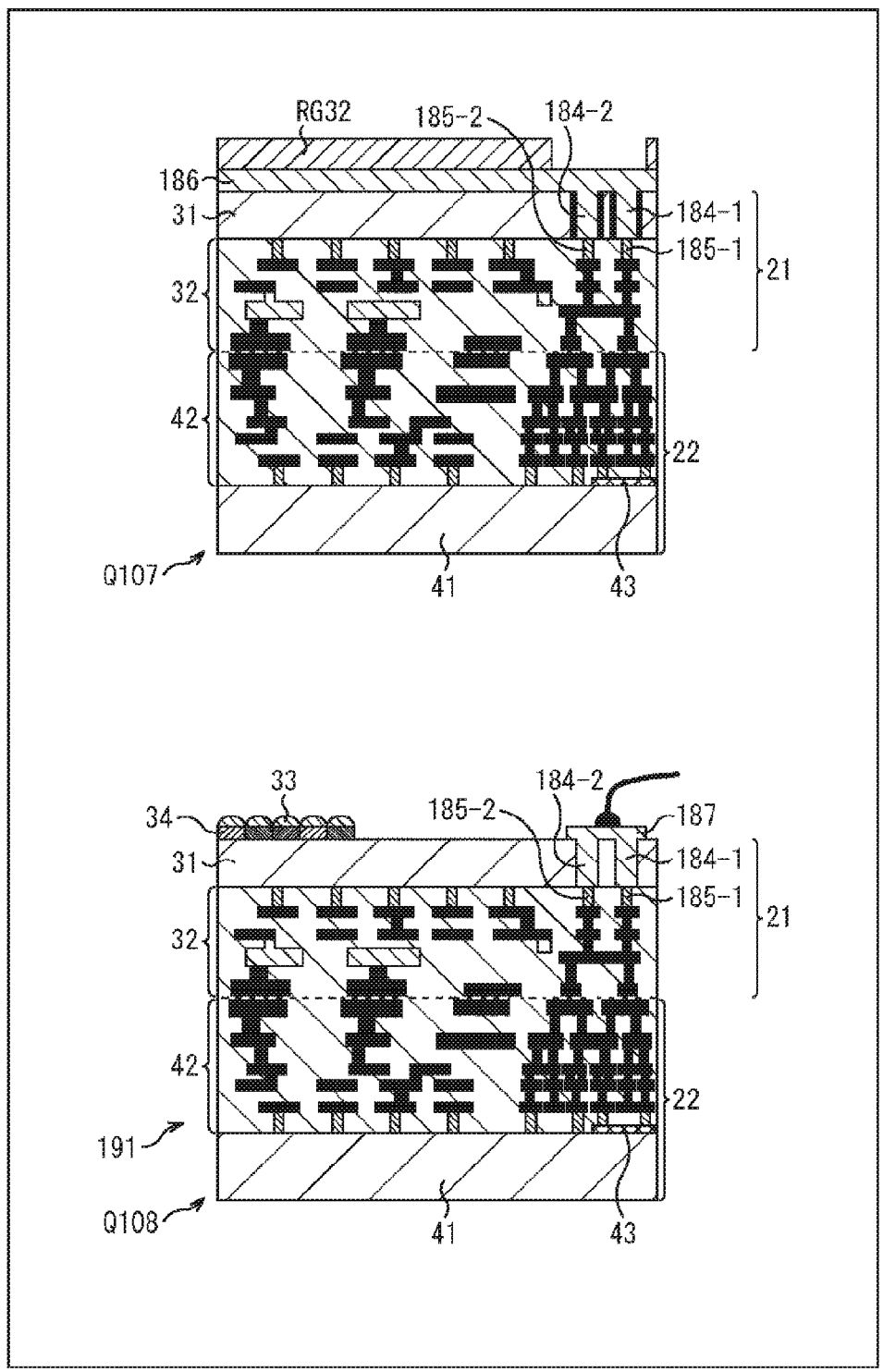
FIG. 16 is a diagram describing manufacturing steps of the semiconductor device.

Further, an Al film 186 is formed on the Si substrate 31, a resist RG32 is formed on the film 186, and then a pad is formed through lithography, dry machining, and the like, as indicated by the arrow Q107 of FIG. 16.

Accordingly, the pad 187 for wire bonding is formed on the via 184-1 and the via 184-2 in the surface of the Si substrate 31 as indicated by the arrow Q108. In addition, the on-chip lenses 33 and the color filters 34 are formed on the Si substrate 31, and thereby a semiconductor device 191 having the upper substrate 21 and the lower substrate 22 is formed. Then, a ball is placed on the pad 187 to perform wire bonding.

By producing the vias 184 (contacts) that electrically connect the pad 187 for wire bonding and the wiring layer 32 on the Si substrate 31 constituting the upper substrate 21 as described above, the pad 187 can be simply formed.

Sixth Embodiment

<Description of a Semiconductor Device Manufacturing Method>

In a semiconductor device, a metal pad formed of Al or the like as described above and Cu wiring can also be provided in the same layer. In such a case, for example, the Al pad is produced while the Cu wiring is produced. A manufacturing method of the metal pad is described in JP 2012-15278A.

In the method described in JP 2012-15278A, however, metal pads formed of Al or the like are placed in the same layer as Cu wiring, and thus it is necessary for these pads and the Cu wiring to be provided at the same height. In other words, it is necessary for the metal pads formed of Al or the like and the Cu wiring to have the same thickness.

For example, if the height of the Al pads is aligned with the height of the Cu wiring, the thickness of the Al pads can be insufficient, and the pad may break during wire bonding, or alloying of Al and Au may become dissatisfactory, which may cause connection to be poor.

On the other hand, if Cu wiring is formed with a sufficient thickness in the Al pads, parasitic capacitance between wiring arrangements increases according to a rise in the height of the wiring, and thus a delay of signals occurs due to resistance and capacitance, which may result in defects in device operations.

In addition, in that method, processes are complex.

Therefore, a method for forming a metal pad of Al or the like having a sufficient thickness without causing defects in device operations is strongly desired. Thus, the present technology enables a metal pad of Al or the like having a sufficient thickness to be more simply produced using a metal mask without causing defects in device operations.

A semiconductor device manufacturing method to which the present technology is applied will be described below with reference to FIG. 17. Note that the same reference numerals are given to elements in FIG. 17 that correspond to those in FIG. 3, and description thereof is appropriately omitted. In addition, description continues on the assumption that a pad for wire bonding is produced as a metal pad in this semiconductor device.

First, an upper substrate 21 and a lower substrate 22 are produced and the upper substrate 21 and the lower substrate 22 are bonded to face each other as indicated by the arrow Q111. Specifically, the wiring layer 32 constituting the upper substrate 21 and the wiring layer 42 constituting the lower substrate 22 are disposed to face each other, the Cu parts facing each other are bonded together, and the insulating film parts facing each other are bonded together.

Here, the upper substrate 21 is constituted by a Si substrate 31 and the wiring layer 32 constituted by a plurality of wiring layers. In addition, the wiring layer 32 has a wiring layer L51 in which contacts formed of tungsten (W) are provided, a wiring layer L52 in which Cu wiring is provided, and a wiring layer L53 in which Al wiring is provided.

The lower substrate 22 is constituted by a Si substrate 41 and a wiring layer 42. In this example, an insulating film 43 is provided in a part of the portion of the wiring layer 42 of the lower substrate 22 in which the layer comes into contact with the Si substrate 41. In addition, pads that are formed of Cu to protect a pad for bonding wiring are provided in each layer disposed between the portion in which the Al pad is provided and the insulating film 43 in the wiring layer 32 and the wiring layer 42, and the pads are insulated from the Si substrate 41 by the insulating film 43, as indicated by the arrow A31.

Shapes of the Cu pads provided between the portion in which the Al pad is provided and the insulating film 43 are set to, for example, the shapes of the pads described with reference to FIG. 2. In particular, shapes of the Cu pads on the bonding surface of the upper substrate 21 and the lower substrate 22 are set to the shapes of the pad CPD31 indicated by the arrow Q22, the pad CPD32 indicated by the arrow Q23, the pad CPD33 indicated by the arrow Q24 of FIG. 2, and the like.

By providing the Cu pads on the lower side of the pad for wire bonding as described above, the simple configuration improves crack resistance.

In addition, with such a configuration, a metal pad for wire bonding or probing can be provided on the upper substrate 21. As a result, a depth from the Si substrate 31 to the metal pad can be set to be shallow, pad opening formation time can be reduced, and occurrence of defects in wire bonding or contact of a pin can be suppressed.

Furthermore, by providing the Cu pads as above, the upper substrate 21 and the lower substrate 22 are electrically connected by the Cu pads.

After the upper substrate 21 and the lower substrate 22 are bonded together, a resist RG41 is formed on the surface of the Si substrate 31, and an opening OP41 is formed as a connection hole that reaches metals such as W, Cu, and Al positioned in lower layers of the Si substrate 31 while the resist RG41 is used as a mask. Then, the resist RG41 is removed from the Si substrate 31 as indicated by the arrow Q112.

Then, as indicated by the arrow Q113, a metal that includes titanium (Ti) or zirconium (Zr) that will serve as a barrier metal is formed to be a film only in a portion of the opening of the metal mask MM11 of the upper substrate 21, using the metal mask MM11. Further, an Al film is formed only in the opening of the metal mask MM11 of the upper substrate 21 using the metal mask MM11. Accordingly, an Al pad 221 for wire bonding is formed inside the opening OP41 in the portion of the wiring layer L51 and the wiring layer L52, and thereby a semiconductor device 231 constituted by the upper substrate 21 and the lower substrate 22 is formed.

Then, wire bonding is performed on the pad 221 produced as described above.

Here, it is preferable to use vapor deposition or PVD as a barrier metal or Al film formation method. In addition, since insulation defects occur when the Al pad 221 comes into contact with the Si substrate 31, it is necessary to make the opening of the metal mask MM1 sufficiently small so that the Si substrate 31 and the pad 221 do not come into contact with each other. In this example, the width of the opening of the metal mask MM1 in the horizontal direction is set to be sufficiently smaller than the width of the opening OP41 in the drawing.

In addition, the pad 221 is formed with a sufficient thickness to span the wiring layer L51 and the wiring layer L52. The pad 221 has, for example, a greater thickness in the vertical direction of the drawing than the Cu wiring layer provided in the wiring layer L52.

Furthermore, Cu pads for protecting each of the corners and sides of the pad 221 are provided between the pad 221 and the insulating film 43. In particular, some of the Cu pads are embedded in the pad 221.

Note that a layer that comes into contact with the pad 221 may be any layer of the wiring layer L51 in which contacts are provided, the wiring layer L52 in which the Cu wiring is provided, and the wiring layer L53 in which the Al wiring is provided. In addition, the pad 221 can be formed using a metal such as Co, Ni, Pd, Pt, or Au instead of Al, and Co, Ni, Pd, Pt, or Au can be used as a barrier metal.

As described above, by forming the pad 221 for wire bonding using the metal mask MM11, the pad having a sufficient thickness can be formed, and pad breakage resistance at the time of wire bonding can be dramatically improved.

In addition, since it is not necessary to perform the step of forming the Al pad 221 in the middle of the step of forming the Cu wiring, the pad 221 for wire bonding can be simply produced within the layers in which metal wiring formed of other materials such as Cu is provided in fewer steps. Accordingly, the thickness of the Al pad 221 can be set to differ from the thickness of the metal wiring such as Cu, and occurrence of defects in device operations can be prevented.

Seventh Embodiment

<Description of a Semiconductor Device Manufacturing Process>

In addition, in the sixth embodiment, the pad 221 formed of a metal such as Al is set not to come into contact with the Si substrate 31 by forming the opening of the metal mask MM11 to be small. When the opening OP41 that is a connection hole and the opening of the metal mask MM11 are not correctly aligned, however, there is concern of the Al pad 221 coming into contact with the Si substrate 31.

Thus, it is possible to form an insulating film in the opening OP41 once, and to remove the insulating film positioned only in the bottom of the Si substrate 31 and the opening OP41 using etchback, leaving the insulating film only on the side surface of the opening OP41, and thus if the pad 221 is produced thereafter, contact with the Si substrate 31 can be avoided.

A manufacturing method of a semiconductor device 231 when the pad 221 is produced as described above will be described below with reference to FIGS. 18 and 19. Note that the same reference numerals are given to elements in FIGS. 18 and 19 that correspond to those in FIG. 17, and description thereof is appropriately omitted.

Figure 17:
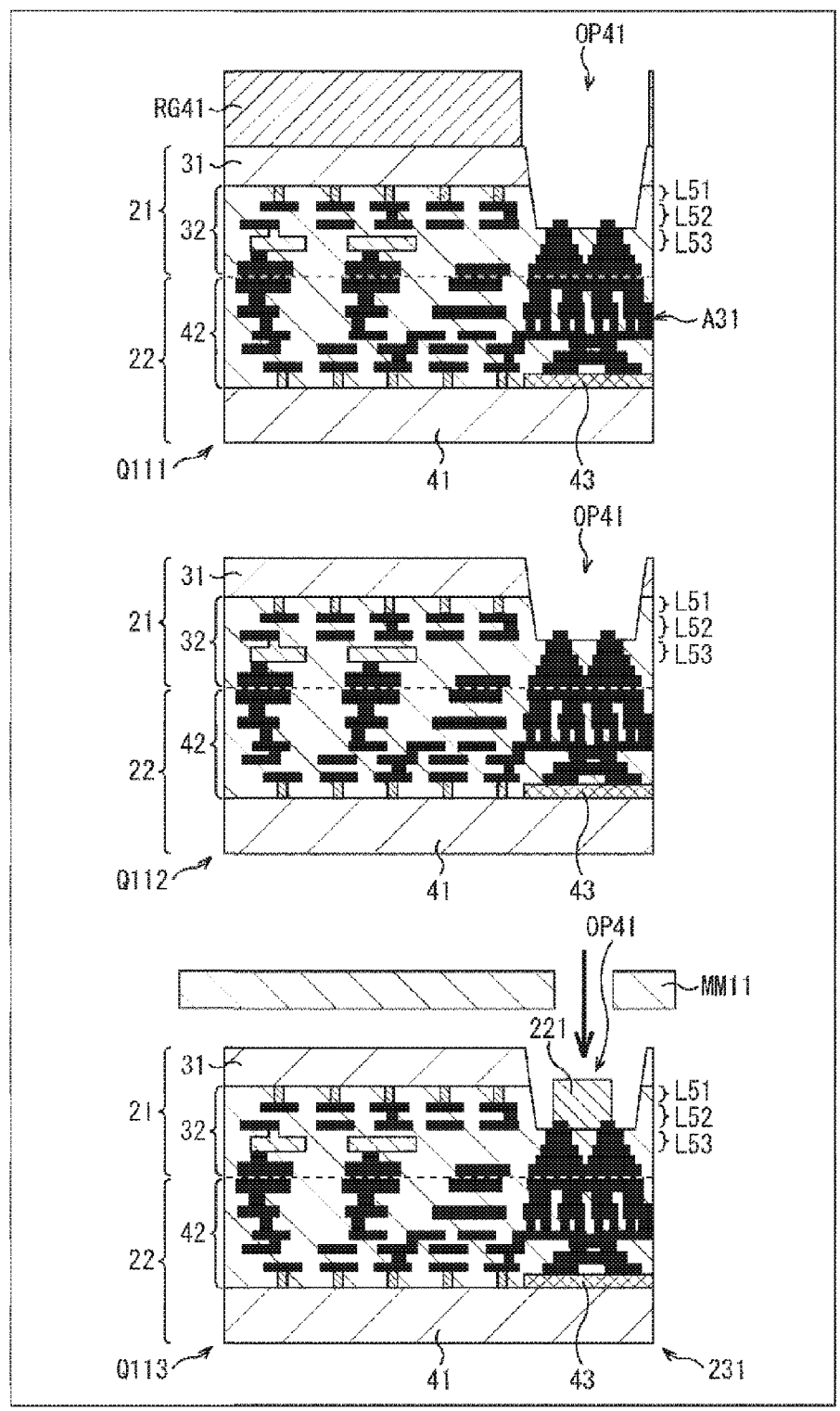
FIG. 17 is a diagram describing manufacturing steps of the semiconductor device.
Figure 18:
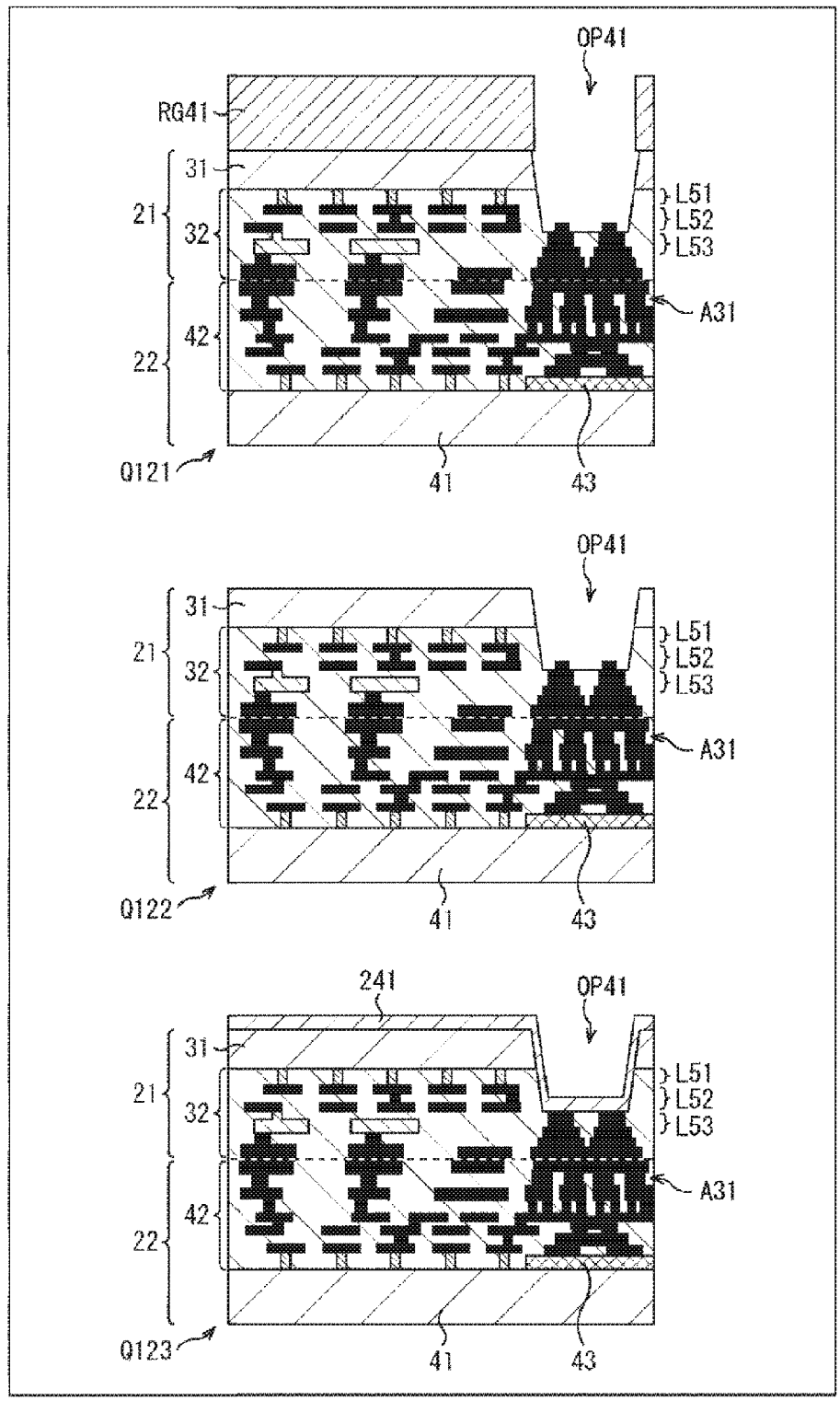
FIG. 18 is a diagram describing manufacturing steps of the semiconductor device.

First, an opening OP41 is formed in the upper substrate 21 through the steps indicated by the arrow Q121 and the arrow Q122 of FIG. 18. Note that since the steps indicated by the arrow Q121 and the arrow Q122 are the same as those indicated by the arrow Q111 and the arrow Q112 of FIG. 17, description thereof is omitted.

In addition, in the same manner as in the case of FIG. 17, pads that are formed of Cu for protecting a pad for wire bonding are provided in each layer between the portion in which the Al pad 221 is provided and an insulating film 43 in a wiring layer 32 and a wiring layer 42 as indicated by the arrow A31 in this example.

Next, an insulating film 241 is formed on the surfaces of the Si substrate 31 and the opening OP41 as indicated by the arrow Q123.

Figure 19:
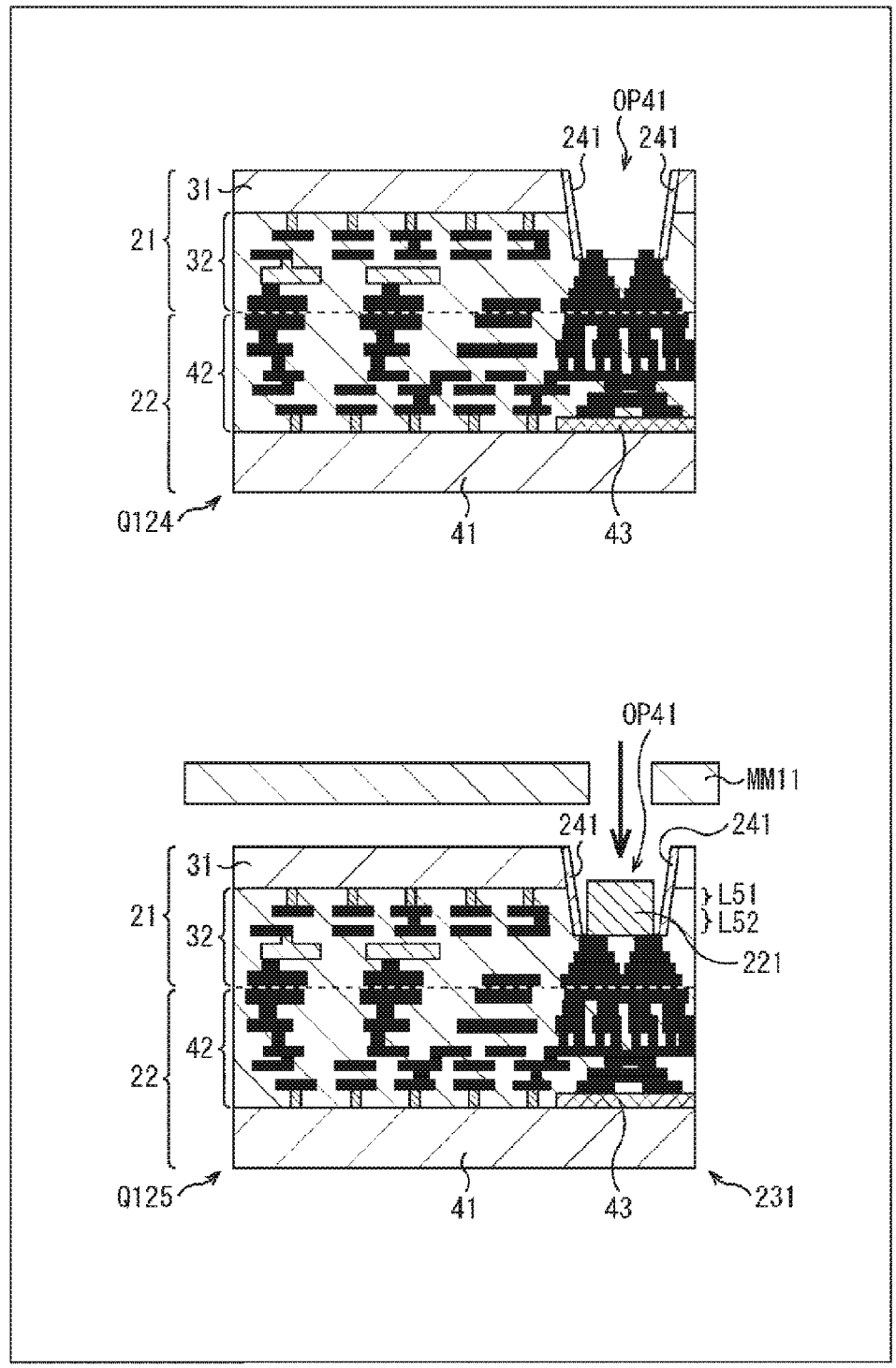
FIG. 19 is a diagram describing manufacturing steps of the semiconductor device.

Then, the insulating film 241 formed on the surface of the Si substrate 31 and the bottom portion of the opening OP41 is removed through etchback as indicated by the arrow Q124 of FIG. 19. Accordingly, the insulating film 241 is formed only in the side surface portions of the opening OP41.

Furthermore, an Al film is formed only in a portion of the upper substrate 21 which corresponds to an opening of a metal mask MM11, using the metal mask MM11 as indicated by the arrow Q125. Accordingly, an Al pad 221 for wire bonding is formed in the portion of a wiring layer L51 and a wiring layer L52 inside the opening OP41, and thereby the semiconductor device 231 constituted by the upper substrate 21 and the lower substrate 22 is formed. Then, wire bonding is performed on the pad 221 produced as above.

By producing the pad 221 in the state in which the insulating film 241 is formed on the side surface of the opening OP41, contact of the pad 221 with the Si substrate 31 can be avoided.

Note that, as a barrier metal, a metal at least including Ti or Zr can be used on the top face, the bottom face, or both faces of the Al pad 221.

In addition, the pad 221 can be formed of a metal such as Co, Ni, Pd. Pt, or Au instead of Al, and Co, Ni, Pd, Pt, or Au can be used as a barrier metal. Furthermore, although it is preferable to use $SiO_2$ as the insulating film 241, a film formed of SiN, SiOCH, or the like can be used.

By forming the insulating film 241 on the side surface of the opening OP41 and forming the pad 221 for wire bonding using the metal mask MM11 as described above, the pad having a sufficient thickness can be formed, and pad breakage resistance at the time of wire bonding can be dramatically improved. In addition, contact of the pad 221 with the Si substrate 31 can be avoided.

Furthermore, since it is not necessary to perform the step of forming the Al pad 221 in the middle of the step of forming the Cu wiring, the pad 221 for wire bonding can be simply produced within the layers in which metal wiring formed of other materials such as Cu is provided in fewer steps. Accordingly, the thickness of the Al pad 221 can be set to differ from the thickness of the metal wiring such as Cu, and occurrence of defects in device operations can be prevented.

Eighth Embodiment

<Configuration Example of a Semiconductor Device>

A decrease in the aspect ratio between a width and a depth of an opening of a pad and a low height resulting from slashing an Al wiring layer can be further realized by forming the pad for wire bonding in which Cu wiring is embedded in Al wiring. In such a case, a semiconductor device is configured as shown in, for example, FIG. 20. Note that the same reference numerals are given to elements in FIG. 20 that correspond to those in FIG. 3, and description thereof is appropriately omitted.

The semiconductor device 271 has an upper substrate 21 and a lower substrate 22 that are bonded together, and the dashed line between the upper substrate 21 and the lower substrate 22 in the drawing represents the bonding surface of the upper substrate 21 and the lower substrate 22.

The upper substrate 21 is constituted by a Si substrate 31 and a wiring layer 32, and on-chip lenses 33 and color filters 34 are provided on an upper side of the Si substrate 31 in the drawing. In addition, a pad 281 that is formed of Al for wire bonding is provided at the bottom of an opening OP51 in the upper substrate 21, and Cu wiring 282 is embedded in the pad 281.

Furthermore, the lower substrate 22 is constituted by a Si substrate 41 and a wiring layer 42, and an insulating film 43 is provided at a part of the portion of the wiring layer 42 in which the wiring layer comes into contact with the Si substrate 41.

Also in the semiconductor device 271, pads that are formed of Cu for protecting the pad 281 are provided in each layer between the pad 281 for wire bonding and the insulating film 43 in the wiring layer 32 and the wiring layer 42 as indicated by the arrow A41.

Specifically, Cu pads which are electrically connected to the Cu wiring 282 and protect the pad 281 are provided in the wiring layer below the pad 281 in the drawing. In addition, Cu pads for further protecting the Cu pads which protect the pad 111 are provided in at least the corner parts of the Cu pads positioned immediately thereabove in the wiring layer below the Cu pads in the drawing. In this manner, in each wiring layer between the pad 281 and the insulating film 43, pads for protecting pads located thereabove are provided in at least the corner parts of the pads. In other words, pads for protecting the pad 281 are laminated.

A shape of the Cu pads in each layer is set to, for example, the shapes of the pads described with reference to FIG. 2. In particular, a shape of the Cu pads on the bonding surface of the upper substrate 21 and the lower substrate 22 is set to the shape of the pad CPD31 indicated by the arrow Q22, the pad CPD32 indicated by the arrow Q23, the pad CPD33 indicated by the arrow Q24 of FIG. 2, or the like.

Crack resistance can be improved simply by providing the Cu pads on the lower side of the pad 281 in the drawing as described above. In addition, with such a configuration, a metal pad for wire bonding or probing can be provided on the upper substrate 21. As a result, a depth from the Si substrate 31 to the metal pad can be set to be shallow, pad opening formation time can be reduced, and occurrence of defects in wire bonding or contact of a pin can be suppressed.

In addition, the upper substrate 21 and the lower substrate 22 are electrically connected by the Cu pads protecting the pad 281 in the semiconductor device 271.

In the semiconductor device 271, the pad 281 is provided to span a wiring layer L61 and a wiring layer L62 as shown on the lower side of the drawing. Note that the drawing on the lower side is an enlarged drawing of the square region FA11 of the semiconductor device 271.

Vias which electrically connect upper and lower Cu wiring are provided in the wiring layer L61 in which the pad 281 is formed, and Cu wiring is provided in the wiring layer L62.

In addition, the Cu wiring 282 embedded in the Al pad 281 is disposed in the wiring layer L62 in which other Cu wiring is provided. By forming the pad 281 for wire bonding by embedding the Cu wiring 282 therein in this manner, it is not necessary to provide an Al wiring layer for providing the pad for wire bonding, and the semiconductor device 271 can be set to have a low height. Furthermore, since the pad 281 can be provided in a wiring layer close to the Si substrate 31, the aspect ratio between the width and the depth of the opening OP51 can be decreased.

Note that, although the Cu pad provided immediately below the pad 281 is not provided in the corner parts of the pad 281 in this example, the Cu pad immediately below the pad 281 is disposed in the corner part of the Cu wiring 282 that is immediately above the Cu pad, and thereby the Cu wiring 282 is protected. Thus, by laminating the pads for protecting the pad 281 to the insulating film 43 in this structure, crack resistance can be improved.

<Description of a Semiconductor Device Manufacturing Process>

Figure 20:
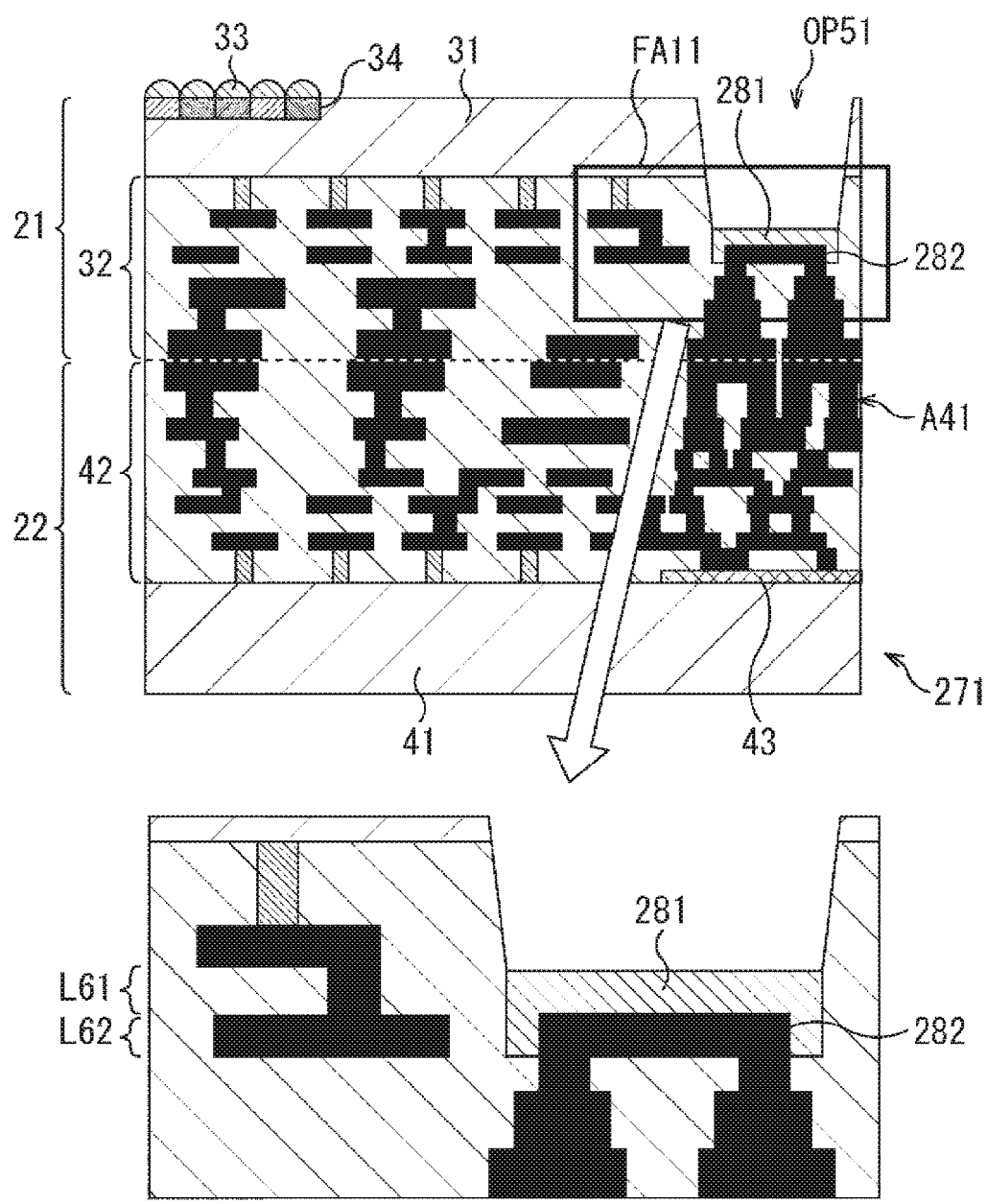
FIG. 20 is a diagram showing a configuration example of a semiconductor device.

Next, a manufacturing method of the semiconductor device 271, particularly the pad 281 portion, will be described with reference to FIGS. 21 and 22. Note that the same reference numerals are given to elements in FIGS. 21 and 22 that correspond to those in FIG. 20, and description thereof is appropriately omitted. In addition, the wiring structure of the semiconductor device 271 shown in FIG. 20 is simplified in FIGS. 21 and 22 so that the drawings are easier to understand.

Figure 21:
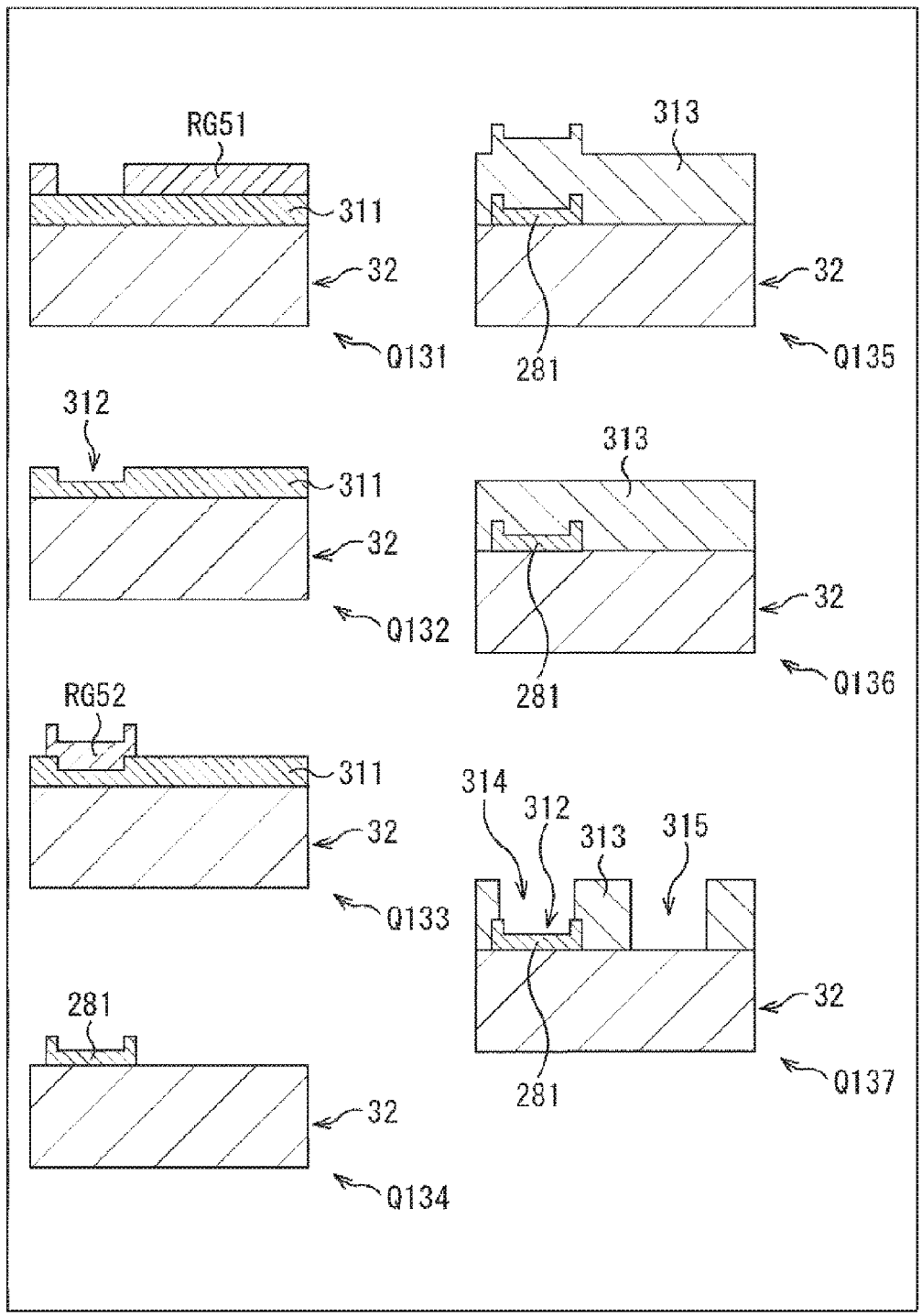
FIG. 21 is a diagram describing manufacturing steps of the semiconductor device.

First, an Al film 311 that is the pad material of a pad 281 for wire bonding is formed before Cu wiring is formed in a given wiring layer constituting a wiring layer 32 of an upper substrate 21, and a resist RG51 is formed on the surface of the Al film 311, as indicated by the arrow Q131 of FIG. 21.

Then, lithography and dry etching are performed, and thereby a groove 312 in which Cu wiring 282 is embedded is formed and the resist RG51 is removed as indicated by the arrow Q132.

Here, although a layer in which the pad 281 for wire bonding is to be formed may be any wiring layer as long as the layer is the same as that of Cu wiring, a lower wiring layer, i.e., a wiring layer close to the Si substrate 31 is preferable in terms of decreasing the aspect ratio between the width and the depth of the opening OP51 of the pad 281.

After the groove 312 is formed, the Al film 311 is processed through lithography and dry etching to set a layout necessary for a pad for wire bonding, and thereby the pad 281 is formed.

In other words, after a resist RG52 is coated on the entire surface of the Al film 311 and lithography is performed, a part of the resist RG52 is left as indicated by the arrow Q133. Then, the Al film 311 is processed in dry etching, and thereby the Al pad 281 is formed as indicated by the arrow Q134.

Further, an inter-layer insulating film 313 as a Cu wiring layer is formed over the pad 281 as indicated by the arrow Q135, and the inter-layer insulating film 313 is planarized through CMP until a degree of planarization necessary for laminating wiring layers is obtained as indicated by the arrow Q136.

Then, a groove 314 on the upper side of the Al pad 281 in the drawing which has the groove 312 in which the Cu wiring 282 is embedded and a groove 315 for Cu wiring formed in the same wiring layer are formed as indicated by the arrow Q137, and embedded Cu wiring is formed through a damascene method.

Figure 22:
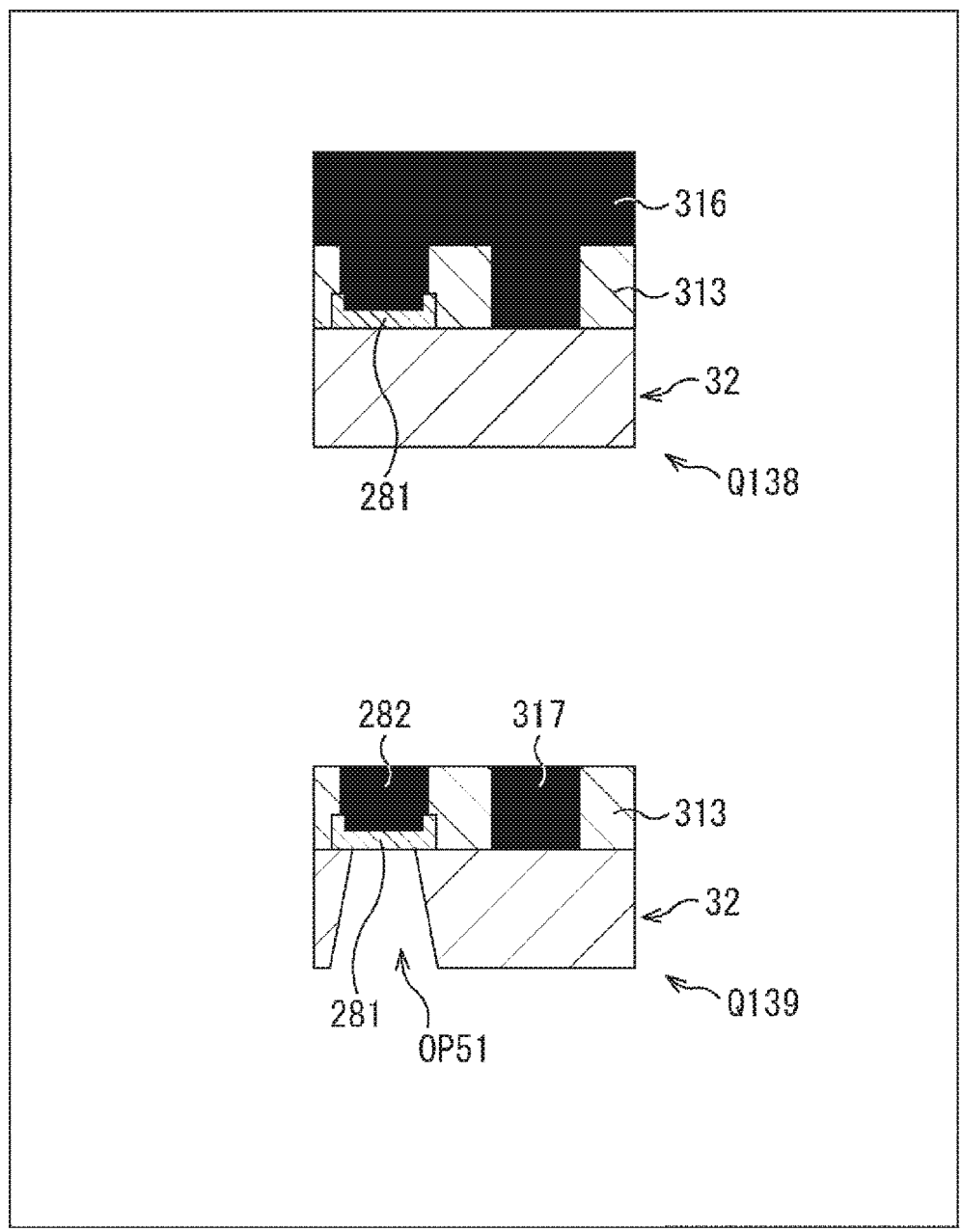
FIG. 22 is a diagram describing manufacturing steps of the semiconductor device.

In other words, a barrier metal and a Cu film 316 are formed in the groove 314 and the groove 315 as indicated by the arrow Q138 of FIG. 22, and then this film 316 is processed to form the Cu wiring 282 and the other Cu wiring 317 as indicated by the arrow Q139.

Then, wiring of the Cu pads for protecting the pad 281 is formed, and each wiring layer constituting the wiring layer 32 up to the bonding surface is produced. After the upper substrate 21 is obtained as described above, the lower substrate 22 is also produced while a Cu wiring structure for protecting the corners and sides of the pad 281 is produced. At this time, the Si substrate 41 of the lower substrate 22 is electrically separated from the Cu pads for protecting the pad 281 by the insulating film 43 to avoid electric contact.

Further, after the upper substrate 21 and the lower substrate 22 are bonded together, the opening OP51 is formed, or the on-chip lenses 33 and the color filters 34 are formed, and thereby the semiconductor device 271 is formed.

By producing the pad 281 in which the Cu wiring 282 is embedded as described above, a decrease in the aspect ratio of the opening of the pad 281 and a low height of the semiconductor device 271 are realized.

<Modified Example 1 of the Eighth Embodiment>
<Description of a Semiconductor Device Manufacturing Process>

In addition, although the configuration in which the Cu pads for protection that are provided close to the pad 281 are not provided in the corners or the sides of the pad 281 is assumed in the eighth embodiment, the pads for protection can be provided in the corners or sides of the pad 281.

Figure 23:
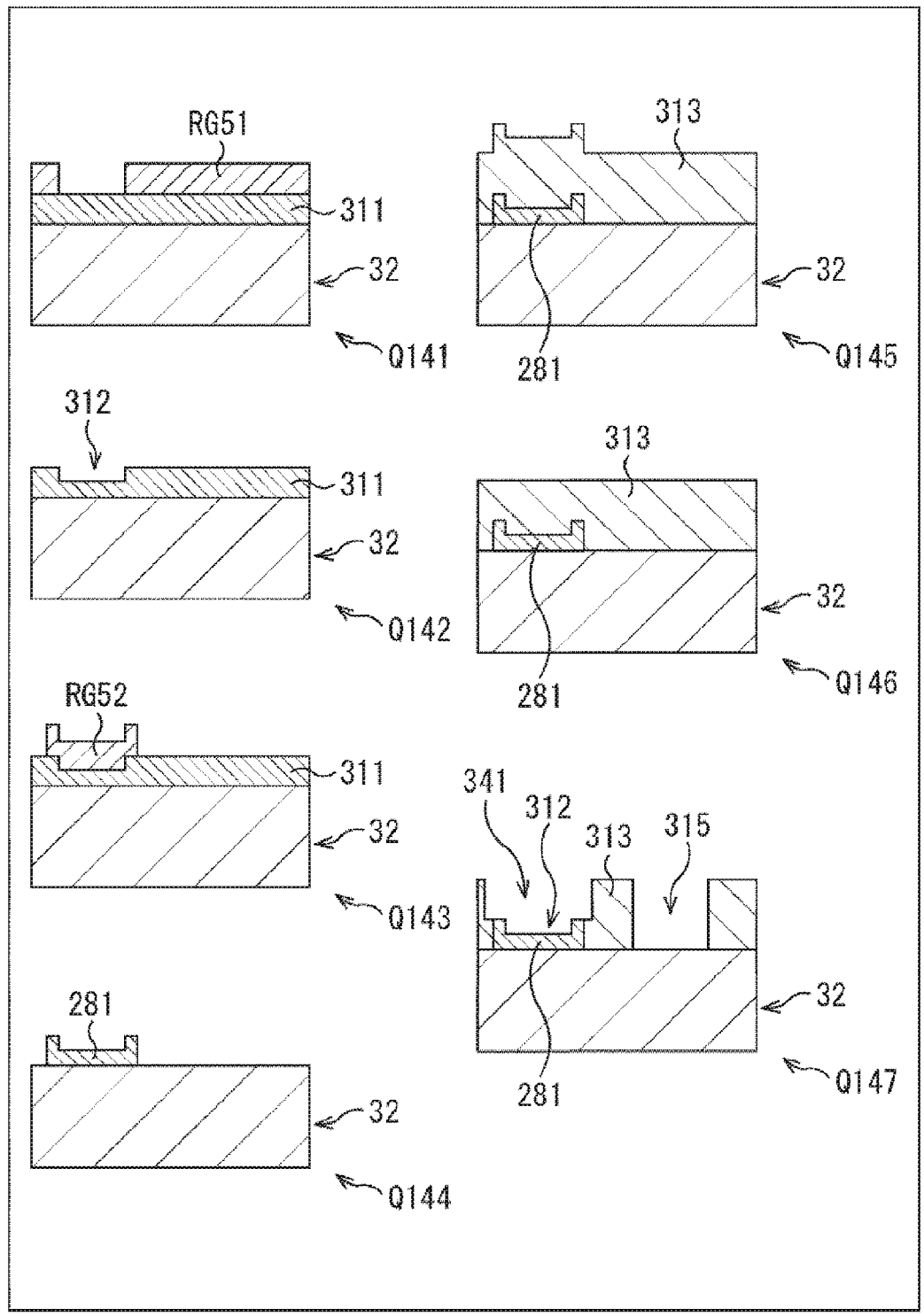
FIG. 23 is a diagram describing manufacturing steps of the semiconductor device.
Figure 24:
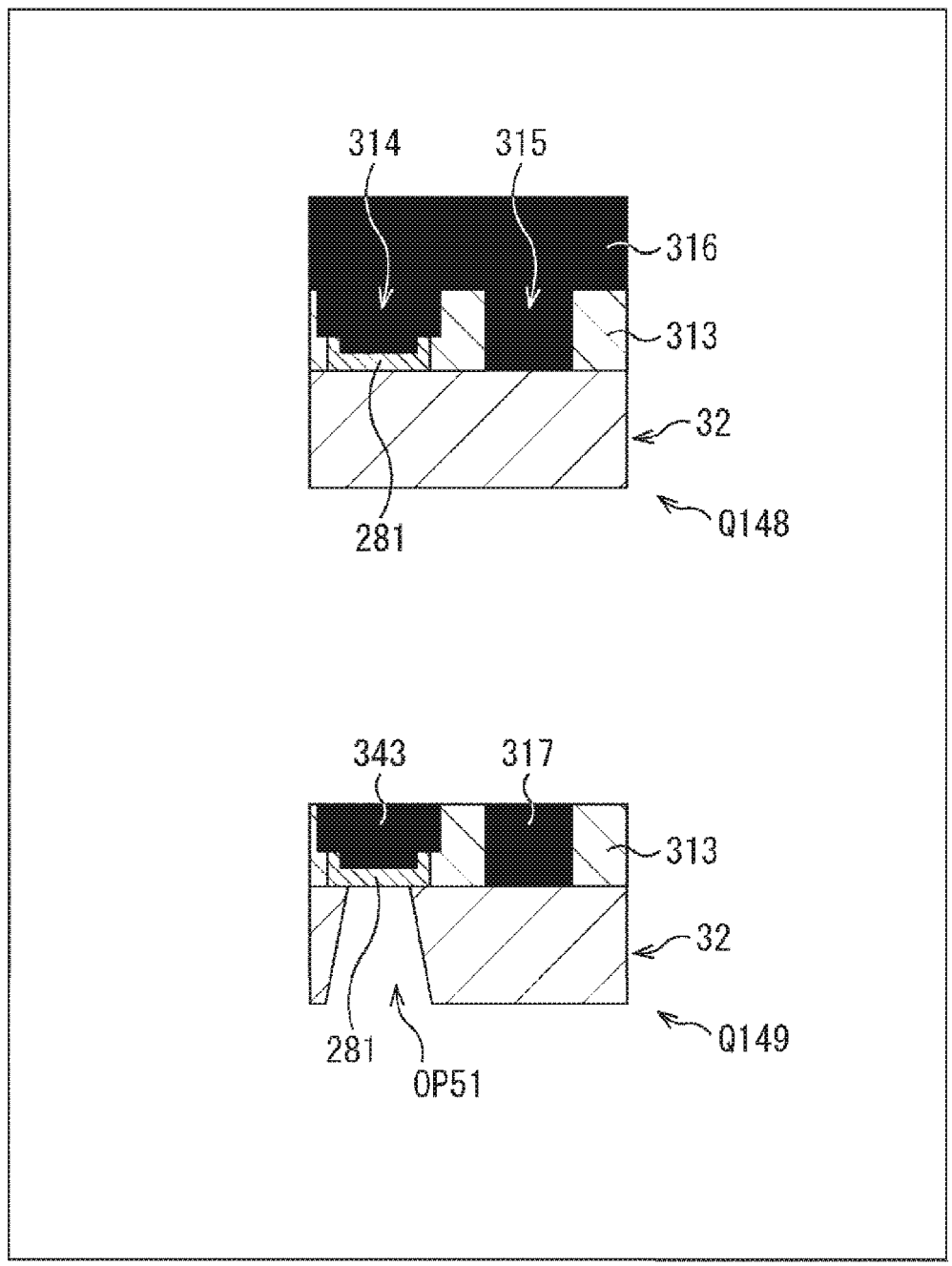
FIG. 24 is a diagram describing manufacturing steps of the semiconductor device.

In such a case, an upper substrate 21 is produced as shown in, for example, FIGS. 23 and 24. Note that the same reference numerals are given to elements in FIGS. 23 and 24 that correspond to those in FIGS. 21 and 22, and description thereof is appropriately omitted.

First, an Al film 311 that is the pad material is formed and processed and a pad 281 is formed as indicated by the arrow Q141 to the arrow Q144 of FIG. 23. Then, an inter-layer insulating film 313 is formed and planarized as indicated by the arrow Q145 and the arrow Q146. Note that, since the steps indicated by the arrow Q141 to the arrow Q146 are the same as those indicated by the arrow Q131 to the arrow Q136 of FIG. 21, description thereof is omitted.

Then, a groove 341 on the upper side of the Al pad 281 in the drawing which has the groove 312 in which the Cu wiring is embedded and a groove 315 for Cu wiring formed in the same wiring layer are formed as indicated by the arrow Q147, and embedded Cu wiring is formed through a damascene method.

In other words, a barrier metal and a Cu film 316 are formed in the groove 341 and the groove 315 as indicated by the arrow Q148 of FIG. 24, and then this film 316 is processed to form the Cu wiring 343 and the other Cu wiring 317 as indicated by the arrow Q149.

Here, in the steps indicated by the arrow Q147 of FIG. 23 to the arrow Q149 of FIG. 24, only the shape of a groove 341, i.e., the shape of Cu wiring 343, is different from that in steps indicated by the arrow Q137 of FIG. 21 to the arrow Q139 of FIG. 22, and other points are the same.

A part of the Cu wiring 343 obtained from the manufacturing process described with reference to FIGS. 23 and 24 is embedded in the pad 281 for wire bonding, and the entire surface of the pad 281 on the Cu wiring 343 side is in contact with the Cu wiring 343. That is to say, the portion of the Cu wiring 343 that is not embedded in the pad 281 functions as a Cu pad for protecting the pad 281 provided in a wiring layer of the pad 281 adjacent to the lower substrate 22 side.

Therefore, when wire bonding or probing is performed on the pad 281, a portion of the pad 281 on which a load is concentrated, i.e., the corners or sides of the pad 281, is reinforced (protected) by the Cu wiring 343, and thus cracking can be suppressed.

<Modified Example 2 of the Eighth Embodiment>
<Description of a Semiconductor Device Manufacturing Process>

In the modified example 1 of the eighth embodiment, the entire pad 281 including the corners or sides of the pad 281 is assumed to have a shape to be protected by the Cu wiring 343. In addition to that, by appropriately providing a portion that does not contain Cu at the center portion of the Cu wiring (pad for protection) for protecting the pad 281, occurrence of dishing caused by Cu damascene (CMP) can be suppressed even when the area of the pad is large.

Figure 25:
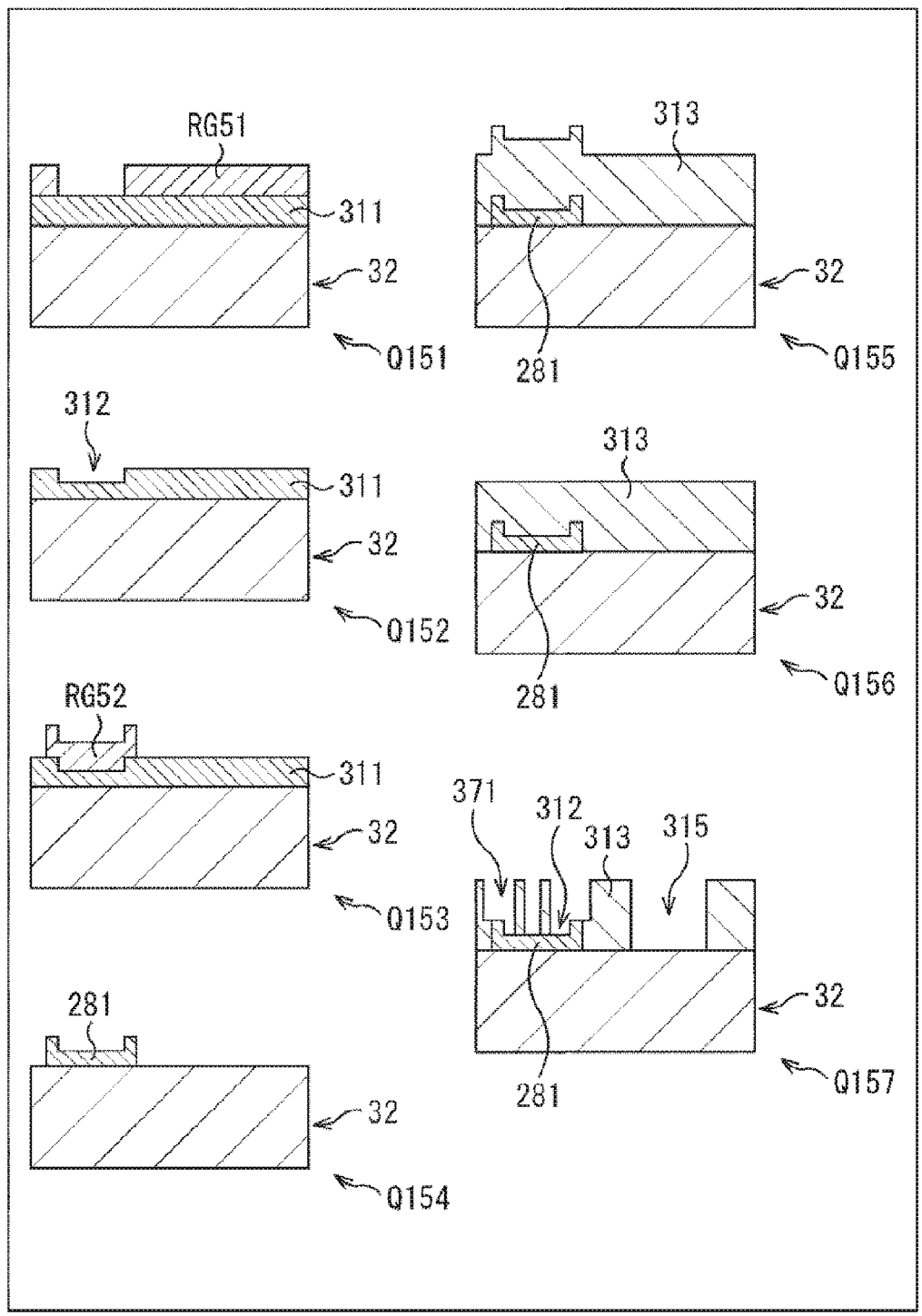
FIG. 25 is a diagram describing manufacturing steps of the semiconductor device.
Figure 26:
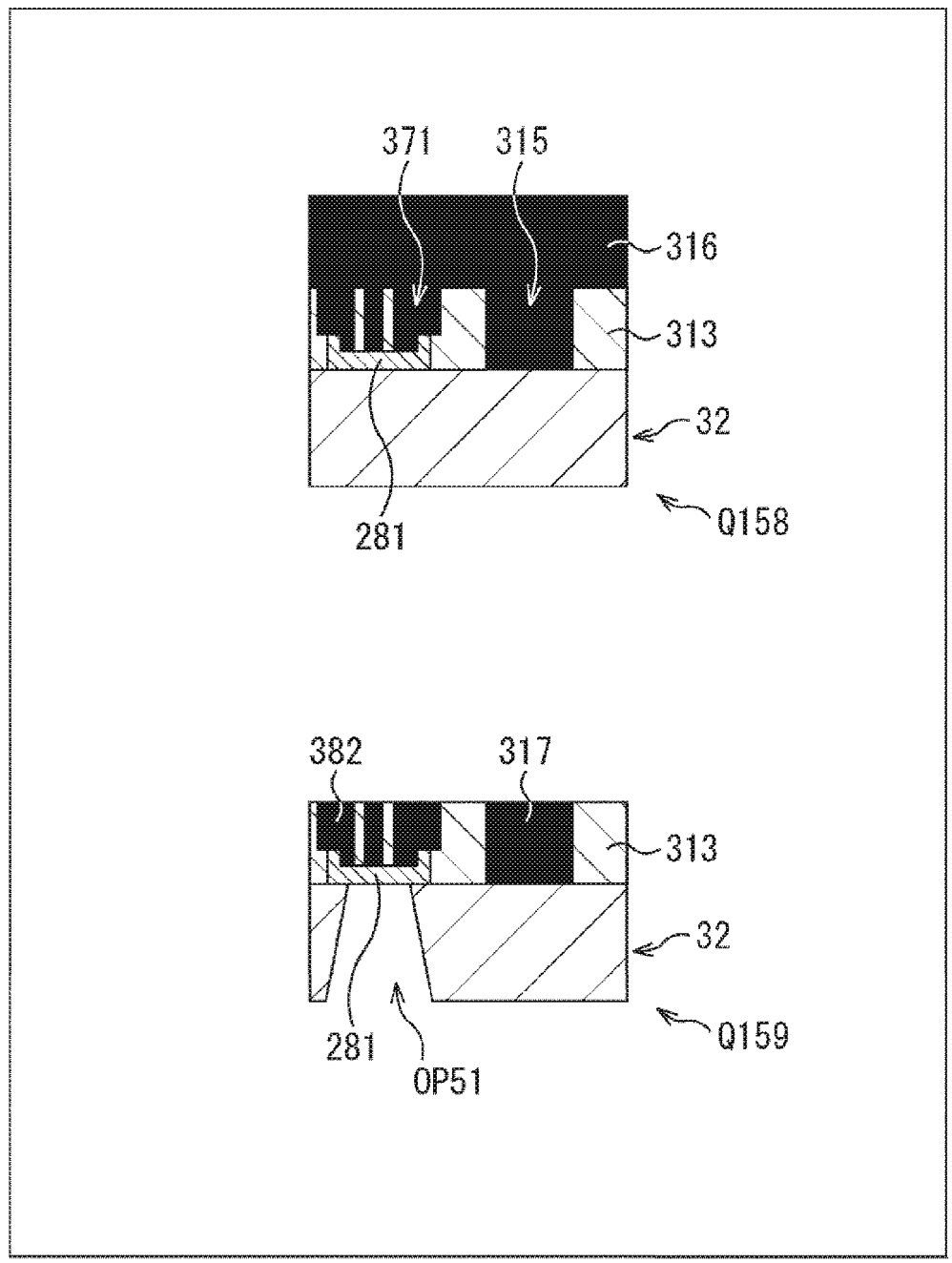
FIG. 26 is a diagram describing manufacturing steps of the semiconductor device.

In such a case, an upper substrate 21 is produced as shown in, for example, FIGS. 25 and 26. Note that the same reference numerals are given to elements in FIGS. 25 and 26 that correspond to those in FIGS. 23 and 24, and description thereof is appropriately omitted.

First, an Al film 311 that is the pad material is formed and processed and a pad 281 is formed in a given wiring layer constituting the wiring layer 32 of the upper substrate 21 as indicated by the arrow Q151 to the arrow Q154 of FIG. 25. Then, an inter-layer insulating film 313 is formed and planarized as indicated by the arrow Q155 and the arrow Q156. Note that, since the steps indicated by the arrow Q151 to the arrow Q156 are the same as those indicated by the arrow Q141 to the arrow Q146 of FIG. 23, description thereof is omitted.

Then, a groove 371 on the upper side of the Al pad 281 in the drawing which has the groove 312 in which the Cu wiring is embedded and a groove 315 for Cu wiring formed in the same wiring layer are formed as indicated by the arrow Q157, and embedded Cu wiring is formed through a damascene method.

In other words, a barrier metal and a Cu film 316 are formed in the groove 371 and the groove 315 as indicated by the arrow Q158 of FIG. 26, and then this film 316 is processed to form the Cu wiring 382 and the other Cu wiring 317 as indicated by the arrow Q159.

Here, in the steps indicated by the arrow Q157 of FIG. 25 to the arrow Q159 of FIG. 26, only the shape of a groove 371, i.e., the shape of Cu wiring 382, is different from that in steps indicated by the arrow Q147 of FIG. 23 to the arrow Q149 of FIG. 24, and other points are the same.

A part of the Cu wiring 382 obtained from the manufacturing process described with reference to FIGS. 25 and 26 is embedded in the pad 281 for wire bonding, and partial regions of the pad 281 including its corners and sides on surfaces on the Cu wiring 382 side are in contact with the Cu wiring 382. That is to say, the portion of the Cu wiring 382 that is not embedded in the pad 281 functions as a Cu pad for protecting the pad 281 provided in a wiring layer of the pad 281 adjacent to the lower substrate 22 side.

Therefore, when wire bonding or probing is performed on the pad 281, a portion of the pad 281 on which a load is concentrated, i.e., the corners or sides of the pad 281, is reinforced (protected) by the Cu wiring 382, and thus cracking can be suppressed.

Further, a portion that does not contain Cu which is the material of the Cu wiring 382, i.e., a portion in which the inter-layer insulating film 313 is embedded, is provided on the surface on the opposite side to the Cu 382 on the pad 281 side. Accordingly, the area of the Cu portion on the surface of the Cu wiring 382 can be set to be small, and occurrence of dishing can be suppressed. In particular, if Cu wiring (a pad) with a portion that does not contain Cu in a part of the center portion of a surface like the Cu wiring 382 is disposed in a bonding surface portion of the upper substrate 21 and the lower substrate 22 in the upper substrate 21 or the lower substrate 22, the upper substrate 21 and the lower substrate 22 can be bonded together more firmly.

Ninth Embodiment

<Configuration Example of a Semiconductor Device>

Still another embodiment of a semiconductor device to which the present technology is applied will be described.

Figure 27:
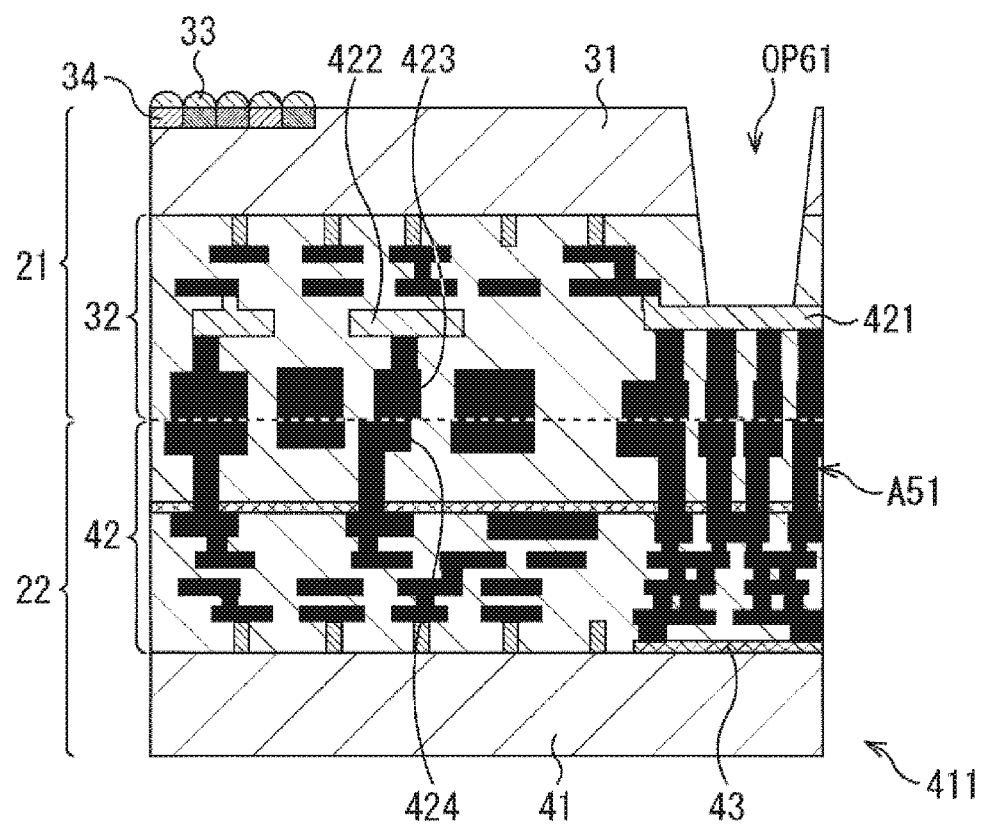
FIG. 27 is a diagram showing a configuration example of a semiconductor device.

FIG. 27 is a diagram showing a configuration example of the embodiment of the semiconductor device to which the present technology is applied. Note that the same reference numerals are given to elements in FIG. 27 that correspond to those in FIG. 3, and description thereof is appropriately omitted.

The semiconductor device 411 shown in FIG. 27 has an upper substrate 21 and a lower substrate 22 that are bonded together, and the dashed line between the upper substrate 21 and the lower substrate 22 in the drawing represents the bonding surface of the upper substrate 21 and the lower substrate 22.

The upper substrate 21 includes a Si substrate 31 and a wiring layer 32, and on-chip lenses 33 and color filters 34 are provided on the upper side of the Si substrate 31 of the drawing.

Furthermore, a pad 421 formed of Al and another pad 422 formed of Al are provided in a predetermined wiring layer of the wiring layer 32 constituted by the plurality of wiring layers. Here, the pad 421 is set to be a pad for wire bonding or probing.

In addition, the lower substrate 22 is constituted by a Si substrate 41 and a wiring layer 42, and an insulating film 43 is provided at a part of the portion of the wiring layer 42 in which the wiring layer comes into contact with the Si substrate 41.

Also in the semiconductor device 411, pads that are formed of Cu for protecting the pad 421 are provided in each layer between the pad 421 for wire bonding, etc. and the insulating film 43 in the wiring layer 32 and the wiring layer 42 as indicated by the arrow A51.

A shape of the Cu pads in each layer is set to, for example, the shapes of the pads described with reference to FIG. 2. In particular, a shape of the Cu pads on the bonding surface of the upper substrate 21 and the lower substrate 22 is set to the shape of the pad CPD31 indicated by the arrow Q22, the pad CPD32 indicated by the arrow Q23, the pad CPD33 indicated by the arrow Q24 of FIG. 2, or the like.

Crack resistance can be improved simply by providing the Cu pads on the lower side of the pad 421 in the drawing as described above. In addition, with such a configuration, a metal pad for wire bonding or probing can be provided on the upper substrate 21. As a result, a depth from the Si substrate 31 to the metal pad 421 can be set to be shallow, pad opening formation time can be reduced, and occurrence of defects in wire bonding or contact of a pin can be suppressed.

In addition, the upper substrate 21 and the lower substrate 22 are electrically connected by the Cu pads protecting the pad 421 in the semiconductor device 411.

Furthermore, in the semiconductor device 411, a Cu pad 423 and a Cu pad 424 are provided on the bonding surface of the upper substrate 21 and the lower substrate 22 to face each other, and thereby the pad 423 of the upper substrate 21 and the pad 424 of the lower substrate 22 are joined together in Cu—Cu bonding.

In this example, since the pad 423 is electrically connected directly to the pad 422 through a Cu via, the pad 422 is electrically connected to Cu wiring of the lower substrate 22 through the pad 423 and the pad 424.

<Description of a Semiconductor Device Manufacturing Process>

A manufacturing process of the semiconductor device 411 will be described here with reference to FIGS. 28 to 32. Note that the same reference numerals are given to elements in FIGS. 28 to 32 that correspond to those in FIG. 27, and description thereof is appropriately omitted.

Figure 28:
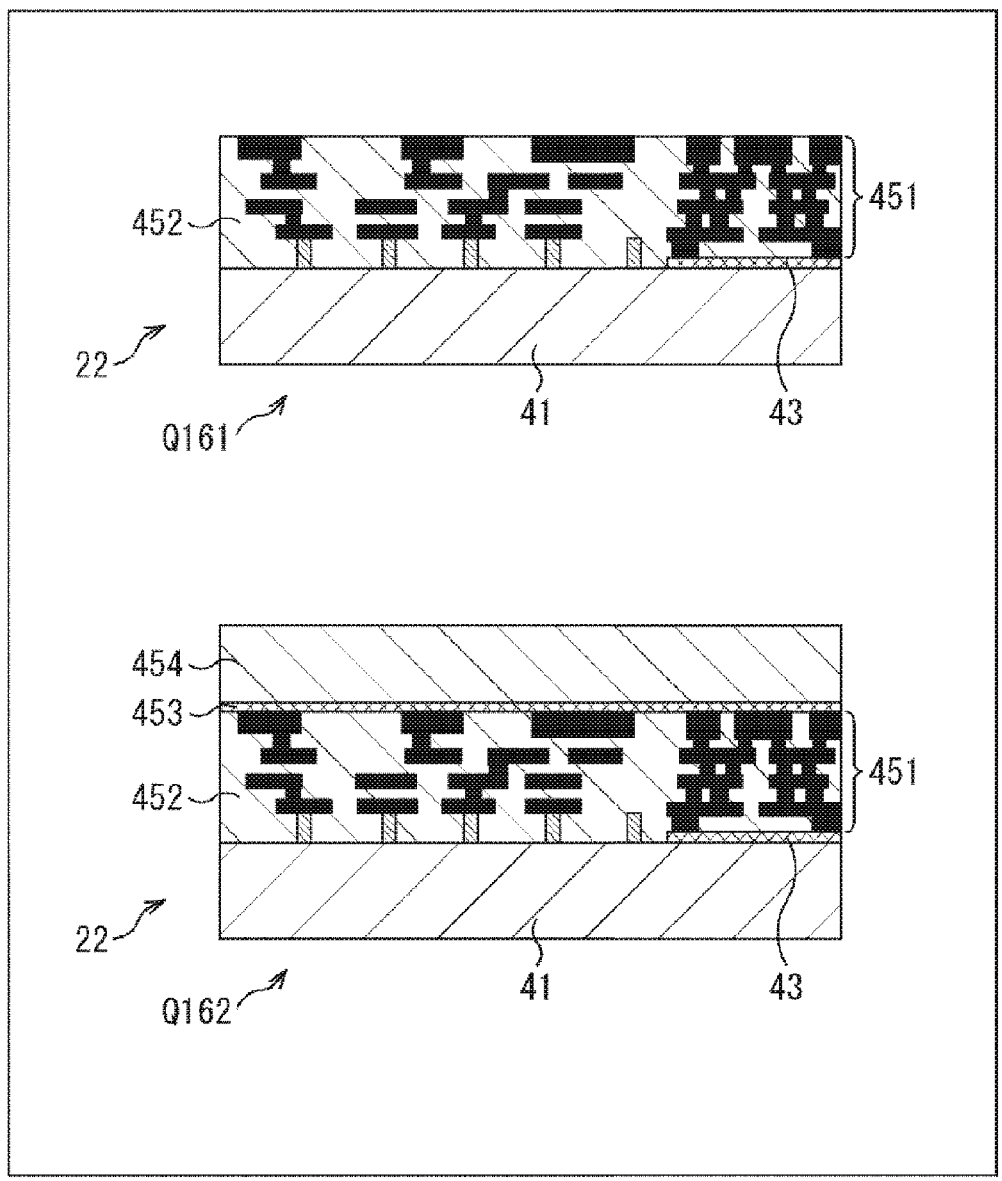
FIG. 28 is a diagram describing manufacturing steps of the semiconductor device.

First, the lower substrate 22 indicated by the arrow Q161 of FIG. 28 is a substrate with logic circuits, having an element isolation region or source/drain regions for a plurality of MOS transistors that are not illustrated. In addition, the lower substrate 22 has logic circuits for signal processing, such as a multi-layer wiring 451 and an inter-layer insulating film 452.

In this example, four Cu wiring layers are formed as the multi-layer wiring 451 in the wiring layers provided on the Si substrate 41 of the lower substrate 22, and the uppermost layer is assumed to be equivalent to a semi-global layer and a global layer.

Next, a barrier insulating film 453 for forming a Cu pad for bonding is formed of, for example, P—SiN or P—SiCN with a thickness of 0.01 to 0.5 μm on the upper side of the inter-layer insulating film 452 in the drawing as indicated by the arrow Q162. Further, another inter-layer insulating film 454 is formed of $SiO_2$ with a thickness of about 0.3 to 5 μm on the surface of the barrier insulating film 453.

Note that, although P—SiN or P—SiCN is exemplified as the barrier insulating film 453, other materials for films having a passivation property may be used. In addition, although an oxide film is exemplified as the inter-layer insulating film 454 here, hydrogen silsesquioxane (HSQ) or a laminate thereof, for example, may be used for the inter-layer insulating film 454 as a nitride film, an oxynitride film (SiON), or an inorganic coating-type insulating film.

Figure 29:
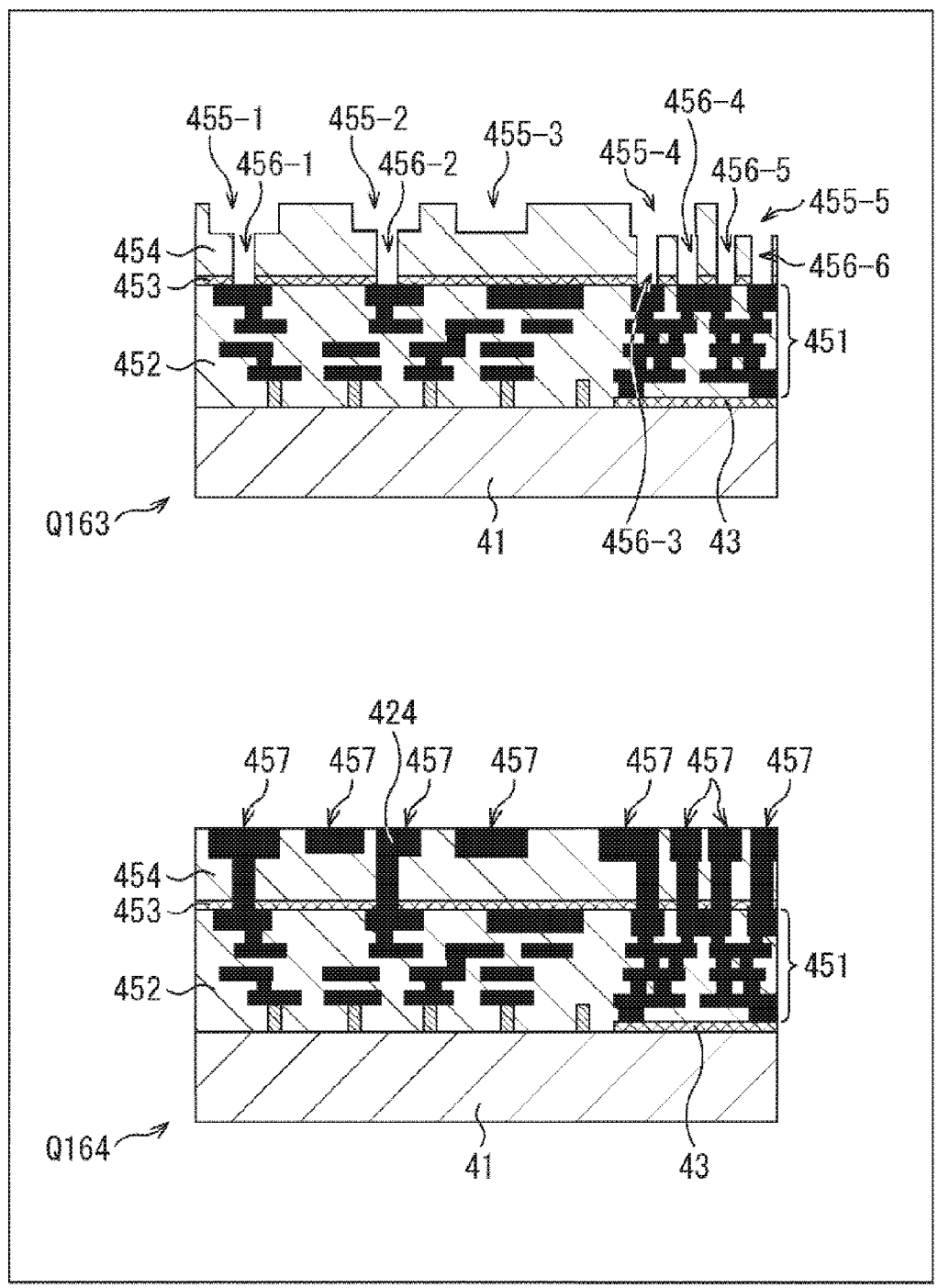
FIG. 29 is a diagram describing manufacturing steps of the semiconductor device.
Figure 30:
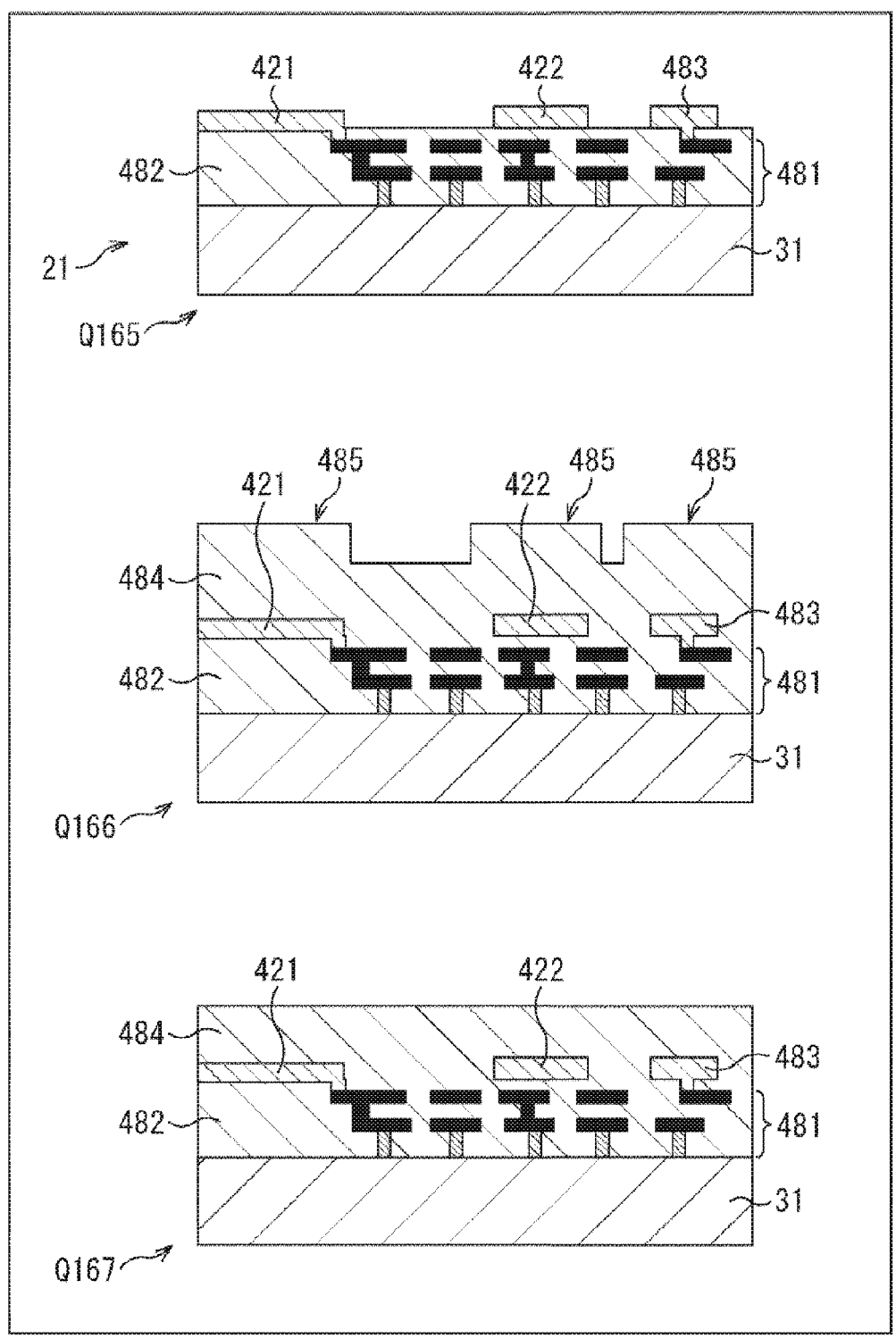
FIG. 30 is a diagram describing manufacturing steps of the semiconductor device.

Then, a groove 455-1 to a groove 455-5 of the Cu pad for bonding with the upper substrate 21 are opened as indicated by the arrow Q163 of FIG. 29. Note that the groove 455-1 to the groove 455-5 will also be referred to simply as grooves 455 when there is no particular need to distinguish the grooves.

In addition, at the same time as the opening of the grooves 455, a connection hole 456-1 to a connection hole 456-6 for bonding with Cu multi-layer wiring such as the multi-layer wiring 451 that is in the lower layer of the grooves 455 are also opened. Note that the connection hole 456-1 to the connection hole 456-6 will also be referred to simply as connection holes 456 when there is no particular need to distinguish the connection holes.

In addition, although intermediary processes are not illustrated here, processing may be performed as follows. That is, for example, the grooves 456 are first patterned using a dual-damascene processing method, and opening is performed up to the middle of the barrier insulating film 453 using dry etching. Then, after the grooves 455 are patterned, opening of the grooves 455 and the connection holes 456 is simultaneously performed up to the Cu lower layer.

Note that the grooves 455 are formed to have a depth of 0.15 to 3 μm and a width of about 0.3 to 10 μm. In addition, the pitch of the grooves 455, i.e., the distance between the adjacent grooves 455 in the horizontal direction of the drawing is set to 0.6 μm or more.

In addition, the connection holes 456 are formed to have a depth of about 0.2 to 5 μm and a width of about 0.1 to 3 μm.

Furthermore, drying conditions for dry-etching processing the connection holes 456 in an example are set such that the temperature is room temperature, the pressure is 50 to 100 mTorr, the source power is 1000 to 2000 W, a gas flow ratio of octafluorocyclobutane ($C_4F_8$), argon (Ar), and oxygen ($O_2$) is $C_4F_8:Ar:O_2=9:1:1$, and a substrate bias is 50 to 300 W.

Here, although performing etching to the middle of the barrier insulating film 453 is assumed, it may stop in the middle of the inter-layer insulating film 454. In addition, it is preferable to process the grooves 455 in an example under conditions of room temperature, pressure of 50 to 150 mTorr, source power of 500 to 3000 W, processing gases octafluorocyclopentene ($C_5F_8$), argon (Ar), and oxygen ($O_2$) at a gas flow ratio of $C_5F_8:Ar:O_2=6:1:1$, and a substrate bias of 500 to 2000 W.

Next, a Cu-plated film is formed as a metal film 457 to have a thickness of about 0.5 to 3 μm in the opened grooves 455 and connection holes 456 as indicated by the arrow Q164.

In addition, although not illustrated, a barrier metal film or a Cu sheet film is placed between the inter-layer insulating film 454 and the metal film 457. Then, the unnecessary Cu-plated film and parts of the barrier metal film and the inter-layer insulating film 454 are removed from the upper layer using, for example, the CMP method and thereby the layer is planarized. The inter-layer insulating film 454 is removed to have a thickness of about 0.05 to 0.5 μm.

Accordingly, the Cu pad 424, for example, for bonding is formed.

Note that, after the upper substrate 21 and the lower substrate 22 are joined, the region serving as the lower layer of the pad for wire bonding, for example, the pad 421 shown in FIG. 27, has a structure for firmly protecting the bonding surface under wire bonding as described above.

Through the above steps, the lower substrate 22 is produced.

Next, production of the upper substrate 21 will be described. Two Cu wiring layers and one Al layer are formed on the Si substrate 31 as indicated by the arrow Q165 of FIG. 30.

The Si substrate 31 which constitutes the upper substrate 21 has a source and a drain of a photodiode, a pixel transistor, or a transfer transistor, none of which is illustrated, and has a multi-layer wiring 481 formed of Cu wiring and an inter-layer insulating film 482 therearound.

In addition, metal pads 483, 421, and 422 that are for wire bonding and are connectable to a Cu pad are provided on the multi-layer wiring 481. The pad 483 is composed of, for example, Al or Ti, TiN. Ta, TaN, and the like, and set to have a height of about 0.3 to 2 μm, a width of about 2 to 800 μm, and a wiring pitch of 0.6 μm or more.

Next, an inter-layer insulating film 484 is formed of $SiO_2$ or the like to have a thickness of about 0.3 to 5 μm on the metal pads 483 and 421 as indicated by the arrow Q166. Note that, although the inter-layer insulating film 484 is exemplified as being formed of, for example, a $SiO_2$ film here, the film can be formed of any material that can insulate metal pads and is easy to planarize such as P—SiN.

Next, coating steps 485 of the inter-layer insulating film 484 that are generated on the metal pad are planarized using the CMP method to process the surface of the inter-layer insulating film 484 to be planar as indicated by the arrow Q167.

Figure 31:
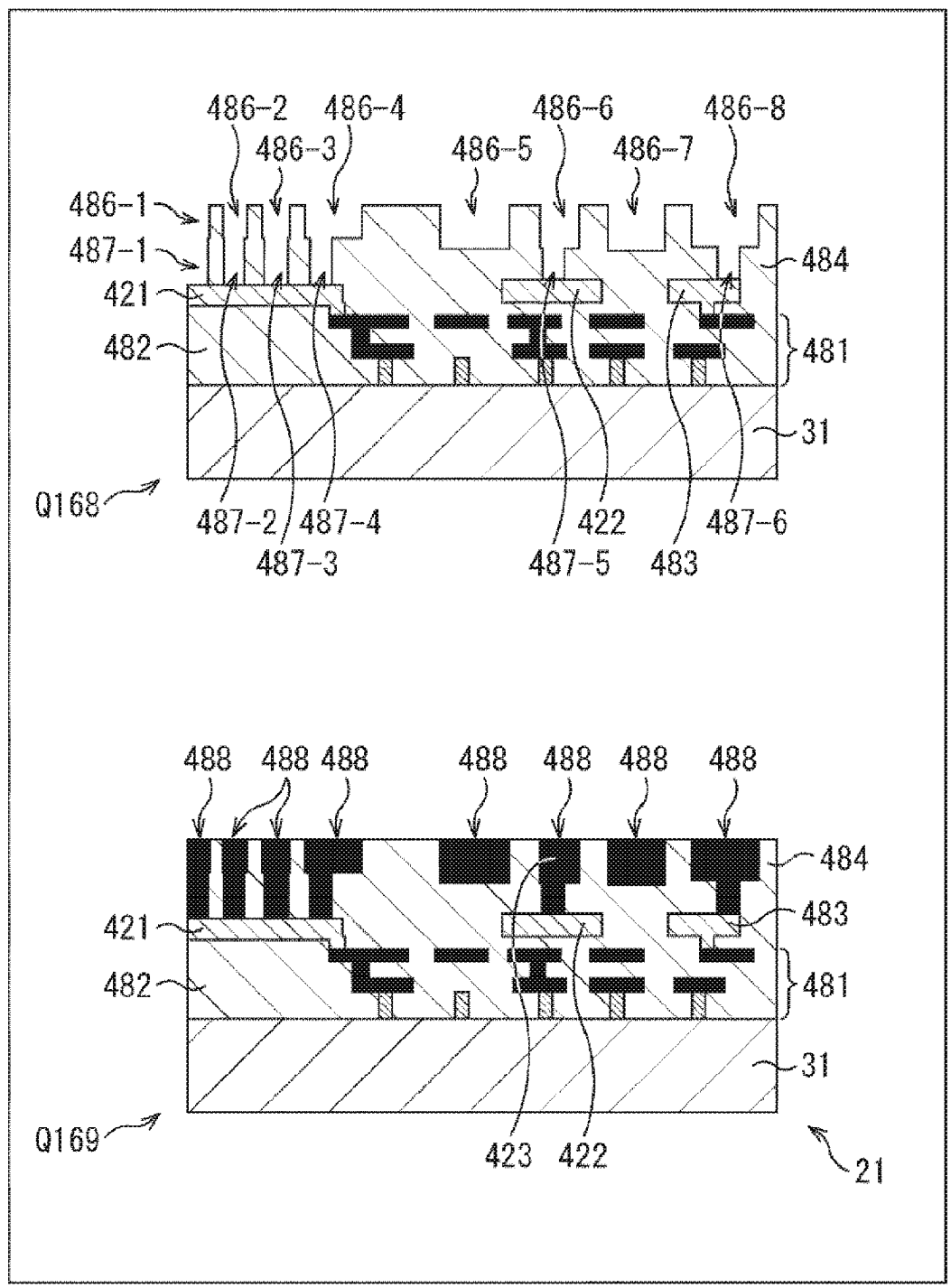
FIG. 31 is a diagram describing manufacturing steps of the semiconductor device.

Further, a groove 486-1 to a groove 486-8 of the Cu pad for bonding with the lower substrate 22 are opened in the inter-layer insulating film 484 as indicated by the arrow Q168 of FIG. 31. Note that the groove 486-1 to the groove 486-8 will also be referred to simply as grooves 486 when there is no particular need to distinguish the grooves.

In addition, at the same time as the opening of the grooves 486, a connection hole 487-1 to a connection hole 487-6 for bonding with the multi-layer wiring that is in the lower layer of the grooves 486 are also opened. Note that the connection hole 487-1 to the connection hole 487-6 will also be referred to simply as connection holes 487 when there is no particular need to distinguish the connection holes.

In addition, although intermediary processes are not illustrated here, processing may be performed as follows. That is, for example, the connection holes 487 are first patterned using a dual-damascene processing method, and opening is performed up to the inter-layer insulating film 484 above the pad 483 using dry etching. Then, after the grooves 486 are patterned, opening of the grooves 486 and the connection holes 487 is simultaneously performed up to the metal pads.

Note that the grooves 486 are formed to have a depth of 0.15 to 3 μm and a width of about 0.3 to 10 μm. In addition, the pitch of the grooves 486, i.e., the distance between the adjacent grooves 486 in the horizontal direction of the drawing is set to 0.6 μm or more.

In addition, the connection holes 487 are formed to have a depth of about 0.2 to 5 μm and a width of about 0.1 to 3 μm.

Furthermore, drying conditions for dry-etching processing the connection holes 487 in an example are set such that the temperature is room temperature, the pressure is 50 to 100 mTorr, the source power is 1000 to 2000 W, a gas flow ratio of octafluorocyclobutane ($C_4F_8$), argon (Ar), and oxygen ($O_2$) is $C_4F_8$:Ar:$O_2$=9:1:1, and a substrate bias is 50 to 300 W.

Here, although performing etching to the top of the metal pad 483 is assumed, it may stop in the middle of the inter-layer insulating film 484. In addition, it is preferable to process the grooves 486 in an example under conditions of room temperature, pressure of 50 to 150 mTorr, source power of 500 to 3000 W, processing gases octafluorocyclopentene ($C_4F_8$), argon (Ar), and oxygen ($O_2$) at a gas flow ratio of $C_5F_8$:Ar:$O_2$=6:1:1, and a substrate bias of 500 to 2000 W.

Next, a Cu-plated film is formed as a metal film 488 to have a thickness of about 0.5 to 3 μm in the opened grooves 486 and connection holes 487 as indicated by the arrow Q169.

In addition, although not illustrated, a barrier metal film or a Cu sheet film is placed between the inter-layer insulating film 484 and the metal film 488. Then, the unnecessary Cu-plated film and parts of the barrier metal film and the inter-layer insulating film 484 are removed from the upper layer using, for example, the CMP method and thereby the layer is planarized. The inter-layer insulating film 484 is removed to have a thickness of about 0.05 to 0.5 μm.

Accordingly, the Cu pad 423, for example, for bonding is formed.

Through the above steps, the upper substrate 21 is produced.

Figure 32:
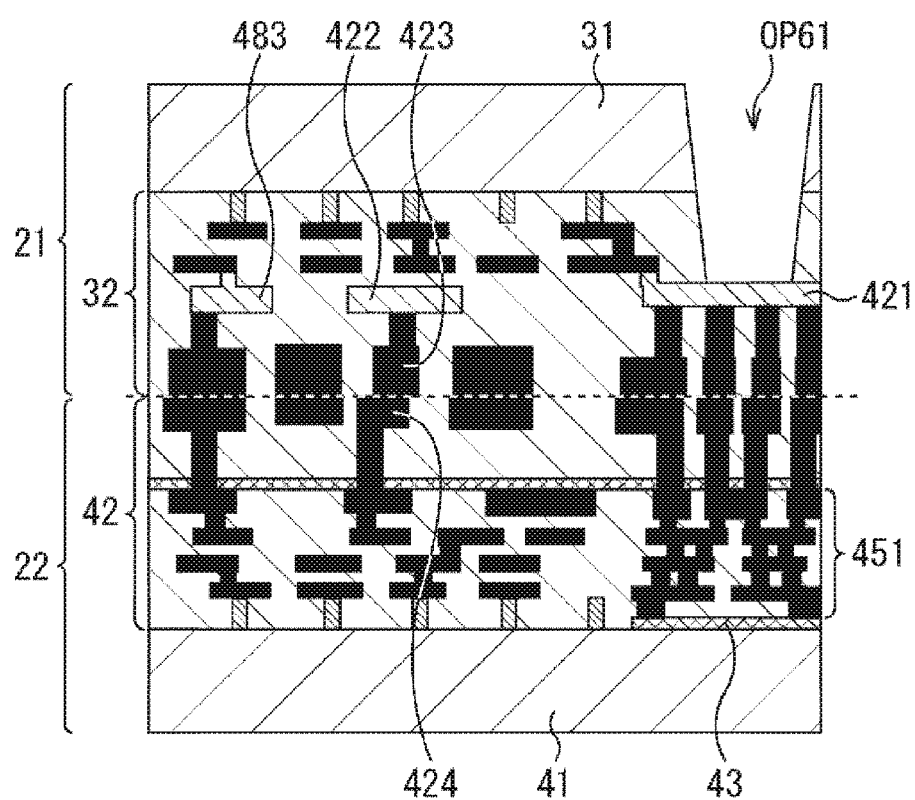
FIG. 32 is a diagram describing manufacturing steps of the semiconductor device.

Next, Si of the Si substrate 31 constituting the upper substrate 21 is thinned, and Cu—Cu bonding of the upper substrate 21 and the lower substrate 22 is performed as shown in FIG. 32.

Thereby, the metal pads formed of Al or the like and the Cu pad for bonding are electrically connected. In this example, the pad 422 and the Cu pad 424 are electrically connected. Note that, after the upper substrate 21 and the lower substrate 22 are joined, the region serving as the lower layer of the pad 421 for wire bonding has a structure for firmly protecting the bonding surface under wire bonding as described above. In other words, as Cu pads for protecting the pad 421, for example, pads in the shapes described with reference to FIG. 2 are provided in the lower layer of the pad 421.

Then, an opening OP61 is formed or on-chip lenses 33 and color filters 34 are provided, and thereby the semiconductor device 411 is formed.

As described above, upper and lower substrates were electrically connected using, for example, TSVs in the past, and thus wires had to be wound from TSVs to pads, which caused a restriction that the TSVs had to be laid at a corner of a chip.

On the other hand, according to the semiconductor device 411, the two upper substrate 21 and lower substrate 22 can be electrically bonded by forming connection holes between, for example, the Al pad 422 and a pad such as the Cu pad 423 for bonding that is placed immediately below the Al pad. Thus, wires for winding are not necessary and a restriction on a chip layout is not imposed. Thereby, miniaturization of a chip (the semiconductor device 411), low power consumption, and the like are expected.

Tenth Embodiment

<Configuration Example of a Semiconductor Device>

In the semiconductor device 411 in which the Al pad 421 for wire bonding or probing is provided, the Al pad 422 is simultaneously formed as the Al pad 421 for wire bonding on the upper layer of the Cu pad 423 on the bonding surface of the upper substrate 21 and the lower substrate 22. Thus, the structure in which the Cu pad 423 is electrically connected directly to the Al pad 422 by Cu vias is possible.

However, since the Al pad is inferior to the Cu pad in terms of design as microfabrication of the Cu pad advances, which means that Al is more difficult to microfabricate than Cu, there is a possibility of it being difficult for the Cu pad to have a narrow pitch due to the fact that it is tied to a pitch of the Al pad.

Thus, the upper substrate 21 and the lower substrate 22 may be electrically connected by Cu vias having a length of two or more layers that are not grounded to the Al pad from the Cu pad on the bonding surface but grounded to a wiring layer that is a higher layer.

Figure 33:
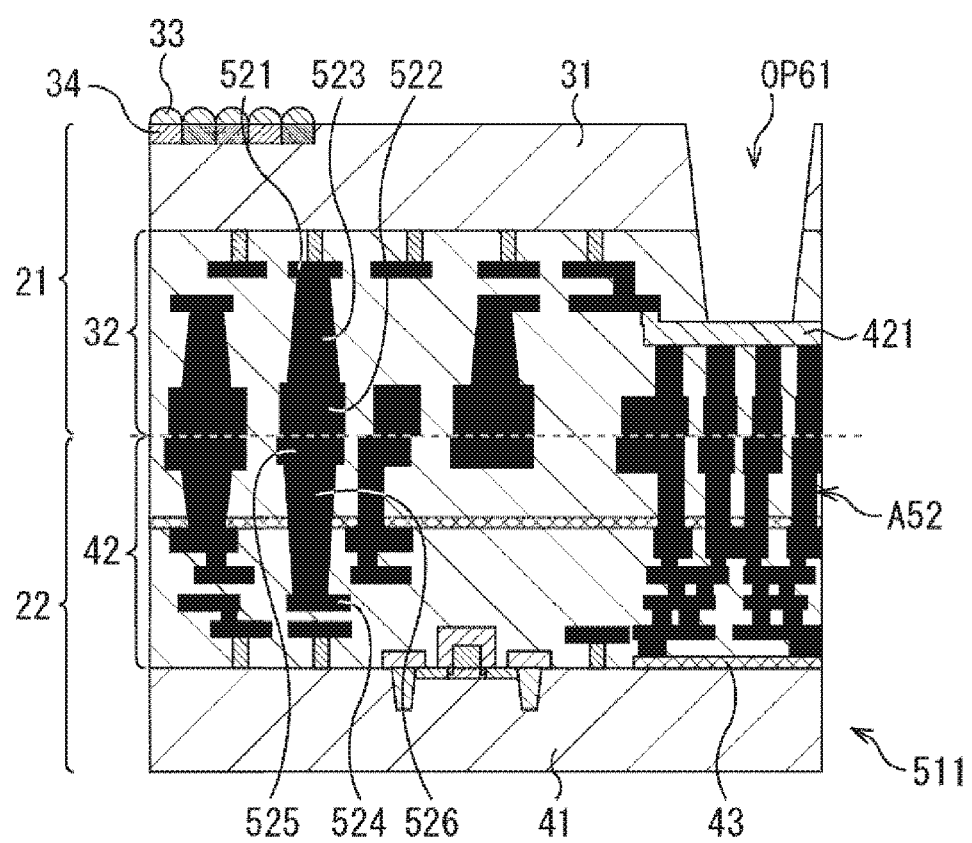
FIG. 33 is a diagram showing a configuration example of a semiconductor device.

In such a case, a semiconductor device is configured as shown in, for example, FIG. 33. Note that the same reference numerals are given to elements in FIG. 33 that correspond to those in FIG. 27, and description thereof is appropriately omitted.

The semiconductor device 511 shown in FIG. 33 has an upper substrate 21 and a lower substrate 22 that are bonded together, and the dashed line between the upper substrate 21 and the lower substrate 22 in the drawing represents the bonding surface of the upper substrate 21 and the lower substrate 22.

The upper substrate 21 includes a Si substrate 31 and a wiring layer 32, and on-chip lenses 33 and color filters 34 are provided on the upper side of the Si substrate 31 of the drawing.

Furthermore, a pad 421 formed of Al is provided in a predetermined wiring layer of the wiring layer 32 constituted by the plurality of wiring layers. Here, the pad 421 is set to be a pad for wire bonding or probing.

In addition, the lower substrate 22 is constituted by a Si substrate 41 and a wiring layer 42, and an insulating film 43 is provided at a part of the portion of the wiring layer 42 in which the wiring layer comes into contact with the Si substrate 41.

Also in the semiconductor device 511, pads that are formed of Cu for protecting the pad 421 are provided in each layer between the pad 421 for wire bonding, etc. and the insulating film 43 in the wiring layer 32 and the wiring layer 42 as indicated by the arrow A52.

A shape of the Cu pads in each layer is set to, for example, the shapes of the pads described with reference to FIG. 2. In particular, a shape of the Cu pads on the bonding surface of the upper substrate 21 and the lower substrate 22 is set to the shape of the pad CPD31 indicated by the arrow Q22, the pad CPD32 indicated by the arrow Q23, the pad CPD33 indicated by the arrow Q24 of FIG. 2, or the like.

Crack resistance can be improved simply by providing the Cu pads on the lower side of the pad 421 in the drawing as described above. In addition, with such a configuration, a metal pad for wire bonding or probing can be provided on the upper substrate 21. As a result, a depth from the Si substrate 31 to the metal pad can be set to be shallow, pad opening formation time can be reduced, and occurrence of defects in wire bonding or contact of a pin can be suppressed.

In addition, the upper substrate 21 and the lower substrate 22 are electrically connected by the Cu pads protecting the pad 421 in the semiconductor device 511.

Further, in the semiconductor device 511, a Cu pad 521 for wiring and a Cu pad 522 for bonding are provided in the upper substrate 21, and the pad 521 and the pad 522 are electrically connected by a Cu via 523 that penetrates a plurality of wiring layers. Here, the pad 521 is provided in a wiring layer at a position closer to the Si substrate 31 than the pad 421 for wire bonding is.

In the same manner, a Cu pad 524 for wiring and a Cu pad 525 for bonding are provided in the lower substrate 22, and the pad 524 and the pad 525 are electrically connected by a Cu via 526 that penetrates a plurality of wiring layers.

In addition, the Cu pad 522 and the Cu pad 525 are provided on the bonding surface of the upper substrate 21 and the lower substrate 22 to face each other, and the pad 522 and the pad 525 are joined together in Cu—Cu bonding.

Thereby, the pad 521 in the upper substrate 21 and the pad 524 in the lower substrate 22 are electrically connected. Moreover, in this example, since not only the pad 521 and the pad 524 but also pads and vias placed between the pads are formed of Cu, more advanced microfabrication can be realized than when Al or the like is used as a material.

<Description of a Semiconductor Device Manufacturing Process>

Next, a manufacturing process of the semiconductor device 511 will be described here with reference to FIGS. 34 to 38. Note that the same reference numerals are given to elements in FIGS. 34 to 38 that correspond to those in FIG. 33, and description thereof is appropriately omitted.

Figure 34:
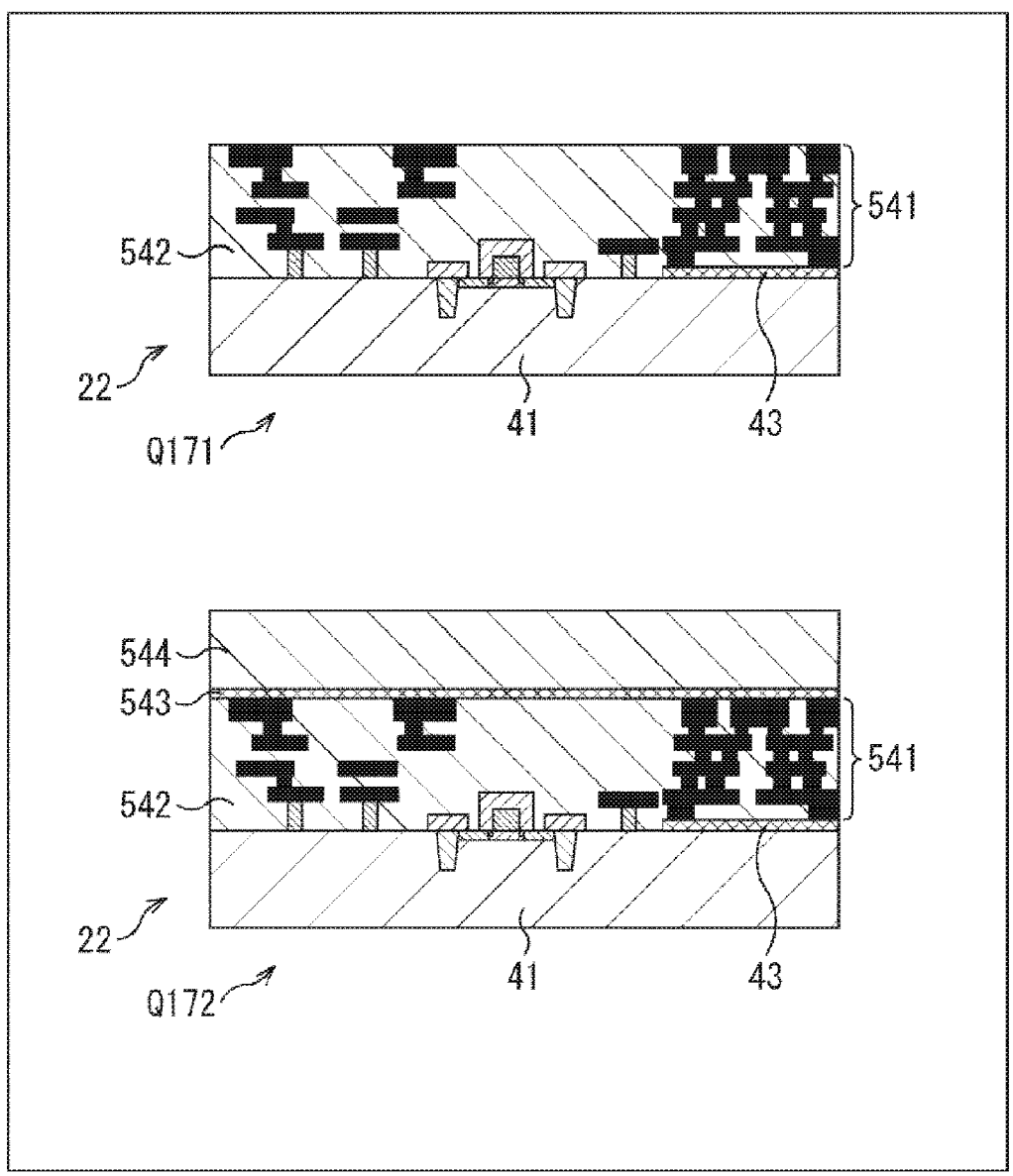
FIG. 34 is a diagram describing manufacturing steps of the semiconductor device.

First, the lower substrate 22 indicated by the arrow Q171 of FIG. 34 is a substrate with logic circuits, having an element isolation region or source/drain regions for a plurality of MOS transistors that are not illustrated. In addition, the lower substrate 22 has logic circuits for signal processing, such as a multi-layer wiring 541 and an inter-layer insulating film 542.

In this example, four Cu wiring layers are formed as the multi-layer wiring 541 in the wiring layers provided on the Si substrate 41 of the lower substrate 22, and the uppermost layer is assumed to be equivalent to a semi-global layer and a global layer.

Next, a barrier insulating film 543 for forming a Cu pad for bonding is formed of, for example, P—SiN or P—SiCN with a thickness of 0.01 to 0.5 μm on the upper side of the inter-layer insulating film 542 in the drawing as indicated by the arrow Q172. Further, another inter-layer insulating film 544 is formed of SiO$_2$ with a thickness of about 0.3 to 5 μm on the surface of the barrier insulating film 543.

Note that, although P—SiN or P—SiCN is exemplified as the barrier insulating film 543, other materials for films having a passivation property may be used. In addition, although an oxide film is exemplified as the inter-layer insulating film 544 here, hydrogen silsesquioxane (HSQ) or a laminate thereof, for example, may be used for the inter-layer insulating film 544 as a nitride film, an oxynitride film (SiON), or an inorganic coating-type insulating film.

Figure 35:
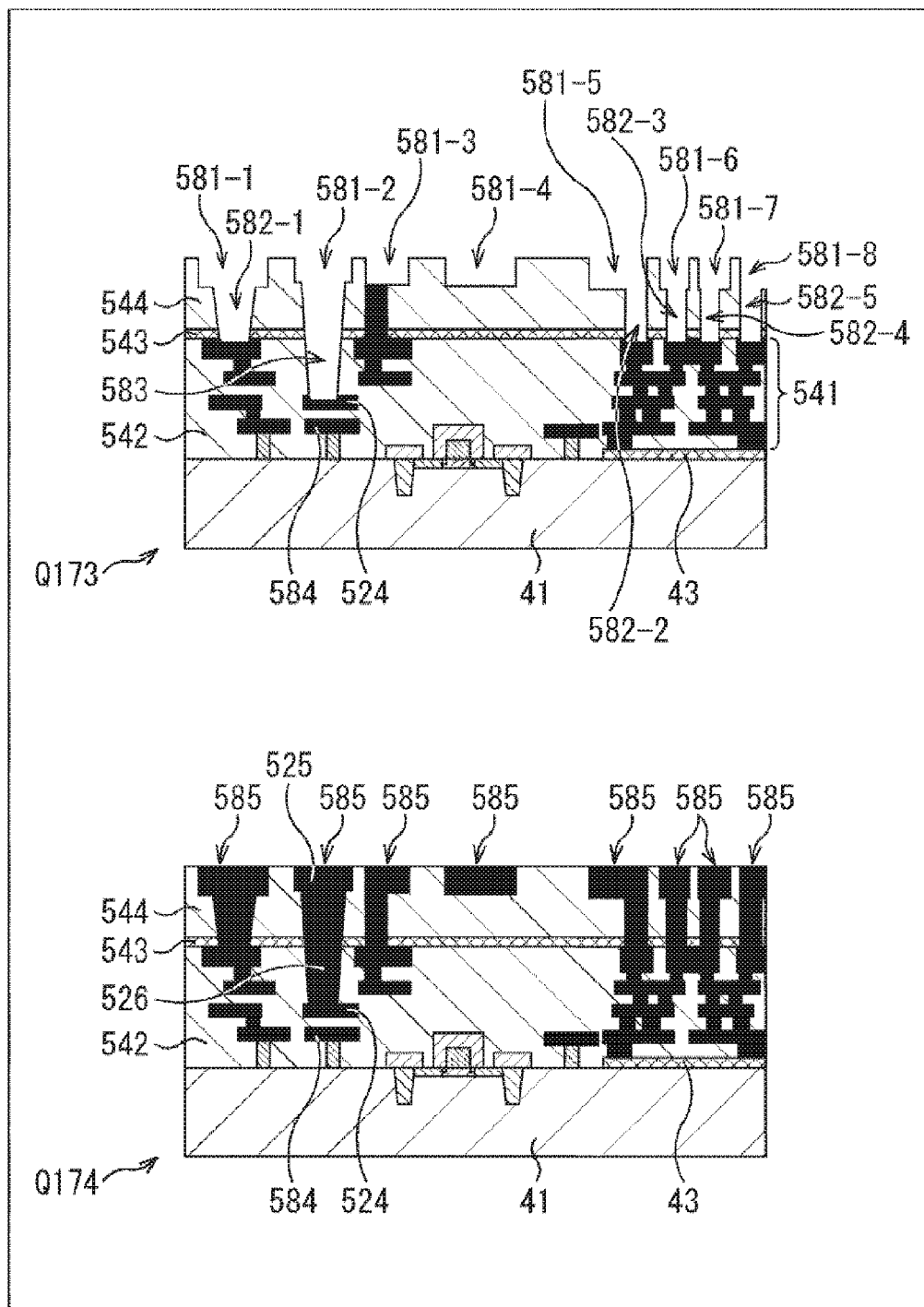
FIG. 35 is a diagram describing manufacturing steps of the semiconductor device.
Figure 36:
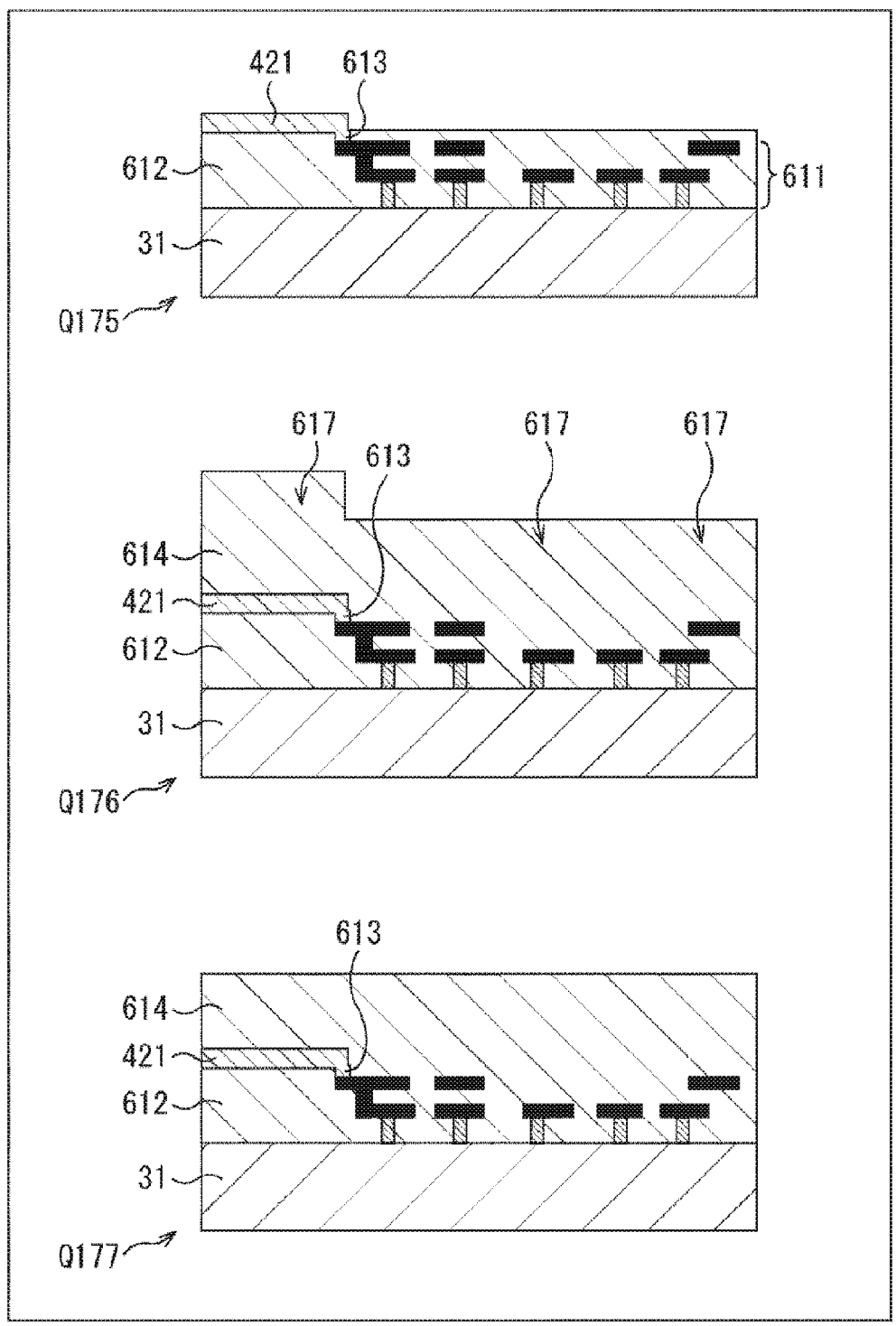
FIG. 36 is a diagram describing manufacturing steps of the semiconductor device.

Then, a groove 581-1 to a groove 581-8 of the Cu pad for bonding with the upper substrate 21 are opened as indicated by the arrow Q173 of FIG. 35. Note that the groove 581-1 to the groove 581-8 will also be referred to simply as grooves 455 when there is no particular need to distinguish the grooves.

In addition, at the same time as the opening of the grooves 581, a connection hole 582-1 to a connection hole 582-5 and a connection hole 583 for bonding with Cu multi-layer wiring such as the multi-layer wiring 541 that is in the lower layer of the grooves 581 are also opened. Note that the connection hole 582-1 to the connection hole 582-5 will also be referred to simply as connection holes 582 when there is no particular need to distinguish the connection holes. Note that a depth of the connection hole 583 differs according to wiring in which a wiring layer to which the connection hole is connected is located.

In addition, although intermediary processes are not illustrated here, processing may be performed as follows. That is, for example, the connection holes 582 and the connection hole 583 are first patterned using a dual-damascene processing method, and opening is performed to the middle of the barrier insulating film 543 using dry etching. Then, after the grooves 581 are patterned, opening of the grooves 581 and that of the connection holes 582 and the connection hole 583 up to the Cu layer are simultaneously performed in dry etching. Furthermore, the grooves 581 may be opened first, and then patterning and opening may be separately performed on each of the connection holes having different depths. Note that the connection holes, although not illustrated, may be formed up to the wiring layer in which Cu wiring 584 is provided.

Here, the grooves 581 are formed to have a depth of about 0.15 to 3 μm and a width of about 0.3 to 10 μm. In addition, the pitch of the grooves 581, i.e., the distance between the adjacent grooves 581 in the horizontal direction of the drawing, is set to 0.6 μm or more.

In addition, the connection holes 582 are formed to have a depth of about 0.2 to 5 μm and a width of 0.1 to 3 μm. The connection hole 583 is formed to have a depth of about 0.6 to 10 μm and a width of 0.1 to 3 μm. Furthermore, although one connection hole 583 is shown in the drawing, a plural number thereof is possible.

Furthermore, drying conditions for dry-etching processing the grooves 581 in an example are set such that the temperature is room temperature, the pressure is 50 to 150 mTorr, the source power is 500 to 3000 W, a gas flow ratio of octafluorocyclopentene ($C_5F_8$), argon (Ar), and oxygen ($O_2$) is $C_5F_8$:Ar:$O_2$=6:1:1, and a substrate bias is 500 to 2000 W.

In addition, conditions for processing the connection holes 582 and the connection hole 583 in an example are set such that the temperature is room temperature, the pressure is 50 to 100 mTorr, the source power is 1000 to 2000 W, a gas flow ratio of octafluorocyclobutane ($C_4FR$), argon (Ar), and oxygen ($O_2$) is $C_4F_8$:Ar:$O_2$=9:1:1, and a substrate bias is 50 to 300 W.

Here, it is assumed that etching is performed in the middle of the barrier insulating film 543 until the connection holes with all depths are opened, and after processing of the final connection hole, the barrier insulating film 543 for all the connection holes are broken. Preferable conditions for breaking the barrier insulating film 543 are set to, for example, a pressure of 50 to 200 mTorr, a source power of 300 to 2000 W, a gas flow ratio of octafluorocyclobutane ($C_4F_8$), argon (Ar), and oxygen ($O_2$) that are used as process gases of $C_4F_8$:Ar:$O_2$=1:2:20, and a substrate bias of 100 to 2000 W.

Next, a Cu-plated film is formed as a metal film 585 to have a thickness of about 0.5 to 3 μm in the opened grooves 581 and connection holes 582 as indicated by the arrow Q174.

In addition, although not illustrated, a barrier metal film or a Cu sheet film is placed between the inter-layer insulating film 544 and the metal film 585. Then, the unnecessary Cu-plated film and parts of the barrier metal film and the inter-layer insulating film 544 are removed from the upper layer using, for example, the CMP method and thereby the layer is planarized. The inter-layer insulating film 544 is removed to have a thickness of about 0.05 to 0.5 μm.

Accordingly, for example, the Cu pad 525 for bonding and the via 526 are formed.

Note that, after the upper substrate 21 and the lower substrate 22 are joined, the region serving as the lower layer of the pad for wire bonding, for example, the pad 421 shown in FIG. 33, has a structure for firmly protecting the bonding surface under wire bonding as described above.

Through the above steps, the lower substrate 22 is produced.

Next, production of the upper substrate 21 will be described. Two Cu wiring layers and one Al layer are formed on the Si substrate 31 as indicated by the arrow Q175 of FIG. 36.

The upper substrate 21 has a source and a drain of a photodiode, a pixel transistor, or a transfer transistor, none of which is illustrated, and has a multi-layer wiring 611 formed of Cu wiring, etc. and an inter-layer insulating film 612 therearound.

Then, the metal pad 421 for wire bonding is provided on the multi-layer wiring 611, i.e., in an Al layer. The pad 421 is formed of, for example, Al or Ti, TiN, Ta, TaN, or the like, to have a height of about 0.3 to 2 μmin, a width of about 2 to 800 μm, and a wiring pitch of 0.6 μm or more. In addition, the pad 421 is connected to Cu wiring through a via 613.

Next, an inter-layer insulating film 614 is formed of $SiO_2$ or the like to have a thickness of about 0.3 to 5 μm on the metal pad 421 as indicated by the arrow Q176. Note that, although the inter-layer insulating film 614 is exemplified as being formed of, for example, a $SiO_2$ film here, the film can be formed of any material that can insulate metal pads and is easy to planarize such as P—SiN.

Next, coating steps 617 of the inter-layer insulating film 614 that are generated on the metal pad are planarized using the CMP method to process the surface of the inter-layer insulating film 614 to be planar as indicated by the arrow Q177.

Figure 37:
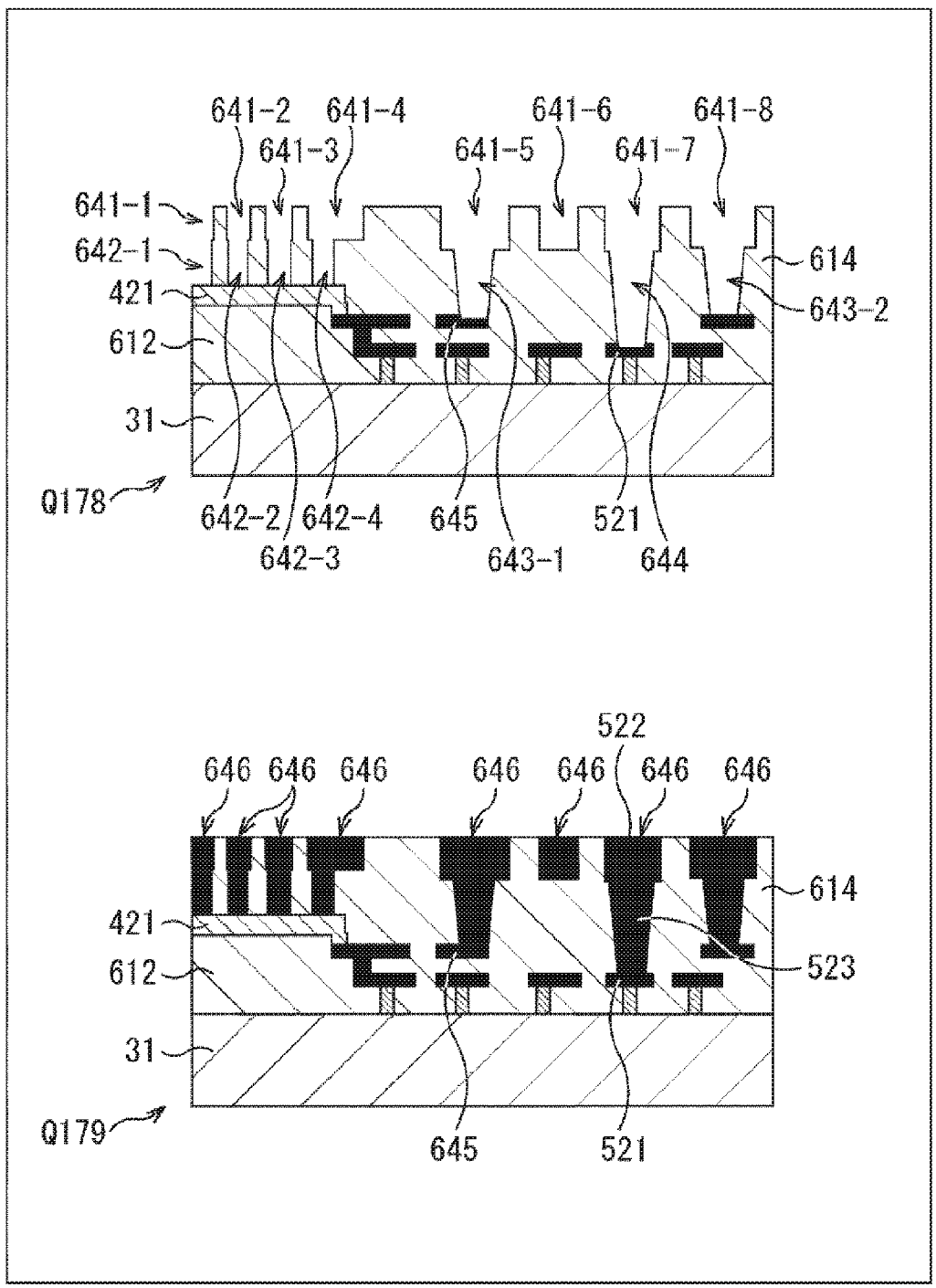
FIG. 37 is a diagram describing manufacturing steps of the semiconductor device.

Further, a groove 641-1 to a groove 641-8 of the Cu pad for bonding with the lower substrate 22 are opened in the inter-layer insulating film 614 as indicated by the arrow Q178 of FIG. 37. Note that the groove 641-1 to the groove 614-8 will also be referred to simply as grooves 641 when there is no particular need to distinguish the grooves.

In addition, at the same time as the opening of the grooves 641, a connection hole 642-1 to a connection hole 642-4, a connection hole 643-1, a connection hole 643-2, and a connection hole 644 for bonding with the multi-layer wiring in the lower layer of the grooves 641 are opened.

Note that the connection hole 642-1 to the connection hole 642-4 will also be referred to simply as connection holes 642 when there is no particular need to distinguish the connection holes. In addition, the connection hole 643-1 and the connection hole 643-2 will also be referred to simply as connection holes 643 when there is no particular need to distinguish the connection holes.

In addition, although intermediary processes are not illustrated here, processing may be performed as follows. That is, for example, the connection holes 642 and the connection holes 643 are first patterned using a dual-damascene processing method, and opening is performed up to the inter-layer insulating film 614 above the pad 421 or in the middle of the barrier insulating film that is not illustrated immediately above wiring 645 or the pad 521 (wiring) using dry etching. Then, after the grooves 641 are patterned, opening of the grooves 641 and the connection holes 642 up to the connection hole 644 is simultaneously performed using dry etching.

Note that the grooves 641 may be opened first, and then patterning and opening may be separately performed on each of the connection holes having different depths.

Here, the grooves 641 are formed to have a depth of about 0.15 to 3 µm and a width of about 0.3 to 10 µm. In addition, the pitch of the grooves 641, i.e., the distance between the adjacent grooves 641 in the horizontal direction of the drawing, is set to 0.6 µm or more.

In addition, the connection holes 642 and 643 are formed to have a depth of about 0.2 to 5 µm and a width of 0.1 to 3 µm. The connection hole 644 is formed to have a depth of about 0.6 to 10 µm and a width of 0.1 to 3 µm. Additionally, although one connection hole 644 is shown in the drawing, a plural number thereof is possible.

Furthermore, drying conditions for dry-etching processing the grooves 641 in an example are set such that the temperature is room temperature, the pressure is 50 to 150 mTorr, the source power is 500 to 3000 W, a gas flow ratio of octafluorocyclopentene ($C_5F_8$), argon (Ar), and oxygen ($O_2$) is $C_5F_8:Ar:O_2=6:1:1$, and a substrate bias is 500 to 2000 W.

In addition, conditions for processing the connection holes 642 to the connection hole 644 in an example are set such that the temperature is room temperature, the pressure is 50 to 100 mTorr, the source power is 1000 to 2000 W, a gas flow ratio of octafluorocyclobutane ($C_4F_8$), argon (Ar), and oxygen ($O_2$) is $C_4F_8:Ar:O_2=9:1:1$, and a substrate bias is 50 to 300 W.

Here, it is assumed that etching is performed in the middle of a barrier metal film, which is not illustrated, of the upper layer of the pad 421 or the barrier insulating film, which is not illustrated, of the wiring 645 or the pad 521 until the connection holes with all depths are opened, and after processing of the final connection hole, the barrier insulating film for all the connection holes is broken.

Preferable conditions for breaking the barrier insulating film are set, for example, to a pressure of 50 to 200 mTorr, a source power of 300 to 2000 W, a gas flow ratio of octafluorocyclobutane ($C_4F_8$), argon (Ar), and oxygen ($O_2$) of $C_4F_8:Ar:O_2=1:2:20$, and a substrate bias of 100 to 2000 W.

Next, as indicated by the arrow Q179, a Cu-plated film is formed to have a thickness of about 0.5 to 3 µm as a metal film 646 for the opened grooves 641 and connection holes 642 to the connection hole 644.

In addition, although not illustrated, a barrier metal film or a Cu sheet film is placed between the inter-layer insulating film 614 and the metal film 646. Then, the unnecessary Cu-plated film and parts of the barrier metal film and the inter-layer insulating film 614 are removed from the upper layer using, for example, the CMP method and thereby the layer is planarized. The inter-layer insulating film 614 is removed to have a thickness of about 0.05 to 0.5 µm.

Accordingly, for example, the Cu pad 522 for bonding and the via 523 are formed.

Through the above steps, the upper substrate 21 is produced.

Figure 38:
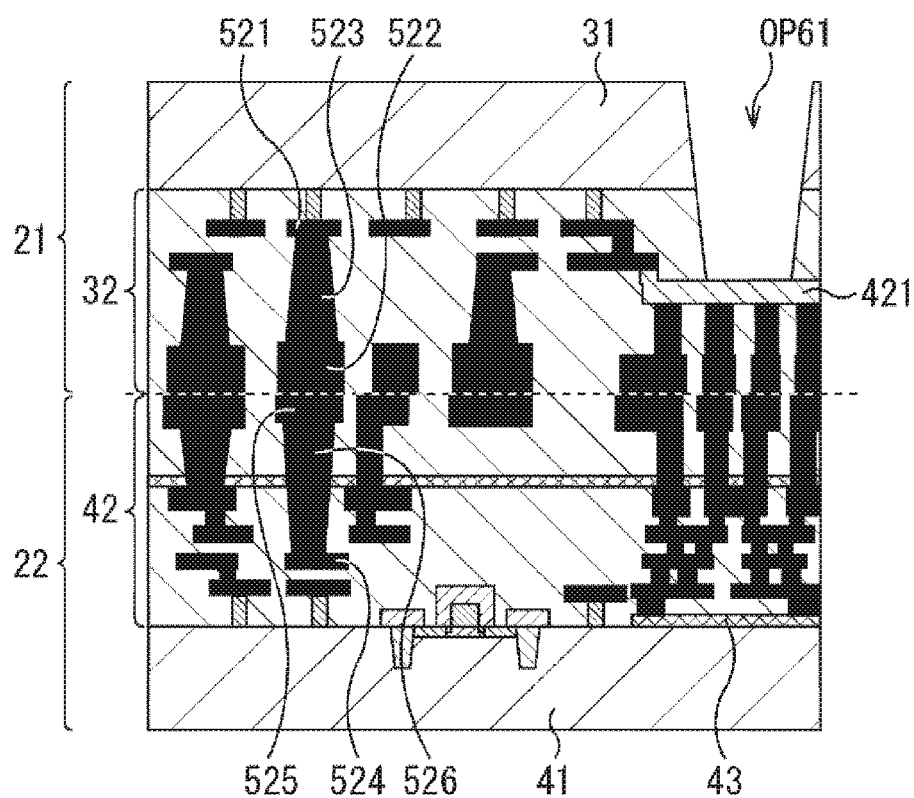
FIG. 38 is a diagram describing manufacturing steps of the semiconductor device.

Next, Si of the Si substrate 31 constituting the upper substrate 21 is thinned, and Cu—Cu bonding of the upper substrate 21 and the lower substrate 22 is performed as shown in FIG. 38.

Accordingly, the metal pad formed of Al or the like and the Cu pad for bonding are electrically connected. In addition, the pad 521 in the upper substrate 21 and the pad 524 in the lower substrate 22 are electrically connected through the via 523, the pad 522, the pad 525, and the via 526.

Note that, after the upper substrate 21 and the lower substrate 22 are joined, the region serving as the lower layer of the pad 421 for wire bonding has a structure for firmly protecting the bonding surface under wire bonding as described above. In other words, as Cu pads for protecting the pad 421, for example, pads in the shapes described with reference to FIG. 2 are provided in the lower layer of the pad 421.

Then, an opening OP61 is formed or on-chip lenses 33 and color filters 34 are provided, and thereby the semiconductor device 511 is formed.

As described above, upper and lower substrates were electrically connected using, for example, TSVs in the past, and thus wires had to be wound from TSVs to pads, which caused a restriction that the TSVs had to be laid at a corner of a chip.

On the other hand, according to the semiconductor device 511, the two upper substrate 21 and lower substrate 22 can be electrically bonded by forming the via 523, etc. between, for example, the Cu pad 521 and a pad such as the Cu pad 522 for bonding that is placed immediately below the Al pad. Thus, wires for winding are not necessary and a restriction on a chip layout is not imposed.

Furthermore, without providing an Al pad other than the pad 421 for wire bonding as a connection destination of the Cu pad for bonding and by connecting the Cu pad to Cu wiring (pad) of a wiring layer on the Si substrate 31 side, a narrow pitch of the Cu pads, which are more advanced than the Al pad in terms of design, can be realized. Accordingly, more advanced miniaturization, lower power consumption, and the like of a chip (the semiconductor device 511) than in the ninth embodiment are expected.

<Configuration Example of a Solid-State Imaging Device>

The present technology can be further applied to various kinds of semiconductor devices such as a chip in which a logic circuit is provided in an upper substrate 21 and a memory is provided in a lower substrate 22, or a solid-state imaging device in which on-chip lenses 33 and photodiodes are provided in an upper substrate 21 and wiring is provided in a lower substrate 22.

FIG. 39 is a diagram showing a configuration example of a solid-state imaging device to which the present technology is applied.

The solid-state imaging device 901 is a back-irradiation image sensor constituted by, for example, a CMOS image sensor, receives light from a subject for photoelectric conversion, generates an image signal, and thereby captures an image.

Note that the back-irradiation image sensor is an image sensor configured by providing photodiodes that receive light from a subject between a light receiving surface on which light from the subject is incident, i.e., an on-chip lens that concentrates the light and a wiring layer in which wiring such as a transistor that drives pixels is provided.

The solid-state imaging device 901 is constituted by a pixel array unit 911, a vertical drive unit 912, a column processing unit 913, a horizontal drive unit 914, a system control unit 915, pixel drive lines 916, vertical signal lines 917, a signal processing unit 918, and a data storage unit 919.

In the solid-state imaging device 901, the pixel array unit 911 is formed on a semiconductor substrate (chip) that is not illustrated, and the vertical drive unit 912 to the system control unit 915 are further integrated on the semiconductor substrate. For example, the semiconductor substrate on which the pixel array unit 911 is formed is assumed to be a semiconductor device that has the upper substrate 21 and the lower substrate 22 or the like.

The pixel array unit 911 is constituted by pixels having photodiodes as a photoelectric conversion unit that generates and accumulates electric charges according to an amount of light incident from a subject, and the pixels constituting the pixel array unit 911 are arrayed in two dimensions in the horizontal direction (row direction) and the vertical direction (column direction) in the drawing.

In the pixel array unit 911, the pixel drive lines 916 are wired in the row direction for each of pixel rows constituted by pixels arrayed in the row direction, and the vertical signal lines 917 are wired in the column direction for each of pixel columns constituted by pixels arrayed in the column direction.

The vertical drive unit 912 is constituted by a shift register, an address decoder, and the like, and drives all pixels of the pixel array unit 911 at the same time, in units of rows, or the like by supplying signals to each of the pixels via the plurality of pixel drive lines 916.

The column processing unit 913 reads a signal from each of the pixels for each pixel column of the pixel array unit 911 via the vertical signal lines 917, performs a noise removal process, a correlated double sampling process, an analog-to-digital (A-D) converting process, or the like, and thereby generates a pixel signal.

The horizontal drive unit 914 is constituted by a shift register, an address decoder, and the like, and sequentially selects unit circuits corresponding to the pixel columns of the column processing unit 913. Through selection scanning by this horizontal drive unit 914, pixel signals that are sequentially processed for each unit circuit in the column processing unit 913 are output to the signal processing unit 918.

The system control unit 915 is constituted by a timing generator that generates various timing signals and the like, and performs drive control of the vertical drive unit 912, the column processing unit 913, and the horizontal drive unit 914 based on timing signals generated by the timing generator.

The signal processing unit 918 performs signal processing such as an arithmetic process on the pixel signals supplied from the column processing unit 913 while temporarily storing data in the data storage unit 919 when necessary, and outputs image signals composed of pixel signals.

An embodiment of the present technology is not limited to the embodiments described above, and various changes and modifications may be made without departing from the scope of the present technology.

In addition, the effects described in the present specification are not limiting but are merely examples, and additional effects may be exhibited.

Additionally, the present technology may also be configured as below.

(1)

A semiconductor device including:

a first substrate which has a plurality of wiring layers; and a second substrate which has a plurality of wiring layers and is bonded to the first substrate, wherein metal wiring which is formed of a metal in each wiring layer is provided between a pad that is provided in one substrate of the first substrate and the second substrate and a wiring layer on the other substrate side that is closest to the other substrate, and in a wiring layer on the other substrate side adjacent to the pad or the metal wiring, other metal wiring is disposed in at least a corner part of the pad or the metal wiring in an upper layer.

(2)

The semiconductor device according to (1), wherein the pad is a pad for wire bonding or probing.

(3)

The semiconductor device according to (1) or (2), wherein the pad is provided in a substrate of the first substrate and the second substrate on a side on which wire bonding or probing is performed.

(4)

The semiconductor device according to any one of (1) to (3), wherein the first substrate and the second substrate are bonded together by bonding Cu wiring provided on a surface of the first substrate and Cu wiring provided on a surface of the second substrate.

(5)

The semiconductor device according to any one of (1) to (4), wherein a region that does not contain a member that forms the metal wiring is provided at a center portion of a bonding-surface-side surface of the metal wiring on a bonding surface of the first substrate and the second substrate.

(6)

The semiconductor device according to any one of (1) to (5), wherein the other metal wiring is disposed at least in the vicinity of the pad or the metal wiring.

(7)

The semiconductor device according to any one of (1) to (6), wherein an insulating film is provided between a substrate which constitutes the other substrate and on which a plurality of wiring layers are laminated and the metal wiring.

(8)

The semiconductor device according to any one of (1) to (6), wherein a region of a portion which comes into contact with the metal wiring of a substrate, which constitutes the other substrate and on which a plurality of wiring layers are laminated, is electrically separated from another region of the substrate by an insulator that is embedded in the substrate.

(9)

The semiconductor device according to any one of (1) to (6), wherein, in a wiring layer in which contacts that connect a substrate, which constitutes the one substrate and on which a plurality of wiring layers are laminated, to wiring provided in a wiring layer of the one substrate are formed, the pad is formed of the same metal as the contacts.

(10)

The semiconductor device according to any one of (1) to (6), wherein, after bonding of the first substrate and the second substrate, the pad is formed in a portion of a stopper layer provided in a wiring layer inside the one substrate removed by forming an opening.

(11)

The semiconductor device according to any one of (1) to (6), further including:

a via which is provided in a substrate, which constitutes the one substrate and on which a plurality of wiring layers are laminated, penetrates the substrate, and is connected to the metal wiring, wherein the pad is provided above the via of a surface of the one substrate.

(12) The semiconductor device according to any one of (1) to (6), wherein the pad is provided in a portion of an opening of the one substrate, and formed using a metal mask having a narrower opening than the opening.

(13) The semiconductor device according to (12), wherein an insulating film is formed on a side surface of the opening of the one substrate.

(14) The semiconductor device according to any one of (1) to (6), wherein wiring that is formed of a different metal from the pad is embedded in the pad, and the metal wiring is provided in a wiring layer on the other substrate side of the wiring.

(15) The semiconductor device according to (14) wherein the wiring is provided as the metal wiring in at least a corner part of the pad in a wiring layer on the other substrate side adjacent to the pad.

(16) The semiconductor device according to (15), wherein a region that does not contain the member that forms the wiring is provided in a center portion of a surface of the wiring.

(17) A semiconductor device including:
a first substrate which has a plurality of wiring layers; and
a second substrate which has a plurality of wiring layers and is bonded to the first substrate,
wherein a Cu pad for bonding provided on a bonding surface to the second substrate and Cu vias which penetrate a plurality of wiring layers and connect the Cu pad for bonding and C wiring are provided in the first substrate, and
wherein another Cu pad for bonding which is provided on a bonding surface to the first substrate and bonded to the Cu pad for bonding is provided in the second substrate.

(18) A solid-state imaging device including:
a first substrate which has a plurality of wiring layers; and
a second substrate which has a plurality of wiring layers and is bonded to the first substrate,
wherein metal wiring which is formed of a metal in each of wiring layers is provided between a pad that is provided in one substrate of the first substrate and the second substrate and a wiring layer on the other substrate side that is closest to the other substrate, and in a wiring layer on the other substrate side adjacent to the pad or the metal wiring, other metal wiring is disposed in at least a corner part of the pad or the metal wiring in an upper layer.

REFERENCE SIGNS LIST 11 semiconductor device
21 upper substrate
22 lower substrate
31 Si substrate
32 wiring layer
35 pad
41 Si substrate
42 wiring layer
43 insulating film
111 pad
184-1, 184-2, 184 via
187 pad
281 pad
282 Cu wiring
521 pad
522 pad
523 via

What is claimed is:

1. A semiconductor device comprising:
a first substrate, including:
a first wiring layer, wherein first wiring layer includes a first metal pad, a second metal pad, and a third metal pad, and wherein the first metal pad is disposed at a light incident surface side of the first substrate as compared to the second metal pad and the third metal pad; and
a first insulating film, wherein a portion of the first insulating film is disposed between the second metal pad and the third metal pad in a cross-section view; and
a second substrate, including:
a second wiring layer, wherein the second wiring layer includes a fourth metal pad and a fifth metal pad; and
a second insulating film,
wherein a portion of the second insulating film is disposed between the fourth metal pad and the fifth metal pad in the cross-section view,
wherein the second substrate is bonded to the first substrate,
wherein the second metal pad and the fourth metal pad are bonded to each other at a bonding surface of the first and second substrates,
wherein the third metal pad and the fifth metal pad are bonded to each other at the bonding surface of the first and second substrates,
wherein the portion of the first insulating film and the portion of the second insulating film are bonded to each other at the bonding surface of the first and second substrates,
wherein the first metal pad overlaps the portion of the first insulating film in the cross-section view,
wherein the first metal pad overlaps the portion of the second insulating film in the cross-section view,
wherein a first edge of the first metal pad overlaps a portion of the second metal pad in the cross-section view,
wherein a second edge of the first metal pad overlaps a portion of the third metal pad in the cross-section view,
wherein the first edge of the first metal pad overlaps a portion of the fourth metal pad in the cross-section view,
wherein the second edge of the first metal pad overlaps a portion of the fifth metal pad in the cross-section view, and
wherein first and second edges of the second metal pad overlap the fourth metal pad in the cross-section view.

2. The semiconductor device according to claim 1, wherein the first metal pad is a pad for wire bonding or probing.

3. The semiconductor device according to claim 1, wherein the first metal pad includes Cu or Al.

4. The semiconductor device according to claim 1, wherein the first, second, third, fourth, and fifth metal pads include Cu.

5. The semiconductor device according to claim 1, wherein a region that does not contain a metal pad is provided at a center portion of a bonding-surface-side surface of the first metal wiring layer on the bonding surface of the first substrate and the second substrate.

6. The semiconductor device according to claim 1, wherein the first substrate includes a first Si substrate and the second substrate includes a second Si substrate.

7. The semiconductor device according to claim 1, wherein the second and third metal pads overlap at least a corner of the first metal pad.

8. The semiconductor device according to claim 1, wherein the second and third metal pads overlap at least a side of the first metal pad.

9. The semiconductor device according to claim 1, wherein the second and third metal pads are electrically connected to the first metal pad via a portion of the first wiring layer provided in addition to the first, second, and third metal pads.

10. The semiconductor device according to claim 1, wherein the first metal pad is disposed in a peripheral region of a pixel array unit.

11. The semiconductor device according to claim 10, wherein the pixel array unit includes a photodiode and a transfer transistor in the first substrate.

12. The semiconductor device according to claim 10, wherein the pixel array unit includes an on-chip lens and a color filter above the first substrate.

13. The semiconductor device according to claim 10, wherein the first wiring layer includes a sixth metal pad, wherein the second wiring layer includes a seventh metal pad, wherein the sixth metal pad of the first wiring layer and the seventh metal pad of the second wiring layer overlap the pixel array unit in the cross-section view, and the sixth metal pad and the seventh metal pad are bonded to each other at the bonding surface of the first substrate and the second substrate.

14. A solid-state imaging device comprising:
a first substrate, including:
  a first wiring layer, wherein first wiring layer includes a first metal pad, a second metal pad, and a third metal pad, and wherein the first metal pad is disposed at a light incident surface side of the first substrate as compared to the second metal pad and the third metal pad; and
  a first insulating film, wherein a portion of the first insulating film is disposed between the second metal pad and the third metal pad in a cross-section view; and
a second substrate, including:
  a second wiring layer, wherein the second wiring layer includes a fourth metal pad and a fifth metal pad; and
  a second insulating film,
    wherein a portion of the second insulating film is disposed between the fourth metal pad and the fifth metal pad in the cross-section view,
    wherein the second substrate is bonded to the first substrate,
    wherein the second metal pad and the fourth metal pad are bonded to each other at a bonding surface of the first and second substrates,
    wherein the third metal pad and the fifth metal pad are bonded to each other at the bonding surface of the first and second substrates,
    wherein the portion of the first insulating film and the portion of the second insulating film are bonded to each other at the bonding surface of the first and second substrates,
    wherein the first metal pad overlaps the portion of the first insulating film in the cross-section view,
    wherein the first metal pad overlaps the portion of the second insulating film in the cross-section view,
    wherein a first edge of the first metal pad overlaps a portion of the second metal pad in the cross-section view,
    wherein a second edge of the first metal pad overlaps a portion of the third metal pad in the cross-section view,
    wherein the first edge of the first metal pad overlaps a portion of the fourth metal pad in the cross-section view,
    wherein the second edge of the first metal pad overlaps a portion of the fifth metal pad in the cross section view, and
    wherein first and second edges of the second metal pad overlap the fourth metal pad in the cross-section view.

* * * * *